United States Patent
Arakawa et al.

(10) Patent No.: US 7,335,593 B2
(45) Date of Patent: *Feb. 26, 2008

(54) METHOD OF FABRICATING SEMICONDUCTOR DEVICE

(75) Inventors: Etsuko Arakawa, Kanagawa (JP); Kiyoshi Kato, Kanagawa (JP); Yoshiyuki Kurokawa, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/088,644

(22) Filed: Mar. 24, 2005

(65) Prior Publication Data

US 2005/0164434 A1   Jul. 28, 2005

Related U.S. Application Data

(63) Continuation of application No. 10/302,693, filed on Nov. 22, 2002, now Pat. No. 6,872,658.

(30) Foreign Application Priority Data

Nov. 30, 2001   (JP)   ............................. 2001-365699

(51) Int. Cl.
*H01L 21/44* (2006.01)
(52) U.S. Cl. ...................... 438/673; 438/584; 438/594; 438/669; 438/689; 438/694; 438/700; 438/701; 257/618; 257/623; 257/E21.027
(58) Field of Classification Search ................ 438/584, 438/594, 669, 673, 689, 694, 700, 701; 257/618, 257/623
See application file for complete search history.

(56) References Cited

U.S. PATENT DOCUMENTS 5,608,251 A   3/1997   Konuma et al. ............ 257/337
5,620,905 A   4/1997   Konuma et al. ............ 438/163

(Continued)

FOREIGN PATENT DOCUMENTS

| CN | 1107257 A | 8/1995 |
|---|---|---|
| EP | 0 650 197 A2 | 4/1995 |
| EP | 1 003 223 A2 | 5/2000 |
| EP | 1 538 676 A1 | 6/2005 |
| JP | 1-204415 | 8/1989 |
| JP | 07-183540 | 7/1995 |
| JP | 7-235680 | 9/1995 |
| JP | 10-170953 | 6/1998 |
| JP | 2000-208397 | 7/2000 |
| JP | 2001-051425 | 2/2001 |
| JP | 2001-094113 | 4/2001 |
| JP | 2001-142224 | 5/2001 |
| JP | 2001-332496 | 11/2001 |

OTHER PUBLICATIONS

Hecht, Eugene Optics 4th Edition, Addison Wesley Longman, Inc. 2002 pp. 471-474.*

*Primary Examiner*—Michelle Estrada
*Assistant Examiner*—Jarrett J Stark
(74) *Attorney, Agent, or Firm*—Cook, Alex, McFarron, Manzo, Cummings & Mehler, Ltd.

(57) ABSTRACT

A gate metal is formed in a film, the foregoing gate metal is partially etched per each TFT having a different property, and a gate electrode is fabricated. Specifically, a resist mask is fabricated by exposing a resist to light per each TFT having a different property which is required. A gate metal is etched per each TFT having a different property which is required using the foregoing resist mask. At this time, a gate metal covering a semiconductor active layer of a TFT except for the TFT during the time when the patterning of a gate electrode is performed is left as it is covered. The step of fabricating a gate electrode of each TFT may be performed under the conditions optimized in conformity with the required property.

17 Claims, 27 Drawing Sheets

U.S. PATENT DOCUMENTS

| | | | |
|---|---|---|---|
| 5,643,826 A | 7/1997 | Ohtani et al. | 437/88 |
| 5,923,962 A | 7/1999 | Ohtani et al. | 438/150 |
| 6,274,443 B1 | 8/2001 | Yu et al. | 438/299 |
| 6,433,841 B1 | 8/2002 | Murade et al. | 349/43 |
| 6,613,620 B2 | 9/2003 | Fujimoto et al. | 438/166 |
| 6,746,965 B2 * | 6/2004 | Uehara et al. | 438/713 |
| 6,909,114 B1 | 6/2005 | Yamazaki | |
| 2005/0104068 A1 | 5/2005 | Yamazaki | |
| 2005/0110016 A1 | 5/2005 | Yamazaki | |
| 2006/0051906 A1 | 3/2006 | Yamazaki | |

* cited by examiner

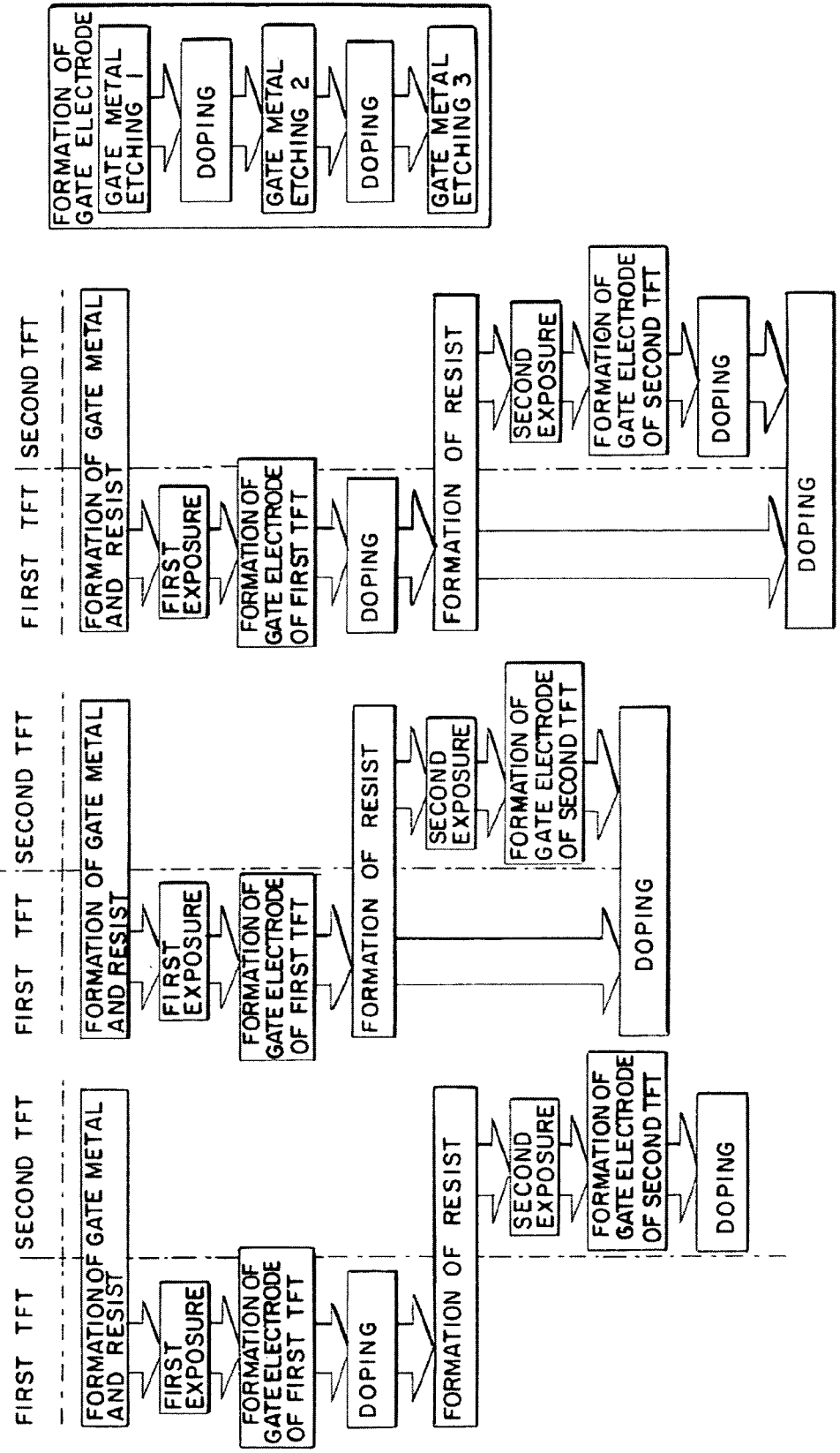

FIG. 2A FORMATION OF SEMICONDUCTOR ACTIVE LAYER/ FORMATION OF INSULATING FILM AND GATE METAL/ FORMATION OF RESIST / FIRST EXPOSURE

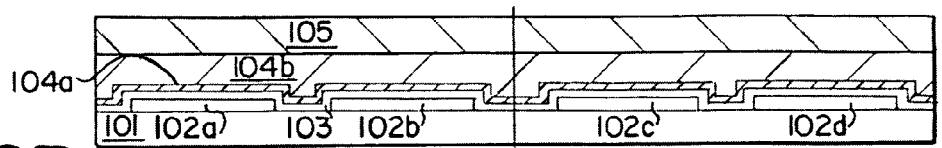

FIG. 2B GATE METAL ETCHING 1 / DOPING 1

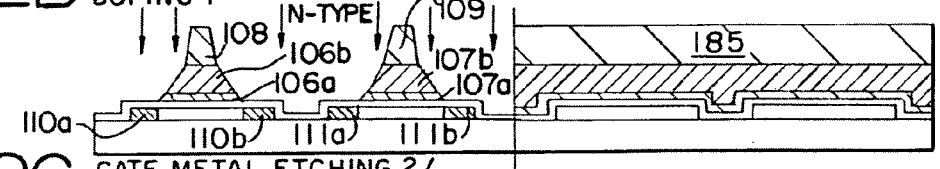

FIG. 2C GATE METAL ETCHING 2/ DOPING 2

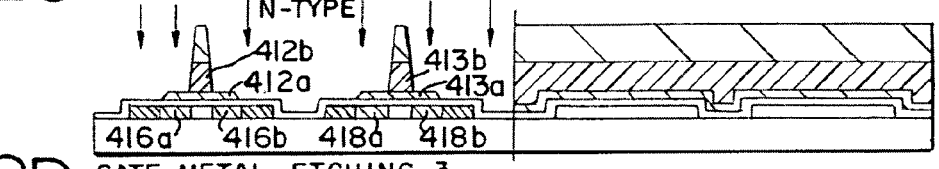

FIG. 2D GATE METAL ETCHING 3

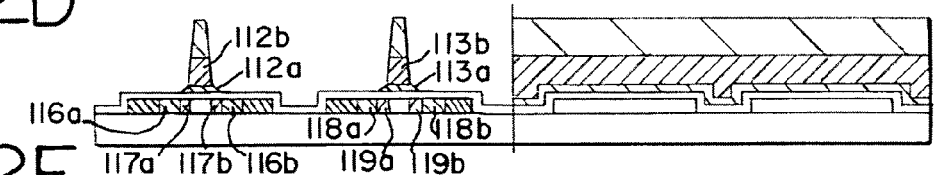

FIG. 2E RESIST FORMATION/SECOND EXPOSURE

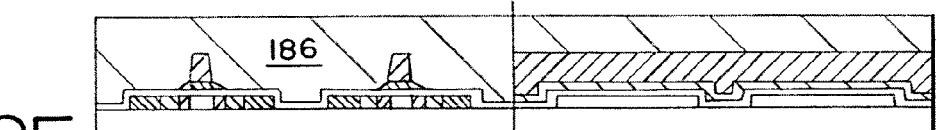

FIG. 2F GATE METAL ETCHING 4/DOPING 3

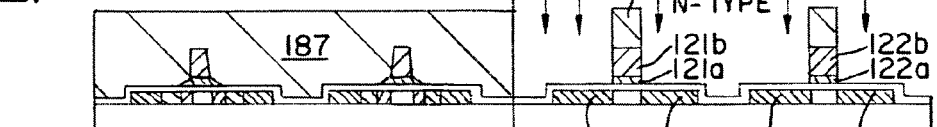

FIG. 2G RESIST FORMATION/ DOPING 4

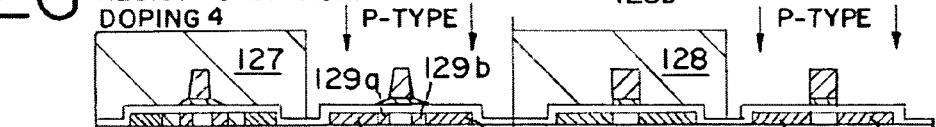

FIG. 2H

N-CHANNEL TFT 71  P-CHANNEL TFT 72  N-CHANNEL TFT 73  P-CHANNEL TFT 74

FIG.3A FORMATION OF SEMICONDUCTOR ACTIVE LAYER/ GATE METAL FORMATION/RESIST FORMATION/ FIRST EXPOSURE

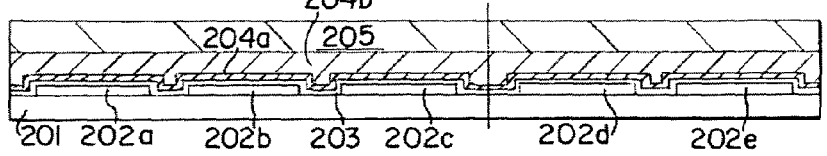

FIG.3B GATE METAL ETCHING 1

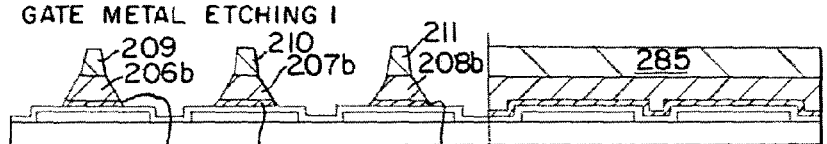

FIG.3C GATE METAL ETCHING 2/DOPING 1

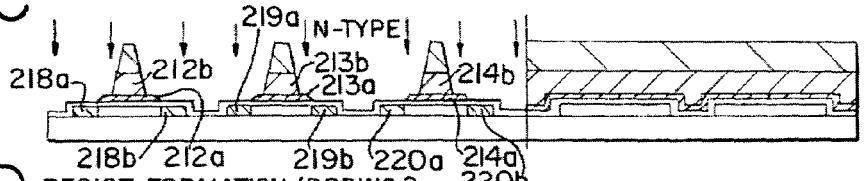

FIG.3D RESIST FORMATION/DOPING 2 N-TYPE

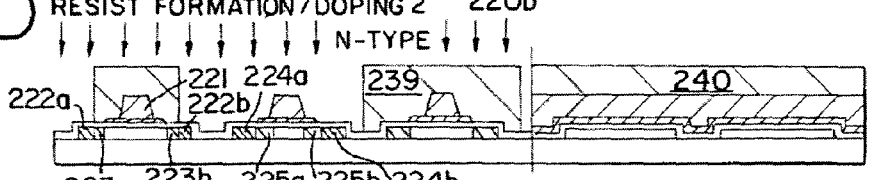

FIG.3E RESIST FORMATION/SECOND EXPOSURE

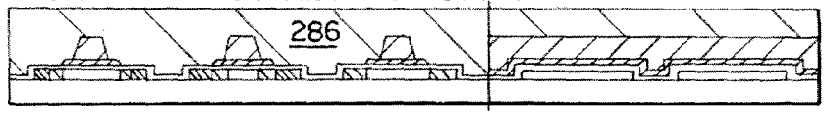

FIG.3F GATE METAL ETCHING 3/DOPING 3

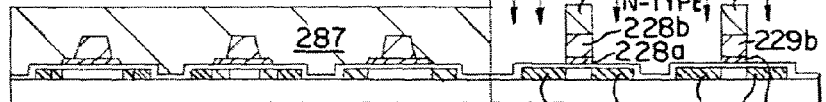

FIG.3G RESIST FORMATION/DOPING 4 P-TYPE

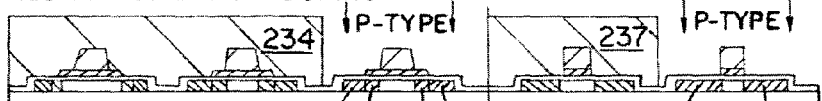

FIG.3H

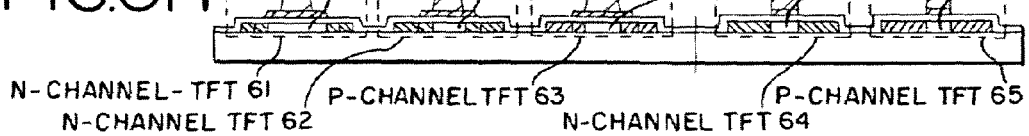

N-CHANNEL-TFT 61 / P-CHANNEL TFT 63 / P-CHANNEL TFT 65
N-CHANNEL TFT 62   N-CHANNEL TFT 64

FIG.4A FORMATION OF SEMICONDUCTOR ACTIVE LAYER/ FORMATION OF INSULATING FILM AND GATE METAL/ RESIST FORMATION/FIRST EXPOSURE
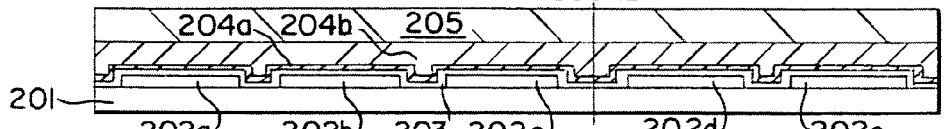
FIG.4B GATE METAL ETCHING 1
FIG.4C GATE METAL ETCHING 2
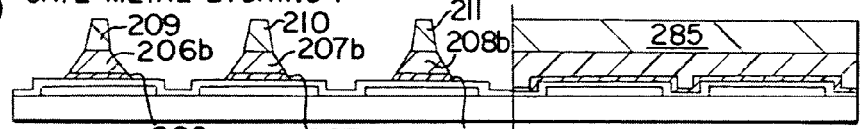
FIG.4D RESIST FORMATION/SECOND EXPOSURE/ GATE METAL ETCHING 3
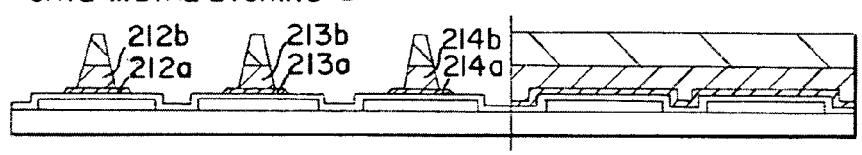
FIG.4E DOPING 1
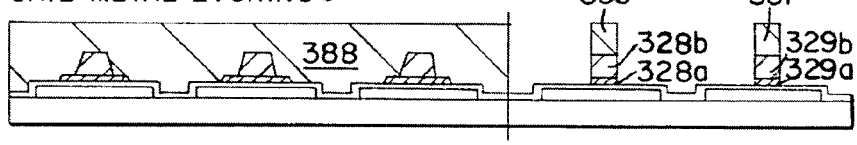
FIG.4F RESIST FORMATION/DOPING 2
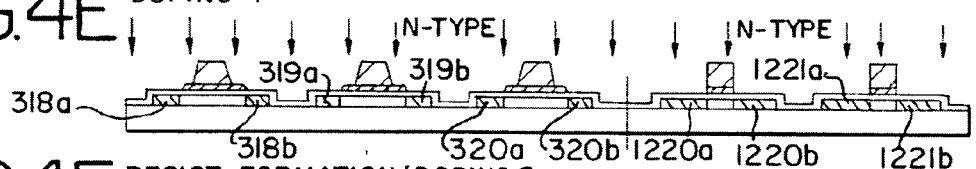
FIG.4G RESIST FORMATION/DOPING 3
FIG.4H
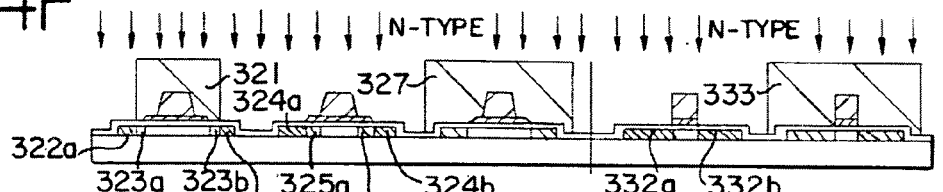
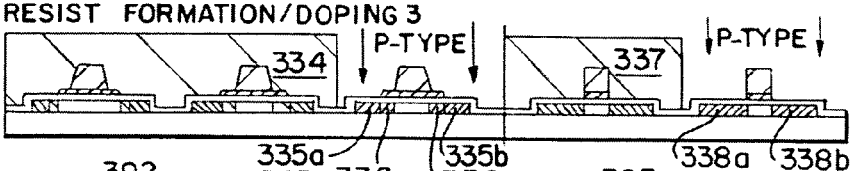

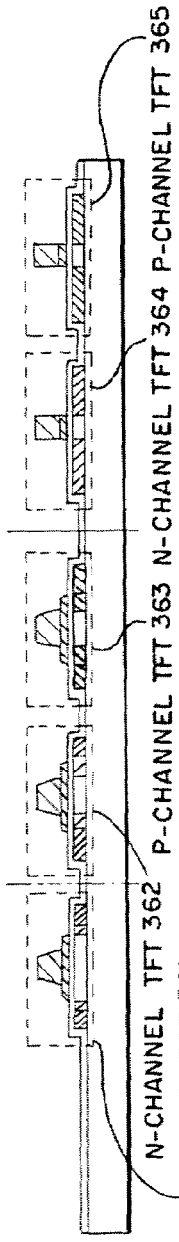
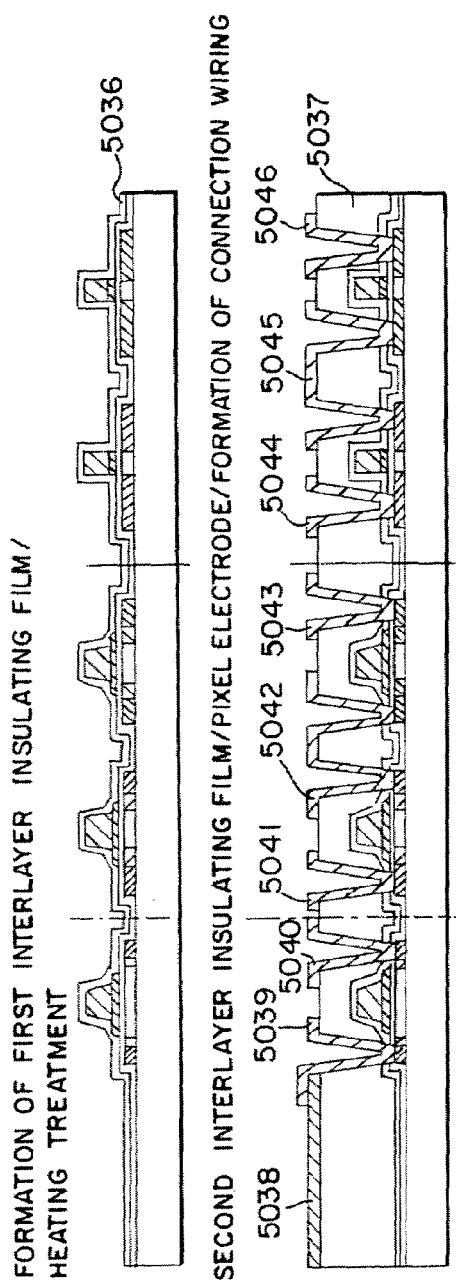
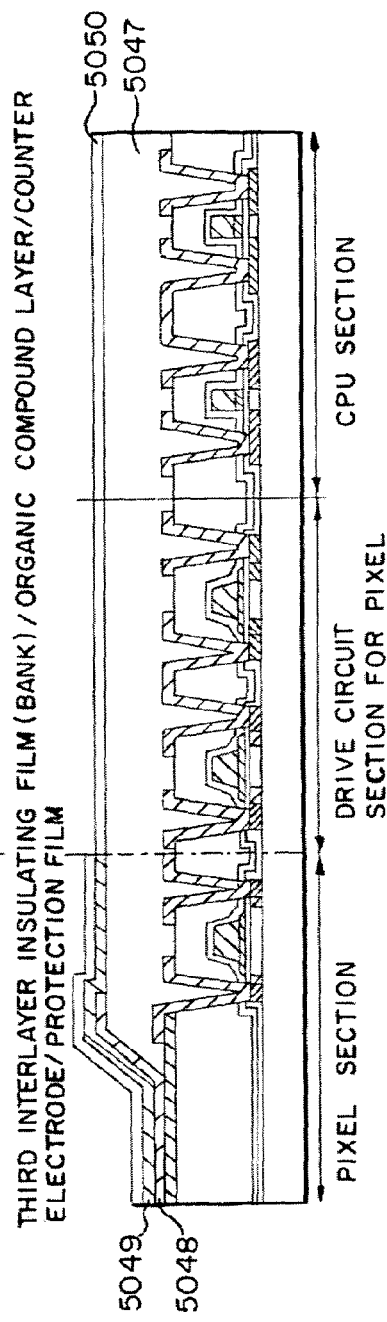

FIG. 7A  N-CHANNEL TFT 362  P-CHANNEL TFT 364  N-CHANNEL TFT 365
N-CHANNEL TFT 361  N-CHANNEL TFT 363  P-CHANNEL TFT

FIG. 7B  FORMATION OF FIRST INTERLAYER INSULATING FILM / HEATING TREATMENT

FIG. 7C  SECOND INTERLAYER INSULATING FILM / PIXEL ELECTRODE / FORMATION OF CONNECTION WIRING

FIG. 7D  THIRD INTERLAYER INSULATING FILM (BANK) / ORGANIC COMPOUND LAYER / COUNTER ELECTRODE / PROTECTION FILM

PIXEL SECTION | DRIVE CIRCUIT SECTION FOR PIXEL | CPU SECTION

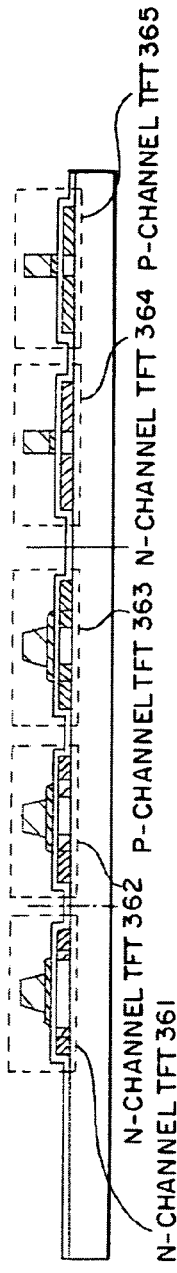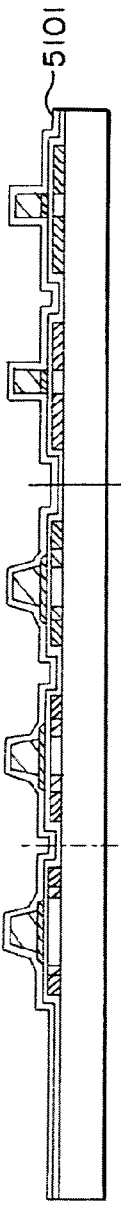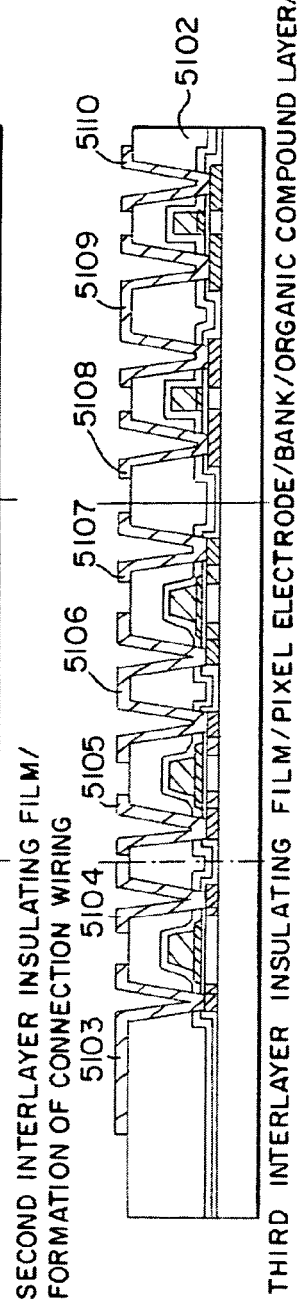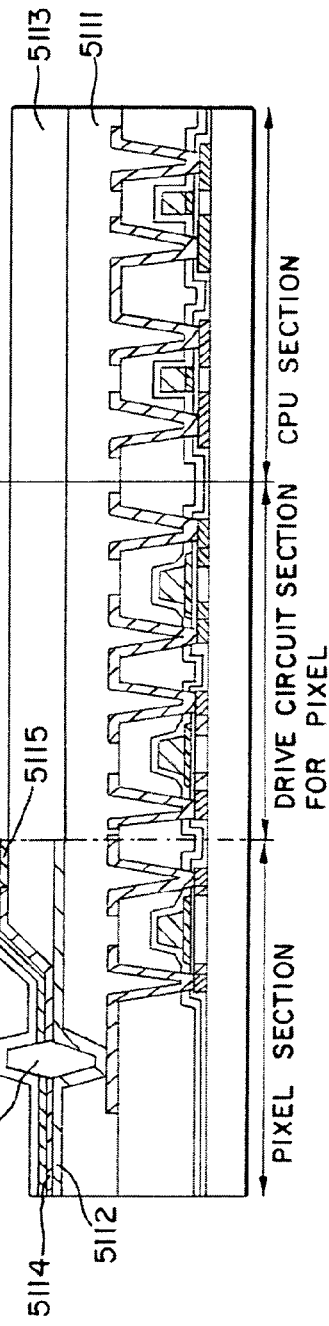

FORMATION OF SEMICONDUCTOR ACTIVE LAYER/
FORMATION OF INSULATING FILM AND GATE METAL/
FORMATION OF RESIST/EXPOSURE

GATE METAL ETCHING 1 / DOPING 1

RESIST FORMATION / DOPING 2

GATE METAL 400  RESIST MASK 401

WIRING 402

L1

RESIST MASK 403

WIRING 404

L2

CONNECTING SECTION 405

RELATIVE SCANNING DIRECTION OF LASER BEAM

FIG. 16
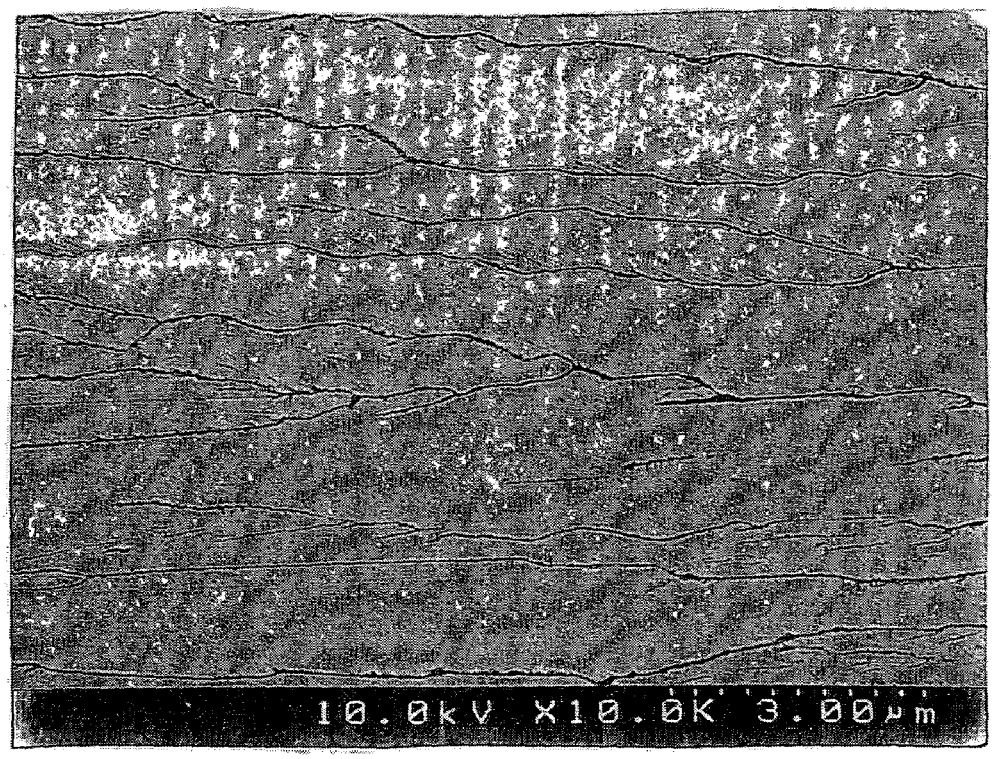
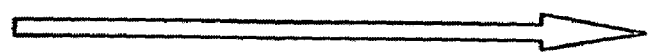
RELATIVE SCANNING DIRECTION OF LASER BEAM

FIG.18A FORMATION OF BASE INSULATING FILM/ FORMATION OF SEMICONDUCTOR FILM
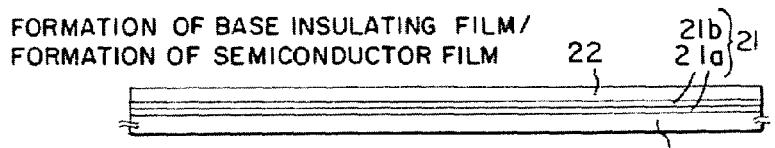

FIG.18B CRYSTALLIZATION OF SEMICONDUCTOR FILM
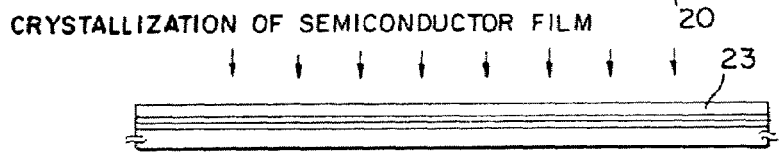

FIG.18C FIRST DOPING PROCESSING
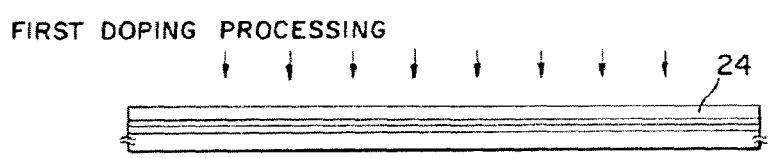

FIG.18D FIRST ETCHING PROCESSING/FORMATION OF INSULATING FILM/FORMATION OF CONDUCTIVE FILM
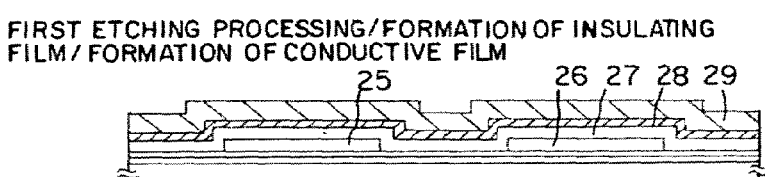

FIG.18E SECOND ETCHING PROCESSING/SECOND DOPING PROCESSING
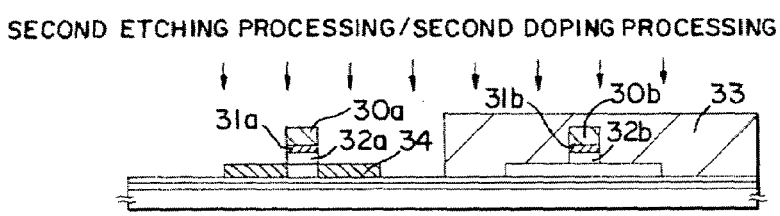

FIG.18F THIRD DOPING PROCESSING
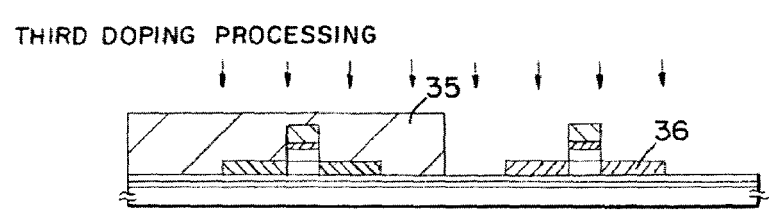

FIG.18G FORMATION OF FIRST INTERLAYER INSULATING FILM/ HEATING TREATMENT
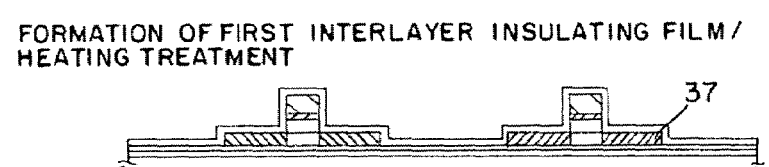

FIG.18H FORMATION OF SECOND INTERLAYER INSULATING FILM/ HYDROGENATION PROCESSING/FORMATION OF WIRING
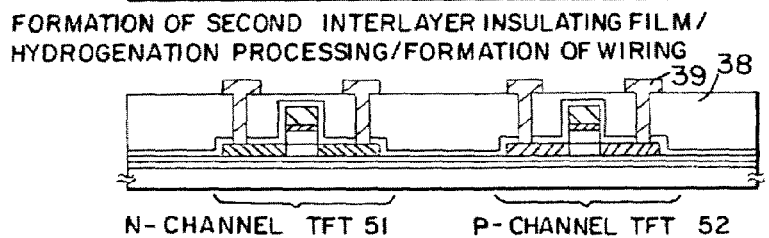

FORMATION OF METAL CONTAINING LAYER

HEATING TREATMENT

LASER ANNEALING

FIG. 25D RESIST FORMATION/SECOND EXPOSURE/GATE METAL ETCHING 3
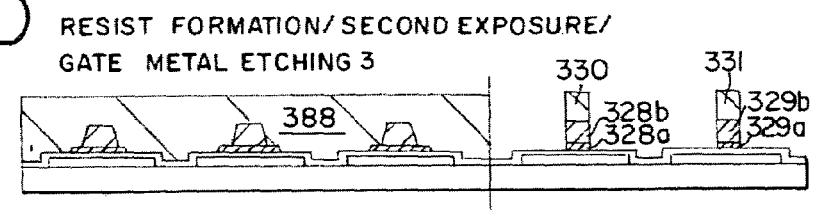
FIG. 25E DOPING 1
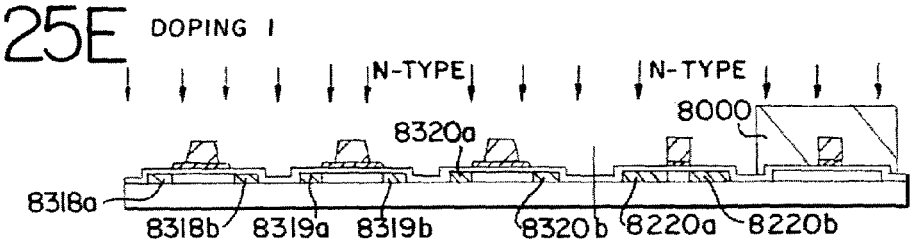
FIG. 25F RESIST FORMATION/DOPING 2
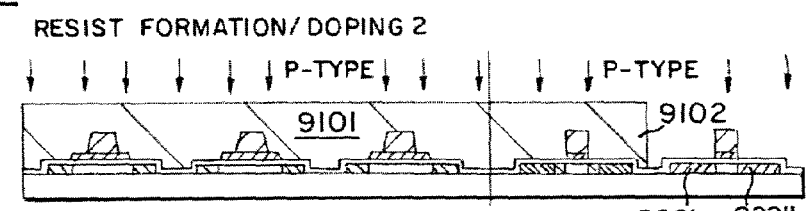
FIG. 25G RESIST FORMATION/DOPING 3
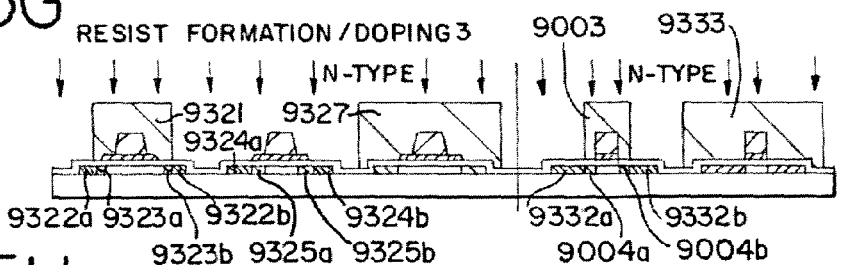
FIG. 25H RESIST FORMATION/DOPING 4
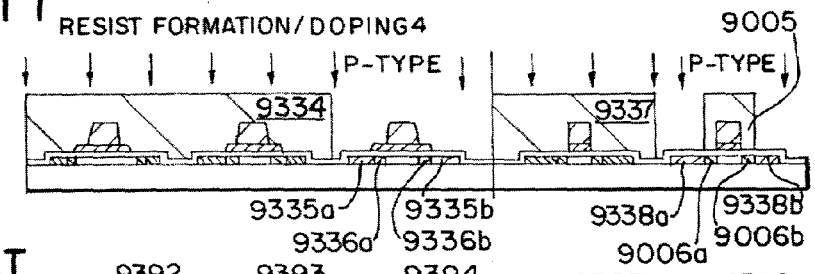
FIG. 25I
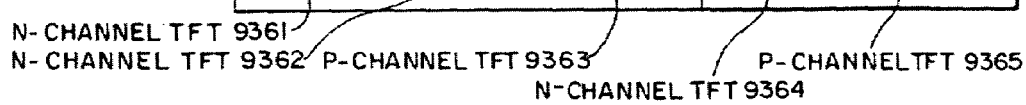

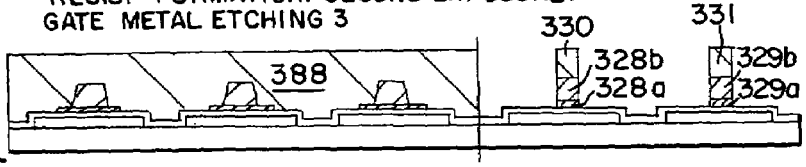
FIG.26D RESIST FORMATION/SECOND EXPOSURE/ GATE METAL ETCHING 3
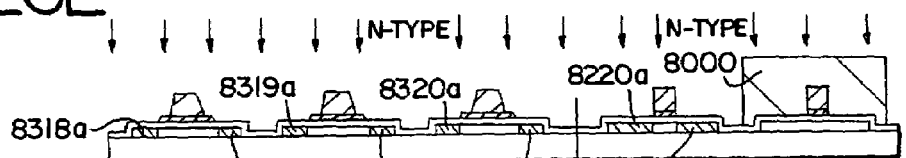
FIG.26E DOPING 1
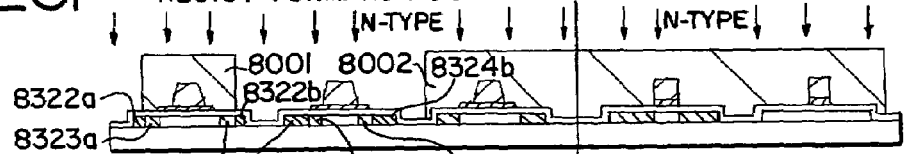
FIG.26F RESIST FORMATION/DOPING 2
FIG.26G RESIST FORMATION/DOPING 3
FIG.26H FORMATION OF INSULATING FILM
FIG.26I SIDE WALL FORMATION
FIG.26J RESIST FORMATION/DOPING 4
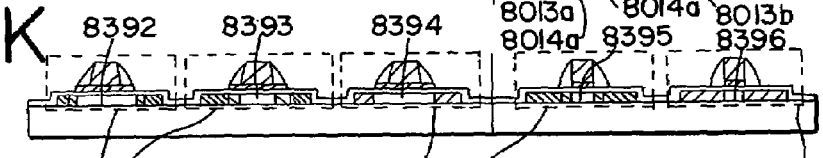
FIG.26K
N-CHANNEL TFT 8361
N-CHANNEL TFT 8362
P-CHANNEL TFT 8363
N-CHANNEL TFT 8364
P-CHANNEL TFT 8365

METHOD OF FABRICATING SEMICONDUCTOR DEVICE

This application is a continuation of U.S. application Ser. No. 10/302,693 filed on Nov. 22, 2002, now U.S. Pat No. 6,872,658.

BACKGROUND OF THE INVENTION

1. Field of the Invention

The present invention relates to a method of fabricating a semiconductor device configured by a thin film transistor. Particularly, the present invention relates to a method of fabricating a semiconductor device having a plurality of circuits driven by providing different voltages of electric sources. Moreover, the present invention relates to an electronic device using the foregoing semiconductor device.

2. Related Art

In recent years, the development of a semiconductor device having a circuit formed with a thin film transistor (hereinafter, referred to as TFT), which is configured using a semiconductor thin film formed on the substrate having an insulation surface has been proceeded. As an representative example of a semiconductor device having a circuit formed with a TFT, an active matrix type liquid crystal display device, an active matrix type OLED (Organic Light Emitting Diode) and the like are known. Now, a method of fabricating a TFT will be exemplified below. It will be described below with reference to FIG. 9.

As shown in FIG. 9A, a polycrystal semiconductor film prepared by a method of crystallizing an amorphous semiconductor film or the like on a substrate 1101 having an insulation surface is subjected to the patterning, thereby a semiconductor active layers 1102c and 1102d being formed. On the semiconductor active layers 1102c and 1102d, an insulating film 1103, an electrically conductive film 1104 and a resist 1186 are formed. Since a gate electrode of a TFT is formed with the electrically conductive film 1104, it is defined that the electrically conductive film 1104 is also referred to as a gate metal. It should be noted that in FIG. 9, an example in which a gate metal is formed in a mono-layer structure is shown.

When the resist 1186 has been formed, a resist mask for performing the patterning of a gate metal is fabricated. The resist 1186 is exposed to light through the pattern, and the resist 1186 is photosensitized. Subsequently, by developing it, masks (resist masks) 1123,1124, as shown in FIG. 9B, consisted of a resist are formed. The electrically conductive film 1104 is etched using the resist masks 1223, 1224. Thus, a gate electrode 1121 and a gate electrode 1122 are fabricated. Subsequently, an impurity element which gives the N-type impurity is doped (doping 1). In this way, the N-type impurity regions 1125a, 1125b, 1126a and 1226b are formed within the semiconductor active layers 1102c, 1102d.

Subsequently, as shown in FIG. 9C, after the resist masks 1123, 1124 have been removed, a resist mask 1128 is newly formed. Subsequently, an impurity element which gives the P-type impurity is doped (doping 2). Thus, impurity regions 1129a, 1129b are formed within the semiconductor active layer 1102d. Here, in the impurity regions 1129a, 1129b, the N-type impurity has been added in the doping 1. However, the impurity regions 1129a, 1129b functions as a source region and a drain region of the P-channel type TFT without any problem by adding the P-type impurity element in a high concentration in the doping 2.

In this way, the N-channel type TFT and the P-channel type TFT can be formed.

In recent years, the properties such as electric field effect mobility of TFT in which a crystalline semiconductor film (typically, polycrystal film) (hereinafter, referred to as polycrystal TFT) is made an active layer, or the like have been enhanced. Therefore, it becomes also capable of forming a circuit equipped with a variety of functions using the relevant TFT. Hence, it has been expected that the circuit conventionally fabricated on a single crystal substrate is formed on a substrate having an insulation surface such as a glass substrate or the like using TFT, and the attempts have been performed. For example, it has been expected that an arithmetic processing circuit, a memory element and the like are formed using a THT on a substrate which is the same with the substrate on which a pixel of a display device of liquid crystal display device and the like have been formed.

Now, in the case where a variety of circuits are formed using a TFT on the same substrate having an insulation surface, the properties required to the TFT configuring the relevant circuits are different according to the functions of the respective circuits. Therefore, it is necessary to differently make TFTs having different properties. Hereinafter, the difference of the properties required to TFTs configuring the relevant circuits according to the functions of the circuits will be described by exemplifying the concrete examples.

For example, the case where an active matrix type liquid crystal display device and an arithmetic processing circuit are formed on the same substrate using a TFT is exemplified. An active matrix type liquid crystal display device has a pixel section configured with a plurality of pixels disposed in a matrix shape and a drive circuit section for inputting a picture signal to the foregoing pixel section (hereinafter, referred to as pixel drive circuit section).

In FIG. 12, one example of the configuration of a pixel section of an active matrix type liquid crystal display device is shown. In the pixel section, a plurality of signal lines S1-Sx and scanning lines G1-Gy are disposed. At each intersection of the signal lines S1-Sx and the scanning lines G1-Gy, a pixel is disposed. Each pixel has a switching element. The foregoing switching element selects an input to each pixel of the picture signal inputted into the signal lines S1-Sx according to the signal inputted into the scanning lines G1-Gy. In FIG. 12, a TFT 3002 (hereinafter, referred to as pixel TFT) is shown as the foregoing switching element. Moreover, each pixel has a holding capacity 3001 for holding a signal inputted into a pixel from the signal lines S1-Sx and a liquid crystal element 3003 whose transmittance is changed according to the picture signal via the pixel TFT 3002.

At each pixel, a gate electrode of the pixel TFT 3002 is connected to one of the scanning lines G1-Gy. One of the source region or the drain region of the pixel TFT 3002 is connected to one of the signal lines S1-Sx, the other is connected to one of the electrodes of the holding capacity 3001 and one of the electrodes of the liquid crystal element 3003.

The pixel TFT 3002 configuring a pixel is required for the off-state current being slight. It is for the purpose of preventing the voltage applied between the electrodes of the liquid crystal element 3003 disposed at each pixel from being changed, the transmittance from being changed, and the image from being disturbed. Moreover, in an image visible recognition via the pixel TFT 3002 type (hereinafter, referred to as transmitting type) liquid crystal display device, in order to enhance the aperture opening ratio, it is required to make the pixel TFT 3002 refined. Furthermore, between the electrodes of the liquid crystal element 3003, usually, the voltage of about 16V is applied. Therefore, the pixel TFT 3002 or the like is required to withstand the voltage of about 16V. Hence, it is desirable it is configured so that a TFT has a low concentration impurity region overlapped with the gate electrode (hereinafter, referred to as Lov region) and a low concentration impurity region not overlapped with the gate electrode (hereinafter, referred to as Loff region) in its structure.

On the other hand, a TFT configuring a pixel drive circuit section (hereinafter, referred to as TFT for pixel drive circuit) is not required to reduce the off-state current and make it refined as the pixel TFT is required. However, since it operates by an electric source voltage of about 16V, it is required to withstand the voltage.

In an arithmetic processing circuit, a high drive frequency is required. Therefore, a TFT configuring the arithmetic processing circuit is required to enhance the mobility of carrier and be refined. On the other hand, an arithmetic processing circuit fabricated by a refined TFT is capable of being operated by about 3-5 V of an electric source voltage, and the withstanding voltage of the TFT is not so much required as those of a pixel TFT and a TFT for pixel drive circuit are required.

It is necessary to differently make TFTs according to the above-described required properties.

Hence, an object of the present invention is to provide a method of fabricating a semiconductor device, which is capable of differently making a plurality of kinds of TFTs that have different properties respectively or are different in design rule on the same substrate.

SUMMARY OF THE INVENTION

In order to solve the above-described problems, in the present invention, the following means are taken as countermeasures against these problems:

It is defined that it is a fabrication method in which a gate metal is formed in a film, the foregoing gate metal is partially etched per each TFT having a different, required property, and then a gate electrode is fabricated. Specifically, a resist mask is prepared by exposing the resist to light per each TFT having a different, required property. The etching of gate metal is performed per each TFT having a different, required property using the foregoing resist mask. Here, the gate metal covering the semiconductor active layer of TFT except for TFT during patterning of the gate electrode has been previously covered with the resist mask. The gate electrode fabrication step of each TFT may be performed under the optimized conditions according to the required property.

Here, a gate metal formed in a film may be of mono-layer structure, of laminated structure made of two layers, or may be of multiple-layer structure made of more than two layers.

It should be noted that the steps until achieving the step of gate metal film formation are capable of being set as the same with those of TFT formed on the same substrate. Moreover, in all of the TFT formed on the same substrate, the steps after the gate electrode has been fabricated are capable of being made common. Noted that it is not always necessary to make all of the steps common except for the step of the gate electrode formation in all of the TFT formed on the same substrate.

A method of etching a gate metal and the shape of the fabricated gate electrode can be changed per each TFT having the required, different property. For example, a TFT equipped with a gate electrode in a shape having a tapered edge portion and a TFT equipped with a gate electrode in a shape having an approximately vertical edge portion can be differently made. In a TFT equipped with a gate electrode in a shape having a tapered edge portion, an impurity element is doped via the tapered portion, and a low concentration impurity region is capable of being formed in a self-aligned manner. Hence, a TFT having a configuration excellent in withstanding voltage is obtained. Here, in the case of a TFT having a gate electrode in a shape having a tapered edge portion, it is difficult to make the gate length and the gate width smaller. That means, it is not suitable for refining. On the other hand, in the case of a TFT equipped with a gate electrode in a shape having an approximately vertical edge portion, its shape is suitable for refining. Thus, the shape of gate electrode of TFT can be changed according to the required property.

The wiring can be formed by performing the etching of a gate metal at the same time when a gate electrode in a shape having a tapered edge portion is formed. The shape of this wiring has a tapered edge portion. In a wiring having a tapered edge portion, a cutting caused by the difference between steps of the film formed on the upper portion of the relevant wiring is prevented and the failures can be reduced.

The wiring can be formed by etching the gate metal at the same time when a gate electrode in a shape having an approximately vertical edge portion is formed. This wiring has an edge portion in an approximately vertical shape. In the case of a wiring having an approximately vertical edge portion, it is capable of making the ratio of L/S of the wiring width (L) and the wiring interval (S) smaller comparing to a wiring having a tapered edge portion with the same cross sectional area. Hence, it can be said that the wiring having a vertical edge portion is in a shape suitable for integration. Thus, the shape of a wiring can be changed according to the portion of a semiconductor device.

Moreover, the exposure means for a resist used at the time when the patterning of a gate electrode is performed is changed per each TFT having the different, required property. Thus, the resolution of the patterning of the gate electrode can be changed. Noted that it is defined exposure means is referred to the exposure conditions and the aligner. Moreover, an aligner is a device that has a radiation energy source for exposing a resist (photoelectric source, electron beam source or X-ray source), and in which the resist is exposed to light through the pattern on the subject copy (reticle or mask). As an aligner which is utilizable, demagnification projection aligner (commonly referred to as stepper) and a mirror projection type aligner which is an equal magnification projection aligner (hereinafter, referred to as MPA) are listed, but not limited to these. A known aligner can be freely used. It is defined that the exposure conditions include wavelength of radiation energy source used for exposure, magnification at the time when the resist is exposed to light through the subject copy (reticle or mask), a material of a resist, the exposure time and the like. Moreover, in order to form a source region, a drain region, a Lov region, a Loff region and the like of each TFT, an impurity element is doped if it is necessary.

An example of a method of fabricating a semiconductor device of the present invention will be described below with reference to FIG. 1. A typical example of a method of fabricating a semiconductor device of the present invention is shown in FIG. 1A. In FIG. 1A, the steps of fabricating a first TFT and a second TFT whose properties are required to be different respectively on the same substrate will be described below.

On each semiconductor active layer of the first TFT and the second TFT, commonly, a gate insulating film, a gate metal, a resist are in turn formed in a film (gate metal and resist film formation). Subsequently, a resist mask is formed for fabricating the gate electrode of the first TFT by being subjected to the first exposure. Subsequently, the gate metal is etched using the relevant resist mask, and the gate electrode of the first TFT is fabricated (fabrication of gate electrode of the first TFT). Subsequently, an impurity element is doped. As for the first TFT, during the time when the steps of the first exposure, the fabrication of the gate electrode and the doping are carried out, a gate metal on the semiconductor active layer corresponding to the second TFT is covered with a resist mask not so as to be etched.

Subsequently, after the foregoing resist mask has been peeled off, a resist is newly formed in a film (film formation of resist) so as to cover the region in which the first TFT and the second TFT are formed. Subsequently, a resist mask for fabricating a gate electrode of the second TFT is formed by being subjected to the second exposure. Subsequently, a gate electrode of the second TFT is fabricated by etching the gate metal using the relevant resist mask (fabrication of gate electrode of the second TFT). Subsequently, an impurity element is doped. As for the second TFT, during the time when the steps of the second exposure, the fabrication of the gate electrode, doping and the like are performed, a gate metal on a semiconductor active layer corresponding to the first TFT is covered with a resist mask not so as to be etched.

In this way, the first TFT and the second TFT are differently made.

It should be noted that in the fabrication step of a gate electrode of each TFT (first TFT, second TFT), the gate metal is etched in a stepwise manner, and during the time, the doping step of an impurity element may be carried out.

Hereinafter, an example in which in the fabrication step of a gate electrode of the first TFT and the second TFT, the gate metal is etched in a stepwise manner, and during the time, the step of doping of an impurity element is carried out is shown in FIG. 1D. Noted that in FIG. 1D, only the fabrication step of either of gate electrode of the first TFT or gate electrode of the second TFT is taken notice of, and will be explained below. As shown in FIG. 1D, after the first etching of a gate metal (gate metal etching 1) has been carried out, an impurity element is doped. Subsequently, after the second etching of the gate metal (gate metal etching 2) has been carried out, an impurity element is doped. Furthermore, the gate electrode is prepared by performing the third etching of the gate metal (gate metal etching 3).

Here, in the above-described dopings performed twice, the shape of the gate metal which is to be a mask in the doping of an impurity element is changed. Thus, in the semiconductor active layer, a region into which an impurity element is added by both dopings performed twice, and a region into which an impurity element is added only by the step of doping following the gate metal etching 2 can be formed. Thus, in the semiconductor active layer, a region into which an impurity element is added in a high concentration and a region into which an impurity element is added in a low concentration are fabricated.

The step as shown in FIG. 1D may be carried out in the fabrication step of the gate electrode in FIG. 1A (gate electrode fabrication step of the first TFT and gate electrode fabrication step of the second TFT).

As for a TFT in which the gate fabrication step is carried out as shown in FIG. 1D, the subsequent impurity element doping step is not necessarily required.

FIG. 1B shows an example of a method of fabricating a semiconductor device of the present invention which is different from that of FIG. 1A. In the step shown in FIG. 1A, after a gate electrode of each TFT (first TFT, second TFT) has been fabricated, an impurity element is doped, respectively. However, in a fabrication method shown in FIG. 1B, after the gate electrode of the first TFT has been fabricated, an impurity element is not doped, but the gate electrode of the second TFT is fabricated. Then, finally, the first TFT and the second TFT are fabricated by commonly performing the step of doping of an impurity element to the first TFT and the second TFT. In the step shown in FIG. 1B, the number of times of the dopings is fewer comparing to that of FIG. 1A, the number of the steps of fabrication is capable of being reduced.

In FIG. 1C, an example of a method of fabricating a semiconductor device of the present invention which is different from the methods shown in FIG. 1A and FIG. 1B is shown. The fabrication method shown in FIG. 1C is a combination of the method of fabrication shown in FIG. 1A and the method of fabrication shown in FIG. 1B. Specifically, this is a method of fabrication in which one portion of the doping step in the first TFT fabrication and that one portion of the doping step in the second TFT fabrication are carried out at the same time. Since the step of fabricating the first TFT and one portion of the doping step of fabricating the second TFT are carried out at the same time, the step of fabrication can be simplified comparing to the method of fabrication of FIG. 1A. On the other hand, in the step of fabricating the first TFT and the step of fabricating the second TFT, the doping step is carried out, respectively, therefore, the conditions at the time when an impurity element is doped can be also changed for the methods of fabrication method of FIG. 1B in the case of the first TFT and in the case of the second TFT.

It should be noted that in the step of fabricating a gate electrode of each TFT (first TFT, second TFT), respectively, a gate metal is etched in a stepwise manner, and during that time an impurity element may be performed the step of doping. For example, the step as shown in FIG. 1D may be carried out in the step of fabricating a gate electrode of FIG. 1C (step of fabricating a gate electrode of the first TFT and step of fabricating a gate electrode of the second TFT). As for a TFT in which the step of fabricating a gate as shown in FIG. 1D is carried out, the subsequent the step of doping of an impurity element is not necessarily required.

It should be noted that in the respective method of fabrication shown in FIG. 1A-FIG. 1C, exposure means used in the step of the first exposure and exposure means used in the step of the second exposure can be made the same or differentiated. An example in which exposure means used in the first exposure step and exposure means used in the second exposure step are differentiated is listed below.

For example, in the case where the second TFT is required to be refined rather than the first TFT, the wavelength of the light used for the step of the second exposure is made shorter comparing to the wavelength of the light used for the step of the first TFT. Moreover, for example, in the case where the second TFT is required to be refined rather than the first TFT, in the step of the first exposure, the exposure is carried out using a MPA, and in the step of the second exposure, the exposure is carried out using a stepper.

In the fabrication of a resist mask for forming a gate electrode of the first TFT and the second TFT, the procedure of changing the exposure means will be described below with reference to FIG. 11.

As shown in FIG. 11A, on the substrate, a region having a TFT (first TFT) in which the patterning is applied to agate electrode using the resist mask obtained by the step of the first exposure (first region), and a region having a TFT (second TFT) in which the patterning is applied to a gate electrode using the resist mask obtained by the second exposure (second region) can be differently made.

Here, as for the fabrication of gate electrodes of the first TFT and the second TFT, it is desirable that the fabrication of one gate electrode of the TFTs, which is required to be refined is carried out later. Thus, the wiring formed by etching the gate metal in the step of fabricating the gate electrode of the first TFT and the wiring formed by etching the gate metal in the step of fabricating the gate electrode of the second TFT is capable of being smoothly connected with each other.

Moreover, the step of the first exposure and the step of the second exposure may be carried out using a plurality of exposure means, respectively. For example, as shown in FIG. 11B, the patterning is capable of being applied to a region (first region) in which the patterning is applied to the gate electrode using the resist mask obtained by the step of the first exposure, using a resist mask formed by utilizing the first exposure means and the second exposure means that is different from the first exposure means. Specifically, after a resist capable of being commonly used for the first exposure means and the second exposure means has been formed in a film, the exposure is carried out in the first region using the first exposure means. Subsequently, the exposure is carried out using the second exposure means. And finally, the resist masks may be formed by performing the developer.

It should be noted that a resist mask is newly formed except for a resist mask necessary to the etching of the gate metal in the step of fabricating the first TFT and in the step of fabricating the second TFT shown in the FIG. 1, respectively, and an impurity element may be selectively added to the specific regions. Thus, an impurity region in which it is not formed in a self-aligned manner by the gate electrode is also capable of being formed.

Moreover, the sidewall may be formed with an insulating matter on the side surface of the gate electrode. Furthermore, an impurity element is added by making the relevant sidewall being as a mask, a LDD region may be formed. Particularly, in the case where the LDD region or the like is formed in the TFT required to be refined, it is preferable that the procedure using the above-described sidewall is employed rather than a method in which the LDD region is formed using a resist mask since the procedure using the sidewall is capable of more precisely performing the alignment of the mask.

Noted that gate electrodes corresponding to two TFTs whose polarities are different from each other may be fabricated at the same time in the step of fabricating gate electrodes of the first TFT shown in FIG. 1. Moreover, gate electrode corresponding to the two TFTs whose polarities are different from each other may be fabricated at the same time in the step of fabricating gate electrodes of the second TFT shown in FIG. 1. At this time, the necessity that the doping conditions for an impurity element are changed occurs according to the respective polarities of TFTs in the step of fabricating the first TFT and in the step of fabricating the second TFT. Therefore, a resist mask is newly formed except for the resist mask needed at the time when the etching of the gate metal is performed, and an impurity element may be selectively added in the specific regions.

Moreover, a semiconductor film with which semiconductor active layers of the first TFT and the second TFT are formed may be crystallized by a laser annealing using a continuous oscillation laser beam.

It should be noted that in FIG. 1, the step of differently making the gate electrodes of TFTs has been shown by the exposure steps performed twice (first exposure, second exposure), but not limited to this. The present invention has a plurality of exposure steps, which is capable of being applied to the step where gate electrodes of TFTs are differently made per each exposure step. Thus, a method of fabricating a semiconductor device in which a plurality of TFTs whose properties are different respectively, or whose design rules are different from each other are capable of being differently made on the same substrate can be provided. It is possible to fabricate a circuit having a variety of functions on the same substrate according to the present invention. Thus, a circuit such as IC (integrated circuit) chip or the like which has been externally added is also capable of being fabricated on the same substrate and the device can be miniaturized in size and reduced in weight. Moreover, since a plurality of TFTs having different properties are capable of being differently made using the fewer number of masks, the increase of the number of steps and the cost can be suppressed at the lower level.

BRIEF DESCRIPTION OF THE DRAWINGS

For a more complete understanding of the present invention and the advantages thereof, reference is now made to the following detailed description taken in conjunction with the accompanying drawings, in which:

FIGS. 1A to 1D are block diagrams showing a method of fabricating a semiconductor device of the present invention;

FIGS. 2A to 2H are diagrams showing a method of fabricating a semiconductor device of the present invention;

FIGS. 3A to 3H are diagram showing a method of fabricating a semiconductor device of the present invention;

FIGS. 4A to 4H are diagrams showing a method of fabricating a semiconductor device of the present invention;

FIGS. 7A to 7D are diagram showing a method of fabricating a semiconductor device having an OLED display device of the present invention;

FIGS. 8A to 8D are diagram showing a method of fabricating a semiconductor device having an OLED display device of the present invention;

FIG. 16 is an image observed by a scanning electron microscopy (SEM) showing a semiconductor thin film of TFT formed by a method of fabricating a semiconductor device of the present invention;

FIGS. 18A to 18H are diagrams showing a method of fabricating a semiconductor device of the present invention;

FIGS. 25D to 25I are diagrams showing a method of fabricating a semiconductor device of the present invention, and FIG. 25D is a step following a step of FIG. 4C;

FIGS. 26D to 26K are diagrams showing a method of fabricating a semiconductor device of the present invention, and FIG. 26D is a step following a step of FIG. 4C;

DESCRIPTION OF THE PREFERRED EMBODIMENTS OF THE INVENTION

Embodiment 1

Figure 5:
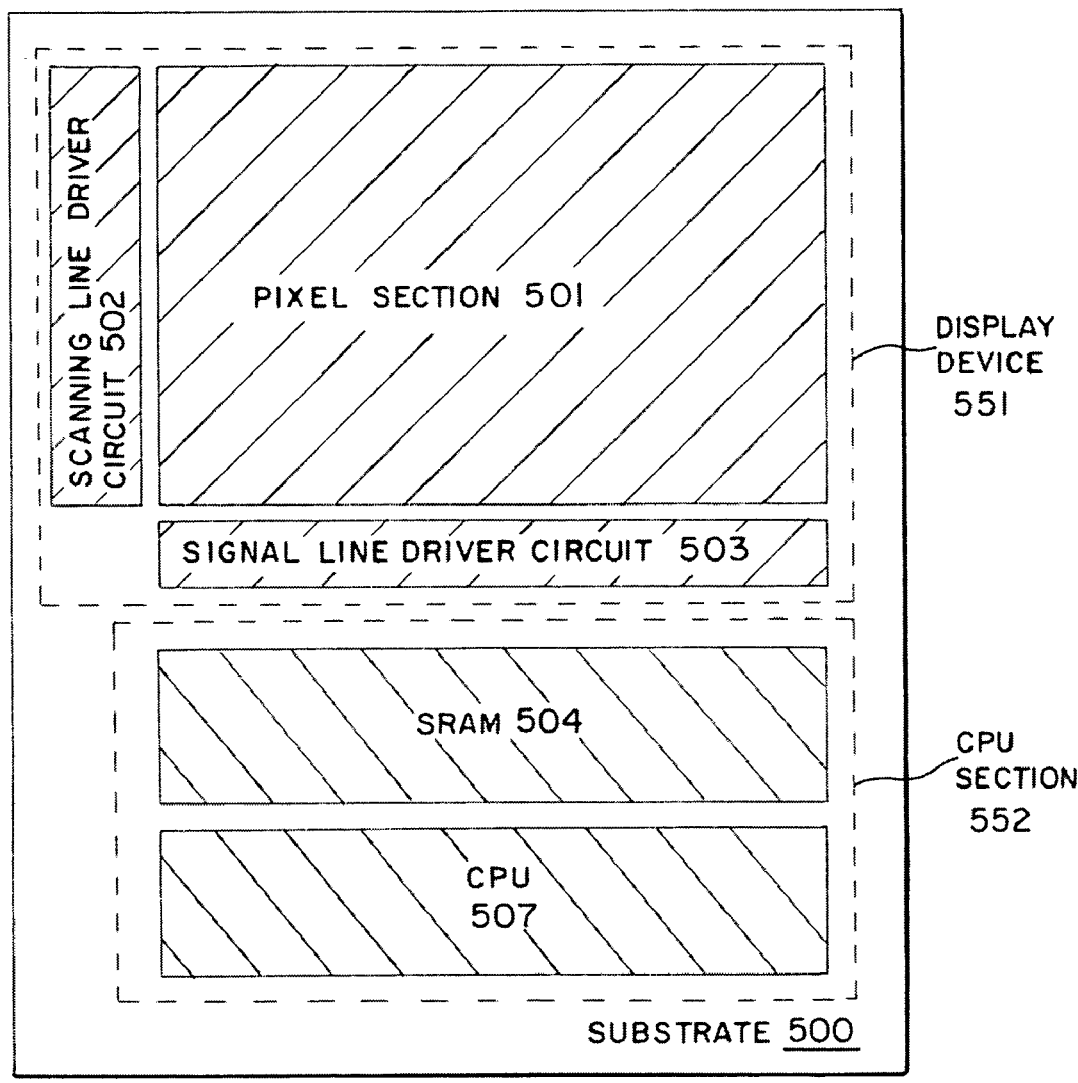
FIG. 5 is a top view of a semiconductor device of the present invention.

In the present Embodiment, one example of a method of fabricating a semiconductor device of the present invention will be described below with reference to FIG. 2. It should be noted that the step of fabrication shown in the present Embodiment 1 corresponds to the example shown in FIG. 1C concerning with means for solving the problems. Particularly, this corresponds to an example in which the patterned steps shown in FIG. 1D is used in the fabrication of gate electrode of the first TFT in FIG. 1C and the doping immediately after the gate electrode of the first TFT has been fabricated is omitted.

In FIG. 2A, a substrate in which an insulating film is formed on the surface of a quartz substrate, a silicon substrate, a metal substrate or a stainless substrate is used for the substrate 101. Moreover, a plastic substrate having a heat resistance capable of resisting the treatment temperature of the present fabrication step may be used. The substrate 101 consisted of barium borosilicate glass, alumino borosilicate glass or the like is used in the present Embodiment.

Subsequently, an front-end film (not shown) consisted of an insulating film such as a silicon oxide film, a silicon nitride film, a silicon oxide/nitride film or the like is formed on the substrate 101. The front-end film may be configured in either a mono-layer structure made of the foregoing insulating film or a structure in which two layers or more of the foregoing insulating films are laminated.

In the present Embodiment, as the first layer of the front-end film, a silicon nitride/oxide film which is formed in a film using a plasma CVD method by utilizing $SiH_4$, $NH_3$ and $N_2O$ as reaction gases is formed in a film thickness of 10-200 nm (preferably, 50-100 nm). In the present Embodiment, the silicon nitride/oxide film is formed in a film thickness of 50 nm. Subsequently, as the second layer of the front-end film, a silicon oxide/nitride film which is formed in a film using a plasma CVD method by utilizing $SiH_4$ and $N_2O$ as reaction gases is formed in a film thickness of 50-200 nm (preferably, 100-150 nm). In the present Embodiment, the silicon oxide/nitride film is formed in a film thickness of 100 nm.

Subsequently, a semiconductor film is formed on the front-end film. The semiconductor film is formed into a film in a thickness of 25-80 nm (preferably, 30-60 nm) by known means (sputtering method, LPCVD method, plasma CVD method or the like). Subsequently, the foregoing semiconductor film is crystallized using a known crystallization method (laser crystallization method, thermal crystallization method by utilizing rapid thermal annealing (hereinafter, referred to as RTA method) or furnace-annealing furnace, thermal crystallization method by utilizing a metal element for promoting the crystallization or the like). It should be noted that a thermal crystallization method using a metal element for promoting the crystallization and a laser crystallization method might be combined. For example, after a thermal crystallization method has been carried out using a metal element for promoting the crystallization, a laser crystallization method may be carried out.

Then, semiconductor layers (semiconductor active layers) 102a-102d are formed by performing the patterning of the obtained crystallized semiconductor film into the desired shape. Noted that as the foregoing semiconductor layer, a compound semiconductor film or the like having a non-crystalline structure such as a non-crystalline semiconductor film, a micro crystallite semiconductor film, a crystalline semiconductor film or a non-crystalline silicon germanium film or the like can be used.

In the present Embodiment, a non-crystalline silicon film is formed in a film thickness of 55 nm using a plasma CVD method. Then, a solution containing Nickel is retained on the non-crystalline silicon film, and after this non-crystalline silicon film has been dehydrogenized (at 500° C. for one hour), the crystalline silicon film is formed by performing the thermal crystallization (at 550° C. for 4 hours). Subsequently, the semiconductor layers 102a-102d are formed in a peninsular shape by performing the patterning treatment using a photolithographic method.

It should be noted that in the case where a crystalline semiconductor film is fabricated by a laser crystallization method, as for a laser, gas laser or solid-state laser using a continuous oscillation or pulse oscillation might be employed. As the former gas laser, an excimer laser, a YAG laser, a $YVO_4$ laser, a YLF laser, a $YalO_3$ laser, a glass laser, a ruby laser, Ti: sapphire laser or the like can be employed. Moreover, as the latter solid-state laser, a laser using a crystal such as a YAG, a $YVO_4$, a YLF, a $YalO_3$ or the like in which Cr, Nd, Er, Ho, Ce, Co, Ti or Tm has been doped can be employed. The fundamental waves of the relevant lasers are different depending upon the material in which an element is doped, and a laser beam having around 1 μm in fundamental wave length is obtained. A higher harmonic wave with respect to the fundamental wave can be obtained by utilizing a non-linear optical element. Noted that it is preferable that upon the crystallization of a non-crystalline semiconductor, the second higher harmonic wave—the fourth higher harmonic wave of the fundamental wave are applied in order to obtain a crystal having a large particle diameter using a solid-state laser capable of performing the continuous oscillation. Representatively, the second higher harmonic wave (532 nm) or the third higher harmonic wave (355 nm) of Nd: $YVO_4$ laser (fundamental wave; 1064 nm) is applied.

Moreover, a laser beam injected from a continuous oscillation $YVO_4$ laser of output 10 W is converted into a higher harmonic wave by a non-linear optical element. Furthermore, there is also a method in which a $YVO_4$ crystal and a non-linear optical element are put in a resonator and a higher harmonic wave is injected. Then, it is preferable that it is formed into a laser beam in a rectangular shape or in an elliptical shape with a radiation surface by an optical system, and it irradiates the treated body. At this time, the energy density is required to be in the range from about 0.01 to 100 $MW/cm^2$ (preferably, in the range from 0.1 to 10 $MW/cm^2$). Then, a semiconductor film is moved relative to the laser beam at the rate in the range from about 10 to 2000 cm/sec and irradiated.

Moreover, in the case where the above-described laser is used, a laser beam irradiated from a laser oscillator is condensed in a linear shape by an optical system, which may irradiate the semiconductor film. Although the conditions for crystallization is appropriately set, in the case where the excimer laser is used, the pulse oscillation frequency may be set 300 Hz, and a laser energy density may be set in the range from 100 to 700 $ml/cm^2$ (representatively, in the range from 200 to 300 $ml/cm^2$). Moreover, in the case where a YAG laser is used, the pulse oscillation frequency may be set in the range from 1 to 300 Hz using its second higher harmonic wave, and the laser energy density may be set in the range from 300 to 1000 $ml/cm^2$ (representatively, 350-500 $ml/cm^2$). Then, the laser beam condensed in a linear shape in the range from 100 to 1000 μm in width (preferably, 400 μm in width) is irradiated over the whole surface of the substrate, an overlapping rate of the linear beam at this time may be set in the range from 50 to 98%.

However, in the present Embodiment, since the crystallization of a non-crystalline silicon film has been carried out using a metal element for promoting the crystallization, the foregoing metal element remains in the crystalline silicon film. Therefore, a non-crystalline silicon film having a film thickness in the range from 50 to 100 nm is formed on the foregoing crystalline silicon film, the foregoing metal element is diffused into the relevant non-crystalline silicon film by performing the heating treatment (RTA method and thermal annealing using furnace-annealing furnace or the like), the foregoing non-crystalline silicon film is removed by etching after the heating treatment has been performed. As a result, the metal element content in the foregoing crystalline silicon film can be reduced or removed.

It should be noted that after the semiconductor layers 102a-102d in a peninsular shape have been formed, a trace of an impurity element (boron or phosphorus) may be doped. Thus, a trace of an impurity element is also added to a region which is to be a channel region, and then the threshold value of TFT is capable of being controlled.

Subsequently, a gate insulating film 103 for covering the semiconductor layers 102a-102d is formed. The gate insulating film 103 is formed with an insulating film containing silicon in a film thickness of 40-150 nm by utilizing a plasma CVD method and a sputtering method. In the present Embodiment, a silicon oxide/nitride film is formed in a film thickness of a film thickness of 115 nm as the gate insulating film 103 by a plasma CVD method. Needless to say, the gate insulating film 103 is not limited to the silicon oxide/nitride film, an insulating film containing other silicon may be used as a mono-layer structure or a laminated structure. It should be noted that in the case where a silicon oxide film is used as the gate insulating film 103, TEOS (tetraethyl orthosilicate) and $O_2$ are mixed by a plasma CVD method, the reaction pressure is set at 40 Pa, the substrate temperature is set in the range from 300 to 400° C., it may be formed by electrically discharging under the conditions of high frequency (13.56 MHz) and power density in the range from 0.5 to 0.8 $W/cm^2$. The silicon oxide film fabricated by the above-described step can obtain an excellent property as the gate insulating film 103 by subsequent thermal annealing at the temperature ranging from 400 to 500° C.

Here, an impurity element might have been previously doped in the specific regions of the semiconductor layers 102a-102d before a gate electrode is formed. A Lov region or the like is capable of being formed by forming the gate electrode being overlapped with the impurity region formed at this time. It should be noted that another insulating film (referred to as insulating film for doping) different from the gate insulating film 103 might have been previously formed before an impurity element is doped in the semiconductor layers 102a-102d. In this case, after the above-described doping treatment has been terminated, the insulating film for doping is removed.

Subsequently, a first electrically conductive film 104a is formed in a film thickness of 20-100 nm with tantalum nitride (TaN), and a second electrically conductive film 104b is formed in a film thickness of 100-400 nm with tungsten (W). Thus, a gate metal having a two-layer laminated structure is formed. In the present Embodiment, the first electrically conductive film 104a consisted of tantalum nitride (TaN) film in a film thickness of 30 nm and the second electrically conductive film 104b consisted of tungsten (W) in a film thickness of 370 nm are laminated and formed.

In the present Embodiment, a tantalum nitride (TaN) film which is the first electrically conductive film 104a is formed in the atmosphere containing nitrogen using the target of tantalum (Ta) by a sputtering method. Moreover, a tungsten (W) film which is the second electrically conductive film 104b is formed using the target of tungsten (W) by a sputtering method. Besides these, it can be also formed by a thermal CVD method using tungsten hexafluoride ($WF_6$). Whatever the case may be, in order to use it as a gate electrode, it is required that the resistance is contemplated to be lowered, and it is preferable that the resistivity of the tungsten (W) film is made 20 μΩcm or less. Although the resistivity of the tungsten (W) film can be contemplated to be lowered by enlarging its crystal grain, in the case where the amount of an impurity element such as oxygen or the like is much in the tungsten (W) film, the crystallization is inhibited and the resistance becomes higher. Therefore, in the present Embodiment, the resistivity in the range from 9 to 20 μΩcm is realized by a sputtering method using the target of tungsten (W) at a high purity (purity; 99.9999,%), and further by forming the tungsten (W) film with taking a sufficient consideration of not mixing an impurity from the vapor phase during the film formation.

It should be noted that the first electrically conductive film 104a is made tantalum nitride (TaN) film, the second electrically conductive film 104b is made tungsten (W) film, but materials for constituting the first electrically conductive film 104a and the second electrically conductive film 104b are not particularly limited. The first electrically conductive film 104a and the second electrically conductive film 104b may be formed with an element selected from tantalum (Ta), tungsten (W), titanium (Ti), molybdenum (Mo), aluminum (Al), copper (Cu), chromium (Cr) and neodymium (Nd), or with an alloy material mainly consisted of the foregoing element or a compound material. Moreover, it may be also formed with a semiconductor film represented by a polycrystal silicon film in which an impurity element such as phosphorus or the like are doped or Ag—Pd—Cu alloy.

Next, a resist 105 is formed in a film. As a method of forming the resist 105 in a film, a coating method can be employed. It should be noted that as a coating method, a spin coater or a roll coater might be used. As for the resist 105, either of positive-type or negative-type is capable of being used, and it can be selected according to the light source used at the time of exposure.

Subsequently, as shown in FIG. 2B, the resist masks 108, 109 and 185 are formed by exposing the resist 105 to light (first exposure) and the first etching treatment (gate metal etching 1) is carried out for the purpose of fabricating a gate electrode. In the present Embodiment, using ICP (Inductively Coupled Plasma) etching method as a procedure of etching of the first etching treatment, $CF_4$ and $Cl_2$ are mixed for etching gas, it is etched by generating a plasma by providing the RF power (13.56 MHz) of 500 W into a coil type electrode at a pressure of 1 Pa. The RF (13.56 MHz) power of 100 W is also provided on the side of the substrate (sample stage), substantially negative self-bias voltage is applied. In the case where $CF_4$ and $Cl_2$ are mixed, both of tungsten (W) film and tantalum (Ta) film are etched to similar extent of the level.

However, the portions of the first electrically conductive film 104a and the second electrically conductive film 104b formed on the semiconductor layers 102c, 102d are not etched because these portions are covered with the resist mask 185.

Under the above-described etching conditions, by making the shape of the resist mask suitable, the edge portions of the first electrically conductive layers 106a, 107a and the second electrically conductive layers 106b, 107b are made in a tapered shape by the effect of bias voltage applied to the substrate side. Here, an angle (taper angle) of the portion having a tapered shape (tapered portion) is defined as an angle formed between the surface of the substrate 101 (horizontal surface) and the tilted portion of the tapered portion. The angle of the tapered portion of the first electrically conductive layer and the second electrically conductive layer can be made at an angle in the range from 15 to 45° by appropriately selecting the etching conditions. In order to etch without remaining the residue on the gate insulating film 103, the etching time may be increased by the ratio of about 10-20%. Since the selection ratio of a silicon oxide/nitride film with respect to a tungsten (W) film is in the range from 2 to 4 (typically, 3), the surface in which the silicon oxide/nitride film has been exposed is to be etched by about 20-50 nm by means of an over etching treatment. Thus, the electrically conductive layers 106, 107 (first electrically conductive layers 106a, 107a and second electrically conductive layers 106b, 107b) of the first shape consisted of the first electrically conductive layer and the second electrically conductive layer are formed by performing the etching treatment. At this time, in the gate insulating film 103, the exposed region is etched by about 20-50 nm, and the thinned regions are formed.

Then, an impurity element which gives the N-type impurity is added by performing the first doping treatment (doping 1). As for the doping method, it may be performed by an ion doping method, or an ion implantation method. As for the conditions for an ion doping method, the dosage is set in the range from $1\times10^{13}$ to $5\times10^{14}$ atoms/cm², the acceleration voltage is set in the range from 60 to 100 kV, and it is carried out. As an impurity element which gives the N-type impurity, an element belonging to 15 group, typically, phosphorus (P) or arsenic (As) are employed, however, here, phosphorus (P) is employed. In this case, first impurity regions 110a, 110b, 111a and 111b are formed in a self-aligned manner by utilizing the electrically conductive layers in the first shape (first electrically conductive layers 106a, 107a and second electrically conductive layers 106b, 107b) as masks for an impurity element which gives the N-type impurity. An impurity element which gives the N-type impurity in the range from $1\times10^{20}$ to $1\times10^{21}$ atoms/cm³ is added to the first impurity regions 110a, 110b, 111a and 111b.

Next, as shown in FIG. 2C, the resist mask is not removed as it is, the second etching treatment (gate metal etching 2) is carried out. $CF_4$, $Cl_2$ and $O_2$ are used for etching gases, the tungsten (W) film is selectively etched. Thus, the electrically conductive layers 412, 413 in the second shape (first electrically conductive layers 412a, 413a and the second electrically conductive layers 412b, 413b) are formed. At this time, in the gate insulating film 103, the exposed region is further etched by about 20-50 nm, and becomes thinned.

The etching reaction of tungsten (W) film and tantalum (Ta) film using the mixed gas of $CF_4$ and $Cl_2$ can be estimated from the generated radical or ion species and the vapor pressure of the reaction products. When the vapor pressures of fluoride and chloride of tungsten (W) and tantalum (Ta) are compared, the vapor pressure of $WF_6$ which is a fluoride of tungsten (W) is extremely high, and those of other $WCl_5$, $TaF_5$, $TaCl_5$ are at similar level. Therefore, both of the tungsten (W) film and tantalum (Ta) film are etched in the mixed gas of $CF_4$ and $Cl_2$. However, when an appropriate amount of $O_2$ is added to this mixed gas, $CF_4$ and $O_2$ are reacted into CO and F, a large amount of F radical or F ion are generated. As a result, in the case of the tungsten (W) film whose vapor pressure of fluoride is high, its etching rate is increased. On the other hand, in the case of tantalum (Ta), if F is increased, the increase of the etching rate is relatively small. Moreover, since tantalum (Ta) is easily oxidized compared to tungsten (W), the surface of tantalum (Ta) is oxidized by adding $O_2$. Since the oxide of tantalum (Ta) is not reacted with fluorine and chlorine, the etching rate of tantalum (Ta) film is further lowered. Therefore, the difference between the etching rates of tungsten (W) film and tantalum (Ta) film is capable of being made, the etching rate of tungsten (W) film is capable of being more increased comparing to the etching rate of tantalum (Ta) film.

Then, the second doping treatment (doping 2) is carried out. In this case, the dosage is lowered more than that of the first doping treatment, and an impurity element which gives the N-type impurity is doped under the condition of a high acceleration voltage. For example, under the condition of the acceleration voltage being set at 70-120 kV, the dosage is performed at $1\times10^{13}$ atoms/cm², and a new impurity region is formed inside of the first impurity regions 110a, 110b, 111a and 111b formed on the peninsular semiconductor layer of FIG. 2B. The doping is carried out using the second electrically conductive layers 412b, 413b as masks for an impurity element so that an impurity element is also added to the semiconductor layers of the lower regions below the first electrically conductive layers 412a, 413a. Thus, the second impurity regions 416a, 416b, 418a and 418b are formed. The concentration of phosphorus (P) added to these second impurity regions 416a, 416b, 418a and 418b has a slow concentration gradient according to the film thickness of the tapered portions of the first electrically conductive layers 412a, 413a. Noted that although the impurity concentration is slightly lowered from the edge portion of the tapered portions of the first electrically conductive layers 412a, 413a toward the inside in the semiconductor layer overlapped with the tapered portions of the first electrically conductive layers 412a, 413a, the concentration is approximately the same.

Subsequently, as shown in FIG. 2D, the third etching treatment (gate metal etching 3) is carried out. The etching treatment is carried out using $CHF_6$ as an etching gas by utilizing a reactive ion etching method (RIE method). The region overlapped between the first electrically conductive layer and the semiconductor layer is diminished by partially etching the tapered portions of the first electrically conductive layers 412a, 413a by means of the third etching treatment. The electrically conductive layers 112, 113 in the third shape (first electrically conductive layers 112a, 113a and second electrically conductive layers 112b, 113b) are formed by means of the third etching treatment. At this time, in the gate insulating film 103, the exposed region is further etched by about 20-50 nm and becomes thinned. As for the second impurity regions 416a, 416b, 418a and 418b, the second impurity regions 117a, 117b, 119a and 119b overlapped with first electrically conductive layers 112a, 113a and the third impurity regions 116a, 116b, 118a and 118b located between the first impurity region and the second impurity region are formed.

Subsequently, as shown in FIG. 2E, after the resist masks 108, 109 and 185 have been removed, a resist 186 is newly formed in a film. As the film formation method of the resist 186, a coating method can be employed. Noted that a spin coater or a roll coater might be used as a coating method. As for the resist 186, either of a positive-type or a negative-type is capable of being used, can be selected according to the light source used at the time of exposure. Noted that the material for the resist 186 might be a material being identical with that of the resist 105 used at the time of the first exposure, or might be different from that.

Subsequently, the resist 186 is exposed to light (second exposure), resist masks 123, 124 and 187 are formed (FIG. 2F). Noted that exposure means used in the second exposure might be the same with the first exposure, or might be different from that. Subsequently, the fourth etching treatment (gate metal etching 4) is carried out. Thus, electrically conductive layers 121, 122 in the fourth shape (first electrically conductive layers 121a, 122a, and second electrically conductive layers 121b, 122b) having an approximately vertical edge portions are formed. It should be noted that since the portions of the electrically conductive layers 112, 113 in the third shape (first electrically conductive layers 112a, 113a and second electrically conductive layers 112b, 113b) formed on the semiconductor layers 102a and 102b are covered with the resist mask 187, these are not etched.

Subsequently, the third doping treatment (doping 3) is carried out. In the third doping treatment, an impurity element which gives the N-type impurity is added. As for a doping method, it may be carried out by an ion doping method, or an ion implantation method. As the conditions of an ion doping method, the dosage is set in the range from $1 \times 10^{13}$ to $5 \times 10^{14}$ atoms/cm$^2$, and the acceleration voltage is set in the range from 60 to 100 kV, and then it is carried out. Although as an impurity element which gives the N-type impurity, an element belonging to 15 group, typically, phosphorus (P) or arsenic (As) is used, here, phosphorus (P) is used. In this case, fourth impurity regions 125a, 125b, 126a and 126b are formed by utilizing the resist masks 123, 124 and 187 as masks for the impurity element which gives the N-type impurity. An impurity element which gives the N-type impurity is added to the fourth impurity regions 125a, 125b, 126a and 126b in the concentration range from $1 \times 10^{20}$ to $1 \times 10^{21}$ atoms/cm$^3$. Noted that since the semiconductor layers 102a, 102b are covered with the resist mask 187, an impurity element is not added by the third doping treatment.

It should be noted that in the present Embodiment, the conditions of the doping of an impurity element (third doping treatment) applied to the fourth impurity regions 125a, 125b, 126a and 126b is made as the same as the conditions of the doping of an impurity element applied to the first impurity regions 110a, 110b, 111a and 111b (first doping treatment). However, it is not limited to this. The conditions may be different in the first doping treatment and the third doping treatment.

Subsequently, as shown in FIG. 2G, after the resist masks 187, 123 and 124 have been removed, resist masks 127 and 128 are newly formed, and the fourth doping treatment (doping 4) is carried out. In the fourth doping treatment, an impurity element which gives the P-type impurity is added. As for a doping method, an ion doping method or an ion implantation method may be employed. In the peninsular semiconductor layers 102b and 102d for forming a P-channel type TFT, the fourth impurity regions 190a, 190b, 191a, 191b, 129a and 129b to which P-type impurity element is added are formed. At this time, the impurity region is formed in a self-aligned manner by utilizing the electrically conductive layer in the third shape 113b and the electrically conductive layer in the fourth shape 122 as masks for the impurity element. It should be noted that the peninsular semiconductor layers 102a, 102c in which a N-channel type TFT is formed have been previously and entirely covered with the resist masks 127 and 128.

Noted that phosphorus (P) is added in the respective different concentrations to the fourth impurity regions 190a, 190b, 191a, 191b, 129a and 129b by performing the first doping treatment, the second doping treatment and the third doping treatment. However, an impurity element which gives the P-type impurity is added to any of the regions by an ion doping method using diboron hexahydrate (diborane) ($B_2H_6$). At this time, it is made so that the concentration of an impurity element which gives the P-type impurity to the fourth impurity regions 190a, 190b, 191a and 191b is in a concentration range from $2 \times 10^{20}$ to $2 \times 10^{21}$ atoms/cm$^3$. Thus, the fourth impurity regions 190a, 190b, 191a and 191b function as the source region and the drain region of the P-channel type TFT without any problem. Moreover, the fourth impurity regions 129a, 129b function as the Lov region of the P-channel type TFT without any problem.

By means of the above-described steps, impurity regions are formed in the respective semiconductor layers 102a-102d. The electrically conductive layers in the third shape 112, 113 and the electrically conductive layers in the fourth shape 121, 122 overlapping with the peninsular semiconductor layer function as gate electrodes.

Thus, as shown in FIG. 2H, a N-channel type TFT 71, a P-channel type TFT 72, a N-channel type TFT 73 and a P-channel type TFT 74 are formed.

The N-channel type TFT 71 has a channel region 192, a high concentration impurity regions 110a, 110b corresponding to a source region and a drain region, low concentration impurity regions (Lov regions) 117a, 117b which are overlapped with the gate electrode, low concentration impurity regions (Loff regions) 116a, 116b which are not overlapped with the gate electrode. On the other hand, the P-channel type TFT 72 has a channel region 193, a high concentration impurity regions 190a, 190b corresponding to a source region and a drain region, and low concentration impurity regions (Lov regions) 129a, 129b which are overlapped with the gate electrode. Noted that it is configured in such a structure that it does not have the Loff regions. The gate electrodes of the N-channel type TFT 71 and the P-channel type TFT 72 have an edge portion in a tapered shape. Therefore, these are TFTs in a shape which is not suitable in order to make the gate electrode smaller. However, since the Lov regions and the Loff regions are capable of being fabricated in a self-aligned manner in the gate electrode fabrication steps, the number of the steps in the TFT fabrication can be suppressed. Thus, it is possible to form a TFT having a high withstanding voltage while the number of the steps is reduced.

Moreover, the N-channel type TFT 73 has a channel region 194 and a high concentration impurity regions 125a, 125b corresponding to a source region and a drain region. Moreover, the P-channel type TFT 74 has a channel region 195 and a high concentration impurity regions 191a, 191b corresponding to a source region and a drain region. The N-channel type TFT 73 and the P-channel type TFT 74 are formed in a signal drain structure. In the case where the N-channel type TFT 73 and P-channel type TFT 74 are made TFTs having the Lov regions and the Loff regions, there are problems that a new mask is needed and the number of the steps is increased. However, since the edge portions of the gate electrode are etched in the vertical direction, the refining is capable of being carried out.

For example, a circuit in which the withstanding voltage is required can be fabricated with the N-channel type TFT 71 and the P-channel type TFT 72, and a circuit in which the refining is required can be fabricated with the N-channel type TFT 73 and the P-channel type TFT 74.

It should be noted that the exposure means used in the step of performing the first exposure and the exposure means used in the step of performing the second exposure are capable of being made the same, or is capable of being made different from each other. Here, in general, the shorter the wavelength of the radiation energy source used for exposure is, the higher the resolution at the time of exposure becomes. Hence, for example, in the case where the N-channel type TFT 73 and the P-channel type TFT 74 are required to be refined rather than the N-channel type TFT 71 and the P-channel type TFT 72, the wavelength of light used in the step of performing the second exposure is made shorter than the wavelength of light used in the step of the first exposure.

Moreover, an aligner used in the step of performing the first exposure and an aligner used in the step of performing the second exposure are capable of being made the same or are capable of being made different from each other.

For example, in the case where the N-channel type TFT 73 and the P-channel type TFT 74 are required to be refined rather than the N-channel type TFT 71 and the P-channel type TFT 72, the exposure is carried out using a MPA in the step of performing the first exposure, and the exposure is carried out using a stepper in the step of performing the second exposure. Here, in general, in the case where a MPA is used, since a large area is capable of being exposed once, it is advantageous in the productivity of semiconductor devices. On the other hand, in the case where a stepper is used, the resist is exposed to light by projecting the pattern by an optical system on a reticle and operating and stopping (step and repeat) the stage on the substrate side. Comparing to the MPA, although a large area cannot be exposed once, the resolution of line and space (L&S) (hereinafter, a resolution is referred to a resolution of L&S) is capable of being enhanced.

Moreover, as another example, in the case where the N-channel type TFT 73 and the P-channel type TFT 74 are required to be refined rather than the N-channel type TFT 71 and the P-channel type TFT 72, in the step of performing the first exposure, a stepper whose reduction ratio is small at the time when the pattern on the reticle is projected on the resist by an optical system is used for the exposure, and in the step of performing the second exposure, a stepper whose reduction ratio is large at the time when the pattern on the reticle is projected on the resist by an optical system is used for the exposure. It should be noted that the reduction ratio of a stepper is a value indicating N (N is an integer) at the time when the pattern on the reticle is projected on the resist by making it 1/N-fold. Here, in general, in the case of a stepper whose reduction ratio is large at the time when the pattern on the reticle is projected on the resist by an optical system, the area in which the exposure is capable of being carried out once is narrow, but the resolution is high. On the other hand, in the case of a stepper whose reduction ratio is small at the time when the pattern on the reticle is projected on the resist by an optical system, the area in which the exposure is capable of being carried out once is wide, but the resolution is low.

As described above, a semiconductor device having a high productivity and TFT having an excellent property is capable of being fabricated by changing the exposure means in the step of performing the first exposure and in the step of performing the second exposure. It should be noted that the exposure means (that indicates both of exposure conditions and aligner) used in the steps of performing the first exposure and the second exposure is not limited to the above-described ones. Known exposure means is capable of being freely used. Moreover, the step of performing the first exposure and the step of performing the second exposure may be carried out by utilizing a plurality of exposure means, respectively.

It should be noted that although in the present Embodiment, the step of fabricating a single gate type TFT has been described, a double gate structure, a multi-gate structure having the number of gates more than two would be also available.

Noted that in the present Embodiment, a top gate type TFT has been shown, and the steps of fabricating it has been described. However, a method of fabricating a semiconductor device of the present invention is capable of being also applied to a dual gate type TFT. It should be noted that a dual gate type TFT is referred to a TFT having a gate electrode superimposed above a channel region via an insulating film and a gate electrode superimposed below the relevant channel region via an insulating film.

Moreover, the degree of freedom for the shape of an electrode of an element except for TFT, wirings and the like which are formed using a gate metal is capable of being increased if a method of fabricating a semiconductor device of the present invention is applied.

Embodiment 2

In the present Embodiment, one example of a method of fabricating a semiconductor device of the present invention which is different from the examples of Embodiment 1 will be described below with reference to FIG. 3. It should be noted that an example of the step of fabrication shown in Embodiment 2 of the present invention corresponds to the example shown in FIG. 1C performed by the means for solving the problems.

In FIG. 3A, for a substrate 201, a substrate in which an insulating film is formed on the surface of a quartz substrate, a silicon substrate, metal substrate or a stainless steel substrate is employed. Moreover, a plastic substrate having a heat resistance capable of resisting the treatment temperature of the present step of fabrication may be employed. In the present Embodiment, the substrate consisted of a glass such as barium borosilicate glass, aluminoborosilicate glass or the like is employed. Subsequently, a front-end film (not shown) consisted of an insulating film such as a silicon oxide film, a silicon nitride film or a silicon oxide/nitride film or the like is formed on the substrate 201. The front-end film may be configured in either a mono-layer structure of the foregoing insulating film or a structure in which two or more layers of the foregoing insulating film are laminated may be available. In the present Embodiment, as the first layer of the front-end film, a silicon nitride/oxide film formed is formed in a film thickness of 10-200 nm (preferably, 50-100 nm) by utilizing $SiH_4$, $NH_3$ and $N_2O$ as reaction gases. In the present Embodiment, a silicon nitride/oxide film is formed in a film thickness of 50 nm. Subsequently, as the second layer of the front-end film, a silicon oxide/nitride film is formed in a film by utilizing $SiH_4$ and $N_2O$ as reaction gases using a plasma CVD method is formed in a film thickness of 50-200 nm (preferably, 100-150 nm). In the present Embodiment, a silicon oxide/nitride film is formed in a film thickness of 100 nm.

Subsequently, a semiconductor film is formed on the front-end film. As for a semiconductor film, a semiconductor film is formed in a film thickness of 25-80 nm (preferably, 30-60 nm) by known means (sputtering method, LPCVD method, plasma CVD method or the like). Subsequently, the foregoing semiconductor film is crystallized using a known crystallization method (laser crystallization method, thermal crystallization using RTA or furnace-annealing furnace, thermal crystallization method using a metal element for promoting the crystallization or the like). Noted that a thermal crystallization method using a metal element for promoting the crystallization and a laser crystallization method may be combined. For example, after a thermal crystallization method using a metal element for promoting the crystallization has been carried out, a laser crystallization method may be carried out.

Then, semiconductor layers (semiconductor active layers) 202a-202e are formed by performing the patterning of the obtained crystalline semiconductor film in a desired shape. It should be noted that as the foregoing semiconductor layer, a compound semiconductor film or the like having anoncrystalline structure such as a non-crystalline semiconductor film, a microcrystal semiconductor film a crystalline semiconductor film, a non-crystalloid silicon germanium film or the like is capable of being used. In the present Embodiment, a non-crystalline silicon film having a film thickness of 55 nm is formed using a plasma CVD method. Then, a solution containing Nickel is retained on the non-crystalline silicon film, and after this non-crystalline silicon film has been dehydrogenized (at 500° C. for one hour), a crystalline silicon film is formed by carrying out a thermal crystallization (at 550° C. for 4 hours). Subsequently, the semiconductor layers 202a-202e in a peninsular shape are formed by performing the patterning treatment using a photolithographic method.

It should be noted that in the case where a crystalline semiconductor film is fabricated by a laser crystallization method, as for a laser, a gas laser or a solid-state laser of a continuous oscillation or a pulse oscillation may be employed. As the foregoing gas laser, an excimer laser, a YAG laser, a $YVO_4$ laser, a YLF laser, a $YAlO_3$ laser, a glass laser, a ruby laser, a Ti: sapphire laser or the like can be employed. Moreover, as the latter solid-state laser, a laser using a crystal such as a YAG, a $YVO_4$, a YLF, a $YAlO_3$ or the like in which chromium (Cr), neodymium (Nd), erbium (Er), holmium (Ho), cesium (Ce), cobalt (Co), titanium (Ti) or thulium (Tm) has been doped can be employed. A fundamental wave of the relevant laser is different depending upon materials in which an element is doped, and a laser beam having a fundamental wave of around 1 μm is obtained. A higher harmonic wave with respect to the fundamental wave can be obtained by utilizing a non-linear optical element. It should be noted that it is preferable that the second higher harmonic wave—the fourth higher harmonic wave of the fundamental wave is applied using a solid-state laser capable of performing the continuous oscillation, in order to obtain the crystal having a large grain diameter at the time when the non-crystalline semiconductor film is crystallized. Typically, the second higher harmonic wave (532 nm) and the third higher harmonic wave (355 nm) of Nd: $YVO_4$ laser (fundamental wave; 1064 nm) are applied.

Moreover, a laser beam injected from a continuous oscillation $YVO_4$ laser in the output of 10 W is converted into a higher harmonic wave by a non-linear optical element. Furthermore, there is also a method in which a $YVO_4$ crystal and a non-linear optical element are put in a resonator and a higher harmonic wave is injected. Then, it is preferable that it is formed into a laser beam in a rectangular shape or in an elliptical shape with a radiation surface by an optical system, and it irradiates the treated body. At this time, the energy density is required to be in the range from about 0.01 to about 100 $MW/cm^2$ (preferably, in the range from 0.1 to 10 $MW/cm^2$). Then, a semiconductor film is moved relative to the laser beam at the rate in the range from about 10 to about 2000 cm/sec and irradiated.

Moreover, in the case where the above-described laser is used, a laser beam irradiated from a laser oscillator is condensed in a linear shape by an optical system, which may irradiate the semiconductor film. Although the conditions for crystallization is appropriately set, in the case where the excimer laser is used, the pulse oscillation frequency may be set at 300 Hz, and a laser energy density may be set in the range from 100 to 700 $ml/cm^2$ (representatively, in the range from 200 to 300 $ml/cm^2$). Moreover, in the case where a YAG laser is used, the pulse oscillation frequency may be set in the range from 1 to 300 Hz using its second higher harmonic wave, and the laser energy density may be set in the range from 300 to 1000 $ml/cm^2$ (representatively, in the range from 350 to 500 $ml/cm^2$). Then, the laser beam condensed in a linear shape from 100 to 1000 μm in width (preferably, 400 μm in width) is irradiated over the whole surface of the substrate, an overlapping rate of the linear beam at this time may be set in the range from 50 to 98%.

However, in the present Embodiment, since the crystallization of a non-crystalline silicon film has been carried out using a metal element for the purpose of promoting the crystallization, the foregoing metal element remains as it is in the crystalline silicon film. Therefore, a non-crystalline silicon film having a film thickness in the range from 50 to 100 nm is formed on the foregoing crystalline silicon film, the foregoing metal element is diffused into the relevant non-crystalline silicon film by performing the heating treatment (RTA method and thermal annealing using furnace-annealing furnace or the like), the foregoing non-crystalline silicon film is removed by etching after the heating treatment has been performed. As a result, the metal element content in the foregoing crystalline silicon film can be reduced or removed.

It should be noted that after the semiconductor layers 202a-202e in a peninsular shape have been formed, a trace of an impurity element (boron or phosphorus) might be doped. Thus, a trace of an impurity element is also added to a region which is to be a channel region, and then the threshold value of TFT is capable of being controlled.

Subsequently, a gate insulating film 203 for covering the semiconductor layers 202a-202e is formed. The gate insulating film 203 is formed with an insulating film containing silicon in a film thickness of 40-150 nm by utilizing a plasma CVD method and a sputtering method. In the present Embodiment, a silicon oxide/nitride film is formed in a film thickness of 115 nm as the gate insulating film 203 by a plasma CVD method. Needless to say, the gate insulating film 203 is not limited to the silicon oxide/nitride film, an insulating film containing other silicon may be employed as a mono-layer structure or a laminated structure. It should be noted that in the case where a silicon oxide film is used as the gate insulating film 203, TEOS (tetraethyl orthosilicate) and $O_2$ are mixed by a plasma CVD method, the reaction pressure is set at 40 Pa, the substrate temperature is set in the range from 300 to 400° C., it may be formed by electrically discharging under the conditions of high frequency (13.56 MHz) and power density in the range from 0.5 to 0.8 W/cm$^2$. The silicon oxide film fabricated by the above-described step can obtain an excellent property as the gate insulating film 203 by subsequent thermal annealing at the temperature ranging from 400 to 500° C.

Here, an impurity element might have been previously doped in the specific region of the semiconductor layers 202a-202e before a gate electrode is fabricated. A Lov region or the like is capable of being formed by fabricating the gate electrode being overlapped with the impurity region formed at this time. It should be noted that another insulating film (referred to as insulating film for doping) different from the gate insulating film 203 might have been previously formed before an impurity element is doped in the semiconductor layers 202a-202e. In this case, after the above-described doping treatment has been terminated, the insulating film for doping is removed.

Subsequently, a first electrically conductive film 204a is formed in a thickness of 20-100 nm with tantalum nitride (TaN), and a second electrically conductive film 204b is formed in a film thickness of 100-400 nm with tungsten (W). In the present Embodiment, the first electrically conductive film 204a consisted of tantalum nitride (TaN) film in a film thickness of 30 nm and the second electrically conductive film 204b consisted of tungsten (W) in a film thickness of 370 nm are laminated and formed. In the present Embodiment, a tantalum nitride (TaN) film which is the first electrically conductive film 204a is formed in the atmosphere containing nitrogen using the target of tantalum (Ta) by a sputtering method. Moreover, a tungsten (W) film which is the second electrically conductive film 204b is formed using the target of tungsten (W) by a sputtering method. Besides these, it can be also formed by a thermal CVD method using tungsten hexafluoride ($WF_6$). Whatever the case may be, in order to use it as a gate electrode, it is required that the resistance is contemplated to be lowered, and it is preferable that the resistivity of the tungsten (W) film is made 20 μΩcm or less. Although the resistivity of the tungsten (W) film can be contemplated to be lowered by enlarging its crystal grain, in the case where the amount of an impurity element such as oxygen or the like is much in the tungsten (W) film, the crystallization is inhibited and the resistance becomes higher. Therefore, in the present Embodiment, the resistivity in the range from 9 to 20 μΩcm was capable of being realized by a sputtering method using the target of tungsten (W) at a high purity (purity; 99.9999%), and further by forming the tungsten (W) film with taking a sufficient consideration of not mixing an impurity from the vapor phase during the film formation.

It should be noted that in the present Embodiment the first electrically conductive film 204a has been made tantalum nitride (TaN) film and the second electrically conductive film 204b has been made tungsten (W) film, but materials for constituting the first electrically conductive film 204a and the second electrically conductive film 204b are not particularly limited. The first electrically conductive film 204a and the second electrically conductive film 204b may be formed with an element selected from tantalum (Ta), tungsten (W), titanium (Ti), molybdenum (Mo), aluminum (Al), copper (Cu), chromium (Cr) and neodymium (Nd), or with an alloy material mainly consisted of the foregoing element or a compound material. Moreover, it may be also formed with a semiconductor film represented by a polycrystal silicon film in which an impurity element such as phosphorus or the like have been doped or Ag—Pd—Cu alloy.

Next, a resist 205 is formed in a film. As a method of forming the resist 205 in a film, a coating method can be employed. It should be noted that as a coating method, a spin coater or a roll coater might be used. As for the resist 205, either of a positive-type or a negative-type is capable of being used, and it can be selected according to the light source used at the time of exposure.

Subsequently, the resist masks 209, 210, 211 and 285 are formed by exposing the resist 205 to light (first exposure), and the first etching treatment (gate metal etching 1) is carried out for fabricating a gate electrode (FIG. 3B). In the first etching treatment, it is carried out under the first and second etching conditions. In the present Embodiment, under the conditions of the first etching treatment, using ICP (Inductively Coupled Plasma) etching method, $CF_4$ and $Cl_2$ and $O_2$ are used for etching gas, and the ratio of the gas flow rates is set at the ratio of 25:25:10 (sccm), respectively, it is etched by generating a plasma by providing the RF power (13.56 MHz) of 500 W into a coil type electrode at a pressure of 1.0 Pa. The RF (13.56 MHz) power of 150 W is also provided on the side of the substrate (sample stage), substantially negative self-bias voltage is applied. Then, a tungsten (W) film is etched under the first etching conditions and made the edge portion of the second electrically conductive layer 204b in a tapered shape. Subsequently, the second etching conditions are changed without removing the resist masks 209, 210 and 211, $CF_4$ and $Cl_2$ are used for etching gas, the ratio of the gas flow rates is set at the ration of 30:30 (sccm), respectively, it is etched for about 15 seconds by providing RF (13.56 MHz) power of 500 W into a coil type electrode at the pressure of 1.0 Pa and by generating a plasma. The RF (13.56 MHz) power of 20 W is also provided on the substrate side (sample stage), and substantially negative self-biased voltage is applied. Under the second etching conditions, both of the first electrically conductive layer 204a and the second electrically conductive layer 204b are etched to the approximately same extent. It should be noted that the etching time might be increased at the ratio of about 10-20% in order to etch without remaining residue on the gate insulating film 203. In the above-described first etching treatment, the edge portions of the first electrically conductive layer 204a and the second electrically conductive layer 204b become in a tapered shape due to the effect of the biased voltage applied to the substrate side by means of the optimization of shape of the resist mask. Thus, electrically conductive layers 206, 207 and 208 of the first shape (first electrically conductive layers 206a, 207a and 208a and second electrically conductive layers 206b, 207b and 208b) are formed by performing the first etching treatment. In the gate insulating film 203, the exposed region is etched by about 20-50 nm and becomes thinned.

Subsequently, as shown in FIG. 3C, the second etching treatment (gate metal etching 2) is carried out without removing the resist masks 209, 210, 211 and 285. In the second etching treatment, using $SF_6$, $Cl_2$ and $O_2$ are used for etching gases, and the ratio of the gas flow rates is set at 24:12:24 (sccm) respectively, it is etched for about 25 seconds by providing RF (13.56 MHz) power of 700 W into a coil type electrode at the pressure of 1.3 Pa and by generating a plasma. The RF (13.56 MHz) in the power of 10 W is also provided to the substrate side (sample stage), and substantially negative self-biased voltage is applied. Thus, the electrically conductive layers 212-214 in the second shape (first electrically conductive layers 212a-214a, second electrically conductive layers 212b-214b) by selectively etching a tungsten (W) film. At this time, the first electrically conductive layers 206a-208a are little etched. Moreover, the portions of first electrically conductive film 204a and the second electrically conductive film 204b formed on the semiconductor layer 202d, 202e is not etched throughout the first etching treatment and the second etching treatment because these portions are covered with the resist mask 285.

Then, the first doping treatment (doping 1) is carried out without removing the resist masks 209, 210 and 211, an impurity element which gives the N-type impurity is added to the semiconductor layers 202a-202c in a low concentration. The first doping treatment may be carried out by an ion doping method or an ion implantation method. As for the conditions of an ion dope method, the dosage is set in the range from $1\times10^{13}$ to $5\times10^{14}$ atoms/cm$^2$, the acceleration voltage is set in the range from 40 to 80 kV, and the doping is carried out. As an impurity element which gives the N-type impurity, an element belonging to 15 group may be employed, typically, phosphorus (P) or arsenic (As) is used, however, in the present Embodiment, phosphorus (P) is used. In this case, using the electrically conductive layers in the second shape 212-214 as a mask for an impurity element which gives the N-type impurity, the first impurity regions 218a, 218b, 219a, 219b, 220a and 220b are formed in a self-aligned manner. Then, an impurity element which gives the N-type impurity is added to the first impurity regions 218a, 218b, 219a, 219b, 220a and 220b in the concentration range from $1\times10^{18}$ to $1\times10^{20}$ atoms/cm$^3$.

Subsequently, as shown in FIG. 3D, the resist masks 209, 210, 211 and 285 have been removed, the resist masks 221, 239 and 240 are newly formed. The second doping treatment (doping 2) is carried out by applying a higher acceleration voltage than that of the first doping treatment. As for the conditions of an ion doping method, the dosage is set in the range from $1\times10^{13}$ to $3\times10^{15}$ atoms/cm$^2$, the acceleration voltage is set in the range from 60 to 120 kV, and the doping is carried out. In the present Embodiment, the dosage is set at $3.0\times10^{15}$ atoms/cm$^2$, the acceleration voltage is set at 65 kV, and the doping is carried out. As for the second doping treatment, the second electrically conductive layer 213b is used as a mask for an impurity element, the doping is carried out so that an impurity element is added to the semiconductor layer below the tapered portion of the first electrically conductive layer 213a. Here, the resist mask 239 is formed so as to cover the semiconductor layer 202c which is to be a P-channel type TFT at the time when the second doping treatment is carried out. Noted that the resist mask 240 is not necessarily needed.

As a result of carrying out the above-described second doping treatment, an impurity element which gives the N-type impurity is added to the second impurity regions (Lov region) 225a, 225b overlapped with the first electrically conductive layer 213a in the concentration range from $1\times10^{18}$ to $5\times10^{19}$ atoms/cm$^3$. Moreover, an impurity element which gives the N-type impurity is added to the third impurity regions 222a, 222b, 224a and 224b in the concentration range from $1\times10^{19}$ to $5\times10^{21}$ atoms/cm$^3$. Moreover, although in the first impurity regions 218a, 218b formed by the foregoing first doping treatment, the regions 223a, 223b covered with the resist 221 by performing the second treatment exist, subsequently these are referred to as the first impurity regions.

It should be noted that in the present Embodiment, the second impurity regions 225a, 225b and the third impurity regions 222a, 222b, 224a and 224b are formed only by carrying out the second doping treatment, but not limited to this. These may be formed by carrying out a plurality of doping treatments by appropriately changing the conditions under which the doping is carried out.

Subsequently, as shown in FIG. 3E, after the resist masks 221, 239 and 240 have been removed, a resist 286 is newly formed in a film. As a method of forming the resist 286 in a film, a coating method can be employed. Noted that as a coating method, a spin coater or a roll coater might be used. As for the resist 286, either of the positive type and the negative type are capable of being used, and can be selected according to the light source used at the time of exposure. Noted that the resist 286 might be of the same material with that of the resist 205 used at the time of the first exposure, or might be different from it.

Subsequently, the resist 286 is exposed to light (second exposure), resist masks 230, 231 and 287 are formed (FIG. 3F). Noted that exposure means used in the second exposure might be the same with that of the first exposure, or might be different from that. In this way, the third etching treatment (gate metal etching 3) is carried out. Thus, electrically conductive layers 228, 229 in the third shape (first electrically conductive layers 228a, 229a, and second electrically conductive layers 228b, 229b) having an approximately vertical edge portions are formed. It should be noted that since the portions of the electrically conductive layers 212, 213 and 214 in the second shape (first electrically conductive layers 212a, 213a and 214a and second electrically conductive layers 212b, 213b and 214b) formed on the semiconductor layers 202a, 202b and 202c are covered with the resist mask 287, these are not etched.

Subsequently, the third doping treatment (doping 3) is carried out. In the third doping treatment, an impurity element which gives the N-type impurity is added. As for a doping method, it may be carried out by an ion doping method, or an ion implantation method. As for the conditions of an ion doping method, the dosage is set in the range from $1\times10^{13}$ to $5\times10^{14}$ atoms/cm$^2$, and the acceleration voltage is set in the range from 60 to 100 kV, and it is carried out. Although as an impurity element which gives the N-type impurity, an element belonging to 15 group, typically, phosphorus (P) or arsenic (As) is used, here, phosphorus (P) is used. In this case, fourth impurity regions 232a, 232b, 233a and 233b are formed by utilizing the resist masks 230, 231 and 287 as masks for the impurity element which gives the N-type impurity. An impurity element which gives the N-type impurity is added to the fourth impurity regions 232a, 232b, 233a and 233b in the concentration range from $1\times10^{20}$ to $1\times10^{21}$ atoms/cm$^3$. Noted that since the semiconductor layers 202a-202c are covered with the resist mask 287, an impurity element is not added by performing the third doping treatment.

Subsequently as shown in FIG. 3G, the fourth doping treatment (doping 4) is carried out. In the fourth doping treatment, an impurity element which gives the P-type impurity is added. As for a doping method, it may be carried out by an ion doping method, or an ion implantation method. In the peninsular semiconductor layers 202c and 202e for forming a P-channel type TFT, the fifth impurity regions 235a, 235b, 238a and 238b and the sixth impurity regions 236a, 236b into which P-type impurity element is added are formed. At this time, the impurity region is formed in a self-aligned manner by utilizing electrically conductive layer in the second shape 214b and the electrically conductive layer in the third shape 229 as masks for the impurity element. In the present Embodiment, an ion doping method using diboron hexahydrate (diborane) ($B_2H_6$) is employed. As for the conditions for an ion doping method, the dosage is set at $1\times10^{16}$ atoms/cm$^2$, the acceleration voltage is set at 80 kV, and it is carried out. Thus, a P-type impurity element can be added to regions 236a, 236b of semiconductor active layer overlapped with the electrically conductive layer In the second shape 214a via the electrically conductive layer in the second shape 214a. Here, the concentration of a P-type impurity element added to the sixth impurity regions 236a, 236b can be made smaller comparing to the concentration of the P-type impurity element added to the fifth impurity regions 235a, 235b. It should be noted that at the time of carrying out the fourth doping treatment, the peninsular semiconductor layers 202a, 202b and 202d for forming a N-channel type TFT has been previously and entirely covered with the resist masks 234 and 237. Noted that although phosphorus (P) is added to the fifth impurity regions 235a, 235b, 238a and 238b in different concentrations respectively by carrying out the first doping treatment, the second doping treatment and the third doping treatment, the fifth impurity regions 235a, 235b, 238a and 238b function as a source region and a drain region of P-type TFT without any problem by giving an element which gives the P-type impurity in a high concentration.

By means of the above-described steps, impurity regions are formed in the respective semiconductor layers 202a-202e. The electrically conductive layers in the second shape 212, 213 and 214 and the electrically conductive layers in the third shape 228, 229 overlapped with the peninsular semiconductor layer function as gate electrodes.

Thus, as shown in FIG. 3H, a N-channel type TFT 61, a N-channel type TFT 62, a P-channel type TFT 63, a N-channel type TFT 64 and a P-channel type TFT 65 are formed.

The N-channel type TFT 61 has a channel region 292, a high concentration impurity regions 222a, 222b corresponding to a source region and a drain region, and low concentration impurity regions (Loff regions) 223a, 223b which are not overlapped with the gate electrode. The N-channel type TFT 62 has a channel region 293, a high concentration impurity regions 224a, 224b corresponding to a source region and a drain region, and low concentration impurity regions (Lov regions) 225a, 225b which are overlapped with the gate electrode. On the other hand, the P-channel type TFT 63 has a channel region 294, a high concentration impurity regions 235a, 235b corresponding to a source region and a drain region, and low concentration impurity regions (Lov regions) 236a, 236b which are overlapped with the gate electrode. The gate electrodes of the N-channel type TFT 61, the N-channel type TFT 62 and the P-channel type TFT 63 have an edge portion in a tapered shape. Therefore, these are TFTs in a shape which are not appropriate in order to make the gate electrodes smaller. However, since the Lov regions and the Loff regions are capable of being fabricated in a self-aligned manner in the gate electrode fabrication steps, the number of the steps in the TFT fabrication can be suppressed. Thus, it is possible to form a TFT having a high withstanding voltage while the number of the steps is reduced.

Moreover, the N-channel type TFT 64 has a channel region 295 and high concentration regions 232a, 232b corresponding to a source region and a drain region. Moreover, the P-channel type TFT 65 has a channel region 296 and high concentration impurity regions 238a, 238b corresponding to a source region and a drain region. The N-channel type TFT 64 and the P-channel type TFT 65 are formed in a single drain structure. In the case where in the N-channel type TFT 64 and the P-channel type TFT 65, TFTs having the Lov regions and the Loff regions are intended to be set, there are problems that a new mask is needed and the number of the steps is increased. However, since the edge portions of the gate electrodes are etched in the vertical direction, the refining is capable of being carried out.

Noted that the description about exposure means in the fabrication of the respective gate electrodes of the N-channel type TFT 61, the N-channel type TFT 62, the P-channel type TFT 63, the N-channel type TFT 64 and the P-channel type TFT 65 is omitted because these are similar to Embodiment 1.

For example, a circuit in which the withstanding voltage is required can be fabricated with the N-channel type TFT 61, the N-channel type TFT 62 and the P-channel type TFT 63, and a circuit in which the refining is required can be fabricated with the N-channel type TFT 64 and the P-channel type TFT 65. At this time, the exposure means in the fabrication of a gate electrode of the respective TFTs can be made similar that of Embodiment 1.

Noted that in the present Embodiment, although the steps of fabricating a single gate type TFT have been shown, a double gate structure, and a multi-gate structure having the gate number of more than two might be available. Moreover, in the present Embodiment, a top gate type TFT has been shown, and its step of fabricating it has been shown. However, a method of fabricating a semiconductor device of the present invention is also capable of being applied to a dual gate type TFT.

Moreover, the degree of freedom for the shapes of an electrode of element except for TFT, wirings and the like which are formed using a gate metal is capable of being increased if a method of fabricating a semiconductor device of the present invention is applied.

Embodiment 3

In the present Embodiment, one example of a method of fabricating a semiconductor device of the present invention which is different from the examples of Embodiment 1 and Embodiment 2 will be described below with reference to FIG. 4. It should be noted that an example of the step of fabrication shown in Embodiment 3 of the present invention corresponds to the example shown in FIG. 1B concerning with the means for solving the problems. Noted that since the steps until achieving the step of the gate metal etching 2 are similar to the steps described with reference to FIG. 3 in Embodiment 2, the same portions are indicated using the same reference characters and numerals and the description is omitted.

According to the steps of Embodiment 2, it is fabricated up to the step of FIG. 4C. Subsequently, as shown in FIG. 4D, the resist is newly formed in a film and exposed to light (second exposure) and the resist masks 330, 331 and 388 are formed after the resist masks 209-211 and 285 have been removed. Noted that exposure means used in the second exposure might be identical with that of the first exposure, or might be different from that. In this way, the third etching treatment (gate metal etching 3) is carried out. Thus, electrically conductive layers 328, 329 in the third shape (first electrically conductive layers 328a, 329a, and second electrically conductive layers 328b, 329b) having an approximately vertical edge portions are formed. It should be noted that since the portions of the electrically conductive layers 212, 213 and 214 in the second shape (first electrically conductive layers 212a, 213a and 214a and second electrically conductive layers 212b, 213b and 214b) formed on the semiconductor layers 202a, 202b and 202c are covered with the resist mask 388, these are not etched.

Subsequently, as shown in FIG. 4E, the first doping treatment (doping 1) is carried out after the resist masks 330, 331 and 388 have been removed, an impurity element which gives the N-type impurity is added to the semiconductor layers 202a-202e in a low concentration. The first doping treatment may be carried out by an ion doping method or an ion implantation method. As for the conditions of an ion dope method, the dosage is set in the range from $1\times10^{13}$ to $5\times10^{14}$ atoms/cm$^2$, the acceleration voltage is set in the range from 40 to 80 kV, and the doping is carried out. In the present Embodiment, the dosage is set at $5.0\times10^{13}$ atoms/cm$^2$, the acceleration voltage is set at 50 kV, and the doping is carried out. As an impurity element which gives the N-type impurity, an element belonging to 15 group may be employed, typically, phosphorus (P) or arsenic (As) is used, however, in the present Embodiment, phosphorus (P) is used. In this case, using the electrically conductive layers 212-214 in the second shape and the electrically conductive layers 328, 329 in the third shape as a mask for an impurity element which gives the N-type impurity, the first impurity regions 318a, 318b, 319a, 319b, 320a, 320b, 1220a, 1220b, 1221a and 1221b are formed in a self-aligned manner. Then, an impurity element which gives the N-type impurity is added to the first impurity regions 318a, 318b, 319a, 319b, 320a, 320b, 1220a, 1220b, 1221a and 1221b in the concentration range from $1\times10^{18}$ to $1\times10^{20}$ atoms/cm$^3$.

Subsequently, as shown in FIG. 4F, resist masks 321, 327 and 333 are newly formed. The second doping treatment (doping 2) is carried out by applying a higher acceleration voltage than that of the first doping treatment. As for the conditions of an ion doping method, the dosage is set in the range from $1\times10^{13}$ to $3\times10^{15}$ atoms/cm$^2$, the acceleration voltage is set in the range from 60 to 120 kV, and the doping is carried out. In the present Embodiment, the dosage is set at $3.0\times10^{15}$ atoms/cm$^2$, the acceleration voltage is set at 65 kV, and the doping is carried out. As for the second doping treatment, the electrically conductive layer in the second shape 213b and electrically conductive layer in the third shape 328 are used as masks for an impurity element, the doping is carried out so that an impurity element is added to the semiconductor layer below the tapered portion of the first electrically conductive layer 213a. Noted that the resist masks 327, 333 are formed so as to cover the semiconductor layers 202c and 202e which are to be P-channel type TFTs at the time when the second doping treatment is carried out.

As a result of carrying out the above-described second doping treatment, an impurity element which gives the N-type impurity is added to the second impurity regions 325a, 325b overlapped with the first electrically conductive layer 213a in the concentration range from $1\times10^{18}$ to $5\times10^{19}$ atoms/cm$^3$.

Moreover, an impurity element which gives the N-type impurity is added to the third impurity regions 322a, 322b, 324a, 324b, 332a and 332b in the concentration range from $1\times10^{19}$ to $5\times10^{21}$ atoms/cm$^3$. Moreover, although in the first impurity regions 318a, 318b formed by the foregoing first doping treatment, the regions 323a, 323b covered with the resist 321 by performing the second treatment exist, subsequently these are referred to as the first impurity regions.

It should be noted that in the present Embodiment, the second impurity regions 325a, 325b and the third impurity regions 322a, 322b, 324a, 324b, 332a and 332b are formed only by carrying out the second doping treatment, but not limited to this. These may be formed by carrying out a plurality of doping treatments by means of appropriately changing the conditions under which the doping is carried out.

Subsequently, as shown in FIG. 4G, after the resist masks 321, 327, 333 have been removed, resist masks 334 and 337 are newly formed in a film. Subsequently, the third doping treatment (doping 3) is carried out. In the third doping treatment, an impurity element which gives the P-type impurity is added. As for a doping method, it may be carried out by an ion doping method, or an ion implantation method. In the peninsular semiconductor layers 202c and 202e for forming a P-channel type TFT, the fourth impurity regions 335a, 335b, 338a and 338b and the fifth impurity regions 336a, 336b into which P-type impurity element is added are formed. At this time, the impurity region is formed in a self-aligned manner by utilizing electrically conductive layer in the second shape 214b and electrically conductive layer in the third shape 329 as masks for the impurity element. In the present Embodiment, an ion doping method using diboron hexahydrate (diborane)(B$_2$H$_6$) is employed. As for the conditions for an ion doping method, the dosage is set at $1\times10^{16}$ atoms/cm$^2$, the acceleration voltage is set at 80 kV, and it is carried out. Thus, a P-type impurity element can be added to regions 336a, 336b of semiconductor active layer overlapped with the electrically conductive layer in the second shape 214a via the electrically conductive layer in the second shape 214a. Here, the concentration of a P-type impurity element added to the fifth impurity regions 336a, 336b can be made smaller comparing to the concentration of P-type impurity element added to the fourth impurity regions 335a, 335b. It should be noted that at the time of carrying out the third doping treatment, the peninsular semiconductor layers 202a, 202b and 202d for forming a N-channel type TFT have been previously and entirely covered with the resist masks 334 and 337. Noted that although phosphorus (P) is added to the fourth impurity regions 335a, 335b, 338a and 338b in different concentrations respectively by carrying out the first doping treatment, the second doping treatment and the third doping treatment, the fourth impurity regions 335a, 335b, 338a and 338b function as a source region and a drain region of P-channel type TFT without any problem by giving an element which gives the P-type impurity in a high concentration.

By means of the above-described steps, impurity regions are formed in the respective semiconductor layers 202a-202e. The electrically conductive layers in the second shape 212, 213 and 214 and the electrically conductive layers in the third shape 328, 329 overlapped with the peninsular semiconductor layer function as gate electrodes.

Thus, as shown in FIG. 4H, a N-channel type TFT 361, a N-channel type TFT 362, a P-channel type TFT 363, a N-channel type TFT 364 and a P-channel type TFT 365 are formed.

The N-channel type TFT 361 has a channel region 392, a high concentration impurity regions 322a, 322b corresponding to a source region and a drain region, and low concentration impurity regions (Loff regions) 323a, 323b which are not overlapped with the gate electrodes. The N-channel type TFT 362 has a channel region 393, a high concentration impurity regions 324a, 324b corresponding to a source region and a drain region, and low concentration impurity regions (Lov regions) 325a, 325b which are not overlapped with the gate electrodes. On the other hand, the P-channel type TFT 363 has a channel region 394, a high concentration impurity regions 335a, 335b corresponding to a source region and a drain region, and low concentration impurity regions (Lov regions) 336a, 336b which are overlapped with the gate electrodes. The gate electrodes of the N-channel type TFT 361, the N-channel type TFT 362 and the P-channel type TFT 363 have an edge portion in a tapered shape. Therefore, these are TFTs in a shape which are not appropriate in order to make the gate electrodes smaller. However, since the Lov regions and the Loff regions are capable of being fabricated in a self-aligned manner in the gate electrode fabrication steps, the number of the steps in the TFT fabrication can be suppressed. Thus, it is possible to form a TFT having a high withstanding voltage while the number of the steps is reduced.

Moreover, the N-channel type TFT 364 has a channel region 395 and high concentration impurity regions 332a, 332b corresponding to a source region and a drain region. The P-channel type TFT 365 has a channel region 396 and high concentration impurity regions 338a, 338b corresponding to a source region and a drain region. The N-channel type TFT 364 and the P-channel type TFT 365 are formed in a single drain structure. In the case where in the N-channel type TFT 364 and P-channel type TFT 365, the Lov regions and the Loff regions are fabricated, there are problems that a new mask is needed and the number of the steps is increased. However, since it is fabricated by utilizing a step in which the edge portions of the gate electrode may be etched in the vertical direction, the refining is capable of being carried out.

It should be note that in the present Embodiment 3, in the step shown in FIG. 4F, a Loff region is capable of being formed in the N-channel type TFT 364 without increasing the number of steps by forming a resist mask covering only the electrically conductive layer in the third shape 328 and the peripheral portion of the electrically conductive layer in the third shape 328 at the same time when the resist masks 321, 327 and 333 are formed.

Noted that the description about exposure means in the fabrication of the respective gate electrodes of the N-channel type TFT 361, the N-channel type TFT 362, the P-channel type TFT 363, the N-channel type TFT 364 and the P-channel type TFT 365 is omitted because these are similar to Embodiment 1.

For example, a circuit in which the withstanding voltage is required can be fabricated with the N-channel type TFT 361, the N-channel type TFT 362 and the P-channel type TFT 363, and a circuit in which the refining is required can be fabricated with the N-channel type TFT 364 and the P-channel type TFT 365. At this time, the exposure means in the fabrication of a gate electrode of the respective TFTs can be made similar to that of Embodiment 1.

Noted that in the present Embodiment, although the steps of fabricating a single gate type TFT have been shown, a double gate structure, and a multi-gate structure having the gate number of more than two might be available. Moreover, in the present Embodiment, a top gate type TFT has been shown, and its step of fabricating it has been shown. However, a method of fabricating a semiconductor device of the present invention is also capable of being applied to a dual gate type TFT.

Moreover, the degree of freedom for the shapes of an electrode of element except for TFT, wirings and the like, which are formed using a gate metal is capable of being increased if a method of fabricating a semiconductor device of the present invention is applied.

Embodiment 4

In the present Embodiment, one example of a method of fabricating a semiconductor device of the present invention which is different from the examples of Embodiment 1 through Embodiment 3 will be described below with reference to FIG. 25. It should be noted that an example of the step of fabrication shown in the present Embodiment 4 of the present invention corresponds to the example shown in FIG. 1B concerning with the means for solving the problems. Noted that since the steps up to the gate metal etching 3 are similar to the steps described with reference to FIG. 4 in Embodiment 3, the description is omitted.

According to the steps of Embodiment 3, it is fabricated up to the step of FIG. 25D. Subsequently, as shown in FIG. 25E, a resist mask 8000 is newly formed after the resist masks 330,331 and 388 have been removed. With the resist mask 8000, the semiconductor layer 202e which is to be the P-channel type TFT is covered. The first doping treatment (doping 1) is carried out, an impurity element whish gives the N-type impurity to the semiconductor layers 202a-202d is added in a low concentration. The first doping treatment may be carried out by an ion doping method or an ion implantation method. As an impurity element for giving the N-type impurity, an element belonging to 15 group may be employed, typically, phosphorus (P) or arsenic (As) is used, however, in the present Embodiment, phosphorus (P) is used. In this case, by utilizing the electrically conductive layers in second shape 212-214 and the electrically conductive layers in the third shape 328 as a mask for an impurity element which gives N-type, the first impurity regions 8318a, 8318b, 8319a, 8319b, 8320a, 8320b, 8220a and 8220b are formed. An impurity element which gives the N-type impurity is added to the first impurity regions 8318a, 8318b, 8319a, 8319b, 8320a, 8320b, 8220a and 8220b.

Subsequently, as shown in FIG. 25F, after the resist mask 8000 has been removed, resist masks 9101, 9102 are newly formed. The second doping treatment (doping 2) is carried out, and an impurity element which gives the P-type impurity is added to the semiconductor layer 202e in a low concentration. The second doping treatment may be carried out by an ion doping method or an ion implantation method. In the present Embodiment, an ion doping method using diborane (diboron hexahydrate; $B_2H_6$) is employed. In this way, the second impurity regions 8221a, 8221b are formed by utilizing the electrically conductive layer 329 in the third shape as a mask for an impurity element giving the P-type impurity. A P-type impurity element is added to the second impurity regions 8221a, 8221b.

Subsequently, as shown in FIG. 25G, after the resist masks 9101, 9102 have been removed, resist masks 9321, 9327, 9003 and 9333 are formed. Subsequently, the third doping treatment (doping 3) for adding an impurity element which gives the N-type impurity is carried out. The third doping treatment (doping 3) is carried out by applying a higher acceleration voltage than that of the first doping treatment. As for the third doping treatment, the electrically conductive layer in the second shape 213b is used as a mask for an impurity element, the doping is carried out so that an impurity element is added to the semiconductor layer below the tapered portion of the first electrically conductive layer 213a. Noted that the resist masks 9327,9333 have been previously formed so as to cover the semiconductor layers 202c and 202e which are to be P-channel type TFT before the third doping treatment is carried out. Moreover, the resist mask 9321 has been previously formed so as to cover portions of the first impurity regions 8318a, 8318b and the electrically conductive layer 212 in the second shape and the resist mask 9003 has been previously formed so as to cover the portions of the first impurity regions 8220a, 8220b and the electrically conductive layer 328 in the third shape at the time when the third doping treatment is carried out. A N-type impurity element is added to the first impurity regions 8318a, 8318b not covered with the resist mask 9321 and the first impurity regions 8220a, 8220b not covered with the resist mask 9003 by the third doping step. It should be noted that although in the first impurity regions 8318a, 8318b, 8220a and 8220b, regions 9323a, 9323b, 9004a and 9004b covered with the resists 9321, 9003 by performing the third treatment exist, subsequently these are referred to as the first impurity regions. Moreover, the conditions (acceleration voltage and the like) in the third doping treatment are set so that an impurity element which also gives the N-type impurity is added to the lower portion located below the electrically conductive layer 213a in the second shape not overlapped with the electrically conductive layer 213b in the second shape. The concentration of the impurity element added via the electrically conductive layer 213a in the second shape is capable of being lowered than the concentration of the impurity element added without passing through the medium of the electrically conductive layer 213a in the second shape. In this way, the third impurity regions 9322a, 9322b, 9324a, 9324b, 9332a and 9332b to which an impurity element for giving the N-type impurity in a high concentration is added and regions 9323a, 9323b, 9325a, 9325b, 9004a and 9004b to which an impurity element for giving the N-type impurity in a low concentration are formed.

Subsequently, as shown in FIG. 25H, after the resist masks 9321, 9327, 9003 and 9333 have been removed, resist masks 9334, 9337 and 9005 are formed. Subsequently, the fourth doping treatment (doping 4) for adding an impurity element which gives the N-type impurity is carried out. The fourth doping treatment (doping 4) is carried out by applying a higher acceleration voltage than that of the second doping treatment. As for the fourth doping treatment, the electrically conductive layer in the second shape 214b is used as a mask for an impurity element, the doping is carried out so that an impurity element is added to the semiconductor layer below the tapered portion of the first electrically conductive layer 214a. Noted that the resist masks 9334, 9337 have been previously formed so as to cover the semiconductor layers 202a, 202b and 202d which are to be the N-channel type TFTs and the resist mask 9005 has been previously formed so as to cover portions of the second impurity regions 8221a, 8221b and the electrically conductive layer 329 in the third shape at the time when the fourth doping treatment is carried out. A P-type impurity element is added to the second impurity regions 8221a, 8221b not covered with the resist mask 9005 by carrying out the fourth doping step. It should be noted that although in the second impurity regions 8221a, 8221b, regions 9006a, 9006b covered with the resist 9005 by performing the fourth treatment exist, subsequently these are referred to as the second impurity regions. Moreover, the conditions (acceleration voltage and the like) in the fourth doping treatment are set so that an impurity element which also gives the P-type impurity is added to the lower portion located below the electrically conductive layer 214a in the second shape not overlapped with the electrically conductive layer in the second shape 214b. The concentration of the impurity element added via the electrically conductive layer in the second shape 214a is capable of being lowered than the concentration of the impurity element added without being passed through the medium of the electrically conductive layer in the second shape 214a. In this way, the fourth impurity regions 9335a, 9335b, 9338a and 9338b to which an impurity element for giving the P-type impurity in a high concentration is added and regions 9336a, 9336b, 9006a and 9006b to which an impurity element for giving the P-type impurity in a low concentration are formed.

Noted that although phosphorus (P) is added to the fourth impurity regions 9335a, 9335b respectively by carrying out the first doping treatment, the fourth impurity regions 9335a, 9335b function as a source region and a drain region of the P-channel type TFT without any problem by giving an element which gives the P-type impurity in a high concentration.

By means of the above-described steps, impurity regions are formed in the respective semiconductor layers 202a-202e. The electrically conductive layers in the second shape 212, 213 and 214 and the electrically conductive layers in the third shape 328, 329 overlapped with the peninsular semiconductor layer function as gate electrodes.

Thus, as shown in FIG. 25I, a N-channel type TFT 9361, a N-channel type TFT 9362, a P-channel type TFT 9363, a N-channel type TFT 9364 and a P-channel type TFT 9365 are formed.

The N-channel type TFT 9361 has a channel region 9392, high concentration impurity regions 9322a, 9322b corresponding to a source region and a drain region, and low concentration impurity regions (Loff regions) 9323a, 9323b which are not overlapped with the gate electrodes. The N-channel type TFT 9362 has a channel region 9393, high concentration impurity regions 9324a, 9324b corresponding to a source region and a drain region, and low concentration impurity regions (Lov regions) 9325a, 9325b which are overlapped with the gate electrodes. On the other hand, the P-channel type TFT 9363 has a channel region 9394, high concentration impurity regions 9335a, 9335b corresponding to a source region and a drain region, and low concentration impurity regions (Lov regions) 9336a, 9336b which are overlapped with the gate electrodes. The gate electrodes of the N-channel type TFT 9361, the N-channel type TFT 9362 and the P-channel type TFT 9363 have an edge portion in a tapered shape. Therefore, these are TFTs in a shape which are not appropriate in order to make the gate electrodes smaller.

Moreover, the N-channel type TFT 9364 has a channel region 9395 and high concentration regions 9332a, 9332b corresponding to a source region and a drain region. Moreover, it has also low concentration impurity regions (Loff regions) 9004a, 9004b which are not overlapped with gate electrodes. The P-channel type TFT 9365 has a channel region 9396 and high concentration impurity regions 9338a, 9338b corresponding to a source region and a drain region. Moreover, it has also low concentration impurity regions (Loff regions) which are not overlapped with gate electrodes. In the present Embodiment, the steps in which the Loff regions are fabricated also in the N-channel type TFT 9364 and the P-channel type TFT 9365 are shown.

Noted that the description about exposure means in the fabrication of the respective gate electrodes of the N-channel type TFT 9361, the N-channel type TFT 9362, the P-channel type TFT 9363, the N-channel type TFT 9364 and the P-channel type TFT 9365 is omitted here because these are similar to those of Embodiment 1.

Noted that in the present Embodiment, although the steps of fabricating a single gate type TFT have been shown, a double gate structure, and a multi-gate structure having the gate number of more than two might be available. Moreover, in the present Embodiment, a top gate type TFT has been shown, and its step of fabricating it has been shown. However, a method of fabricating a semiconductor device of the present invention is also capable of being applied to a dual gate type TFT.

Moreover, the degree of freedom for the shapes of an electrode of element except for TFT, wirings and the like which are formed using a gate metal is capable of being increased if a method of fabricating a semiconductor device of the present invention is applied.

Embodiment 5

In the present Embodiment, one example of a method of fabricating a semiconductor device of the present invention which is different from the examples of Embodiment 1 through Embodiment 4 will be described below with reference to FIG. 26. It should be noted that an example of the step of fabrication shown in Embodiment 5 of the present invention corresponds to the example shown in FIG. 1B concerning with the means for solving the problems. Noted that since the steps up to the step of the gate metal etching 3 are similar to the steps described with reference to FIG. 25 in Embodiment 4, the description is omitted.

According to the steps of Embodiment 4, it is fabricated up to the step of FIG. 26D. Subsequently, as shown in FIG. 26E, a resist mask 8000 is newly formed after the resist masks 330, 331 and 388 have been removed. The semiconductor layer 202e which is to be the P-channel type TFT is covered with the resist mask 8000. The first doping treatment (doping 1) is carried out, an impurity element which gives the N-type impurity to the semiconductor layers 202a-202d is added in a low concentration. The first doping treatment may be carried out by an ion doping method or an ion implantation method. As an impurity element for giving the N-type impurity, an element belonging to 15 group may be employed, typically, phosphorus (P) or arsenic (As) is used, however, in the present Embodiment, phosphorus (P) is used. In this case, by utilizing the electrically conductive layers in second shape 212-214 and the electrically conductive layers in the third shape 328 as a mask for an impurity element which gives the N-type impurity, the first impurity regions 8318a, 8318b, 8319a, 8319b, 8320a, 8320b, 8220a and 8220b are formed.

Subsequently, as shown in FIG. 26F, after the resist mask 8000 is removed, the resist masks 8001, 8002 are newly formed. The semiconductor layer 202c which is to be the P-channel type TFT, the semiconductor layer 202d which is to be the N-channel type TFT and the semiconductor layer 202e which is to be the P-channel type TFT are covered with the resist mask 8002. Moreover, the portions of the first impurity regions 8318a, 8318b, and the regions 8323a, 8323b are covered by the resist mask 8001. The second doping treatment (doping 2) is carried out, an impurity element which gives the N-type impurity to the semiconductor layers 202a, 202b is added in a low concentration. The second doping treatment may be carried out by an ion doping method or an ion implantation method. As an impurity element for giving the N-type impurity, an element belonging to 15 group may be employed, typically, phosphorus (P) or arsenic (As) is used, however, in the present Embodiment, phosphorus (P) is used. In this case, by utilizing the electrically conductive layers in second shape 213b as a mask for an impurity element which gives the N-type impurity, the second impurity regions 8322a, 8322b, 8324a and 8324b are formed. It should be noted that the regions 8323a, 8323b covered with the resist mask 8001 by performing the second doping treatment exist, however, subsequently these are referred to as the first impurity regions. Moreover, the conditions (acceleration voltage and the like) in the second doping treatment are set so that an impurity element which also gives the N-type impurity is added to the lower portion located below the electrically conductive layer in the second shape 213a not overlapped with the electrically conductive layer in the second shape 213b. It should be noted that the concentration of the impurity element added via the electrically conductive layer 213a in the second shape is capable of being lowered than the concentration of the impurity element added without being passed through the medium of the electrically conductive layer 213a in the second shape. In this way, the second impurity regions 8322a, 8322b, 8324a and 8324b to which an impurity element for giving the N-type impurity in a high concentration is added and the first impurity regions 8323a, 8323b to which an impurity element for giving the N-type impurity is added in a low concentration, and the third impurity regions 8325a, 8325b are formed.

Subsequently, as shown in FIG. 26(G), after the resist masks 8001, 8002 are removed, the resist masks 8003, 8004 are newly formed. The semiconductor layer 202a which is to be the N-channel type TFT and the semiconductor layer 202b which is to be the N-channel type TFT are covered with the resist mask 8003 and the semiconductor layer 202d which is to be the N-channel type TFT is covered with the resist mask 8004. The third doping treatment (doping 3) is carried out, an impurity element which gives the P-type impurity to the semiconductor layers 202c, 202e is added. The second doping treatment may be carried out by an ion doping method or an ion implantation method. In the present Embodiment, an ion doping method using diborane (diboron hexahydrate; $B_2H_6$) is employed. In this way, the fourth impurity regions 8335a, 8335b, 8332a and 8332b into which an impurity element for giving the P-type impurity has been added are formed. It should be noted that although an impurity element which gives the N-type impurity is added to the fourth impurity regions 8335a, 8335b by carrying out the first doping treatment, these function without any problem as the P-type impurity regions by appropriately determining the addition amount of the impurity element which gives the P-type impurity in the third doping treatment. Noted that a resist mask as covering the semiconductor layer 202c has been provided in the first doping treatment, and it has been configured so that the N-type impurity element would not be added to the regions to be the fourth impurity regions 8335a, 8335b.

Subsequently, as shown in FIG. 26H, after the resist masks 8003,8004 have been removed, an insulating film

8005 is formed. For the insulating film 8005, it is desirable that a film excellent in drape is employed. For example, silicon oxide can be employed.

Subsequently, as shown in FIG. 26I, sidewalls 8006a, 8006b, 8007a, 8007b, 8008a, 8008b, 8009a, 8009b, 8010a and 8010b are formed by performing the anisotropic etching of the insulating film 8003.

Subsequently, as shown in FIG. 26J, the resist masks 8011, 8012 are formed. The whole surfaces of the semiconductor layers 202a-202c and 202e are covered with the resist masks 8011, 8012. Subsequently, the fourth doping treatment for adding an impurity element which gives the N-type impurity is carried out. The fourth doping treatment is carried out by utilizing the electrically conductive layer 328 in the third shape and the side walls 8009a, 8009b as masks for an impurity element. A N-type impurity element is added to the first impurity regions 8220a, 8220b which are not covered with the resist masks 8011, 8012 by carrying out the fourth doping treatment. It should be noted that although in the first impurity regions 8220a, 8220b, the regions 8014a, 8014b covered with the sidewalls 8009a, 8009b by performing the fourth doping treatment exist, subsequently these are referred to as the first impurity regions. In this way, the fifth impurity regions 8013a, 8013b to which an impurity element for giving the N-type impurity in a high concentration is added and the first impurity regions 8014a, 8014b to which an impurity element for giving the N-type impurity in a low concentration is added are formed.

By means of the above-described steps, impurity regions are formed in the semiconductor layers 202a-202e, respectively. The electrically conductive layers 212, 213, 214 in the second shape which are overlapped with the semiconductor layer in a peninsular shape and the electrically conductive layers 328, 329 in the third shape function as agate electrode, respectively.

Thus, as shown in FIG. 26k, the N-channel type TFT 8361, the N-channel type TFT 8362, the P-channel type TFT 8363, the N-channel type TFT 8364 and the P-channel type TFT 8365 are formed.

The N-channel type TFT 8361 has a channel region 8392, high concentration impurity regions 8322a, 8322b corresponding to a source region and a drain region, and low concentration impurity regions (Loff regions) 8323a, 8323b which are not overlapped with the gate electrodes. The N-channel type TFT 8362 has a channel region 8393, high concentration impurity regions 8324a, 8324b corresponding to a source region and a drain region, and low concentration impurity regions (Lov regions) 8325a, 8325b which are overlapped with the gate electrodes. On the other hand, the P-channel type TFT 8363 has a channel region 8394, high concentration impurity regions 8335a, 8335b corresponding to a source region and a drain region. The gate electrodes of the N-channel type TFT 8361, the N-channel type TFT 8362 and the P-channel type TFT 8363 have an edge portion in a tapered shape. Therefore, these are TFTs in a shape which are not appropriate in order to make the gate electrodes smaller.

Moreover, the N-channel type TFT 8364 has a channel region 8395 and high concentration regions 8013a, 8013b corresponding to a source region and a drain region. Moreover, it has also low concentration impurity regions (Loff regions) 8014a, 8014b which are not overlapped with gate electrodes. The P-channel type TFT 8365 has a channel region 8396 and high concentration impurity regions 8010a, 8010b corresponding to a source region and a drain region.

In the present Embodiment, the steps in which the Loff regions are also fabricated in the N-channel type TFT 8364 are shown.

Noted that the description about exposure means in the fabrication of the respective gate electrodes of the N-channel type TFT 8361, the N-channel type TFT 8362, the P-channel type TFT 8363, the N-channel type TFT 8364 and the P-channel type TFT 8365 is omitted here because these are similar to those of Embodiment 1.

Noted that in the present Embodiment, although the steps of fabricating a single gate type TFT have been shown, a double gate structure, and a multi-gate structure having the gate number of more than two might be available. Moreover, in the present Embodiment, a top gate type TFT has been shown, and its step of fabricating it has been shown. However, a method of fabricating a semiconductor device of the present invention is also capable of being applied to a dual gate type TFT.

Moreover, the degree of freedom for the shapes of an electrode of an element except for TFT, wirings and the like which are formed using a gate metal is capable of being increased if a method of fabricating a semiconductor device of the present invention is applied.

Embodiment 6

In the present Embodiment, an example of a wiring formed by a gate metal in a method of fabrication shown in Embodiment 1 through Embodiment 5 is shown. The description is made with reference to FIG. 10 and FIG. 24.

Taking notice of the step in which a gate metal is etched using a resist mask formed by carrying out the first exposure in a method of fabrication of Embodiment 1 through Embodiment 5 and the step in which a gate metal is etched using a resist mask formed by carrying out the second exposure, a procedure that the wirings formed in the respective steps is smoothly connected will be described below. The description is made with reference to FIG. 10.

Figure 10A:
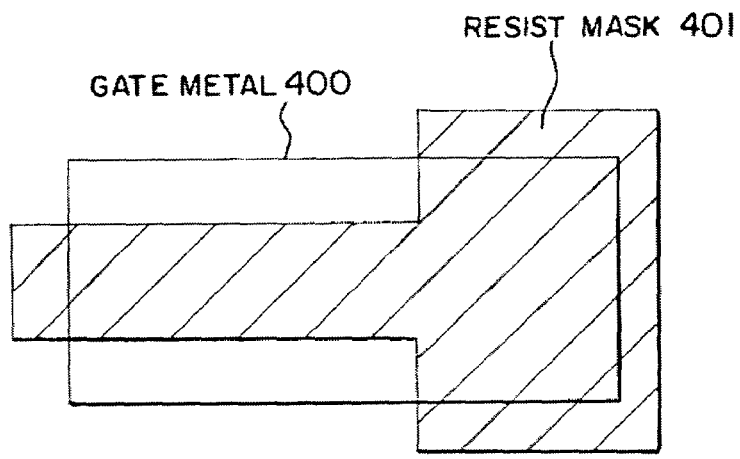
FIGS. 10A to 10D are diagrams showing a method of fabricating a semiconductor device of the present invention.
Figure 10B:
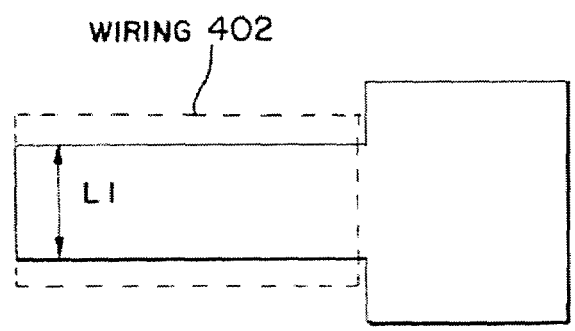

FIG. 10A is a top view showing a resist mask 401 formed on a gate metal 400 by carrying out the first exposure. FIG. 10B shows the state where the gate metal 400 was etched using the resist mask 401 of FIG. 10A. Noted that in FIG. 10B, the way in which the gate metal is etched along the edge portions of the resist mask 401 in the vertical direction is shown. However, in the case where a method of fabrication as shown in Embodiment 1 through embodiment 5 is used, the edge portion of the wiring is in a tapered shape. A wiring 402 having a L1 in width is formed by performing the etching treatment using the resist mask 401.

Figure 10C:
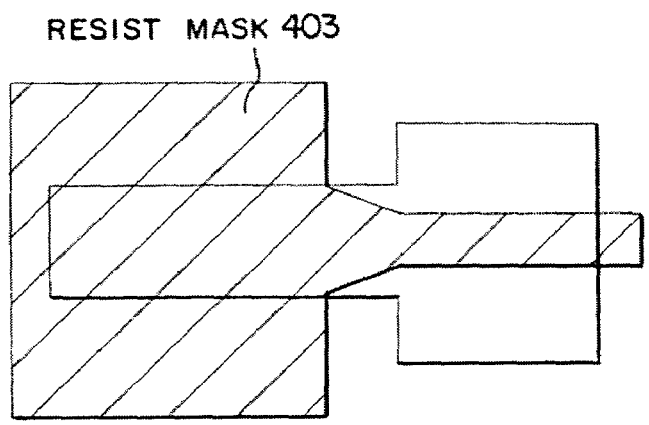
Figure 10D:
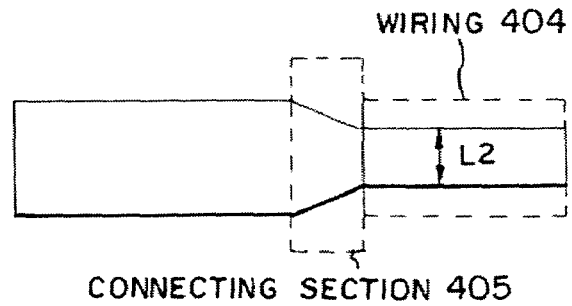
Figure 11A:
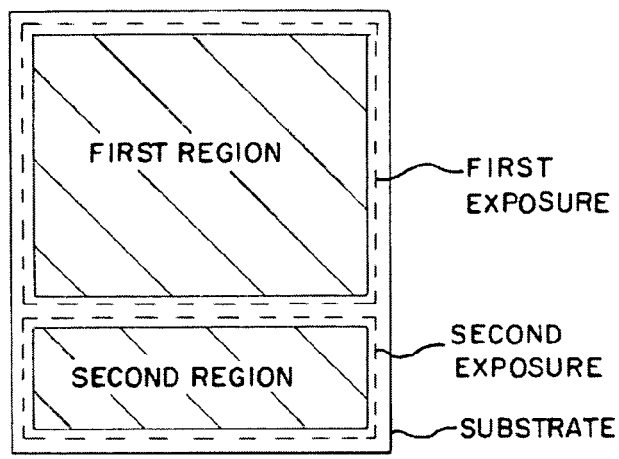
FIGS. 11A and 11B are diagrams showing a method of fabricating a semiconductor device of the present invention.
Figure 11B:
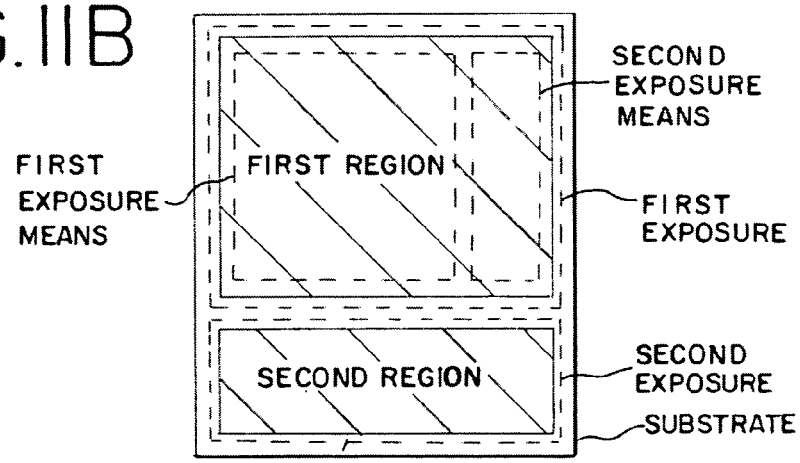

Subsequently, after the resist mask 401 has been removed, a resist mask 403 is formed by carrying out the second exposure. FIG. 10C is a top view showing the resist mask 403 formed by carrying out the second exposure. FIG. 10D shows the state where the gate metal 400 was etched using the resist mask 403 of FIG. 10C. A wiring 404 having a L2 in width is formed by performing the etching treatment using the resist mask 401.

Here, as shown in FIG. 10D, the wiring 402 and the wiring 404 can be smoothly connected in a connecting section 405 by setting the resolution of the second exposure patterning being higher than of the first exposure patterning. Specifically, a TFT in which a gate electrode is fabricated using a resist mask formed by carrying out the second exposure is made a TFT required to be refined comparing to a TFT in which a gate electrode is fabricated using a resist mask formed by carrying out the first exposure. In this way, as shown in FIG. 10D, the wiring 402 and the wiring 404 can be smoothly connected.

Next, a sectional view of a wiring formed by a gate metal in a method of fabrication shown in Embodiment 1 through Embodiment 5 is shown.

Figure 24A:
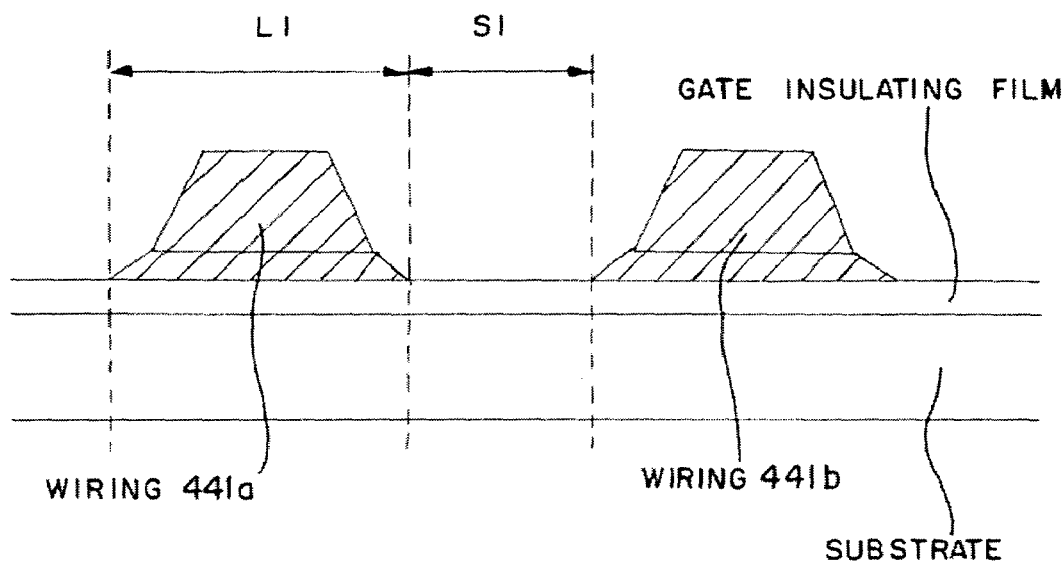
FIGS. 24A and 24B are diagrams showing a shape of a wiring formed by a method of fabricating a semiconductor device of the present invention.
Figure 24B:
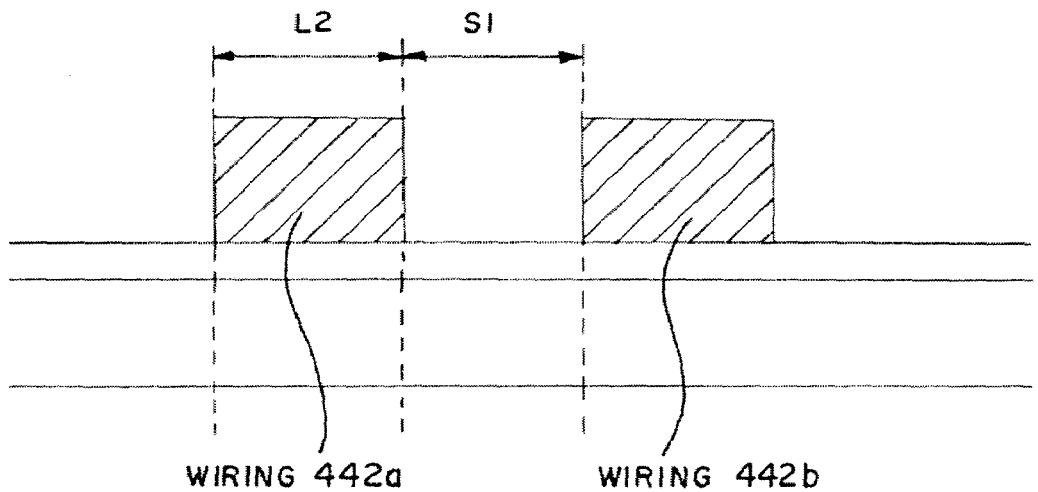

In FIG. 24A, a sectional view of a wiring fabricated by etching the gate metal using a resist mask formed by carrying out the first exposure. Moreover, in FIG. 24B, a sectional view of a wiring fabricated by etching the gate metal using a resist mask formed by carrying out the second exposure in a method of fabrication of Embodiment 1 through Embodiment 5. Wirings 441a, 441b shown in FIG. 24A are in a shape having an edge portion in a tapered shape of wiring width L1, respectively. The wirings 441a, 441b are disposed at the wiring interval of S1. Moreover, Wirings 442a, 442b shown in FIG. 24B are in a shape having an approximately vertical edge portion of the wiring width L2. These are disposed at the wiring interval of S1. It should be noted that it is supposed that for the purpose of comparison, the sectional area of the wirings 442a, 442b is equal to the sectional area of the wiring 441a, 441b.

The ratio L2/S1 of wiring width L2 and wiring interval S1 of the wirings 442a, 442b can be made smaller than the ratio L1/S1 of wiring width L1 and wiring interval S1 of the wirings 441a, 441b. Specifically, the wiring 442a, 442b are in a shape suitable for integration.

Thus, a shape of a wiring formed by utilizing a gate metal in a semiconductor device can be appropriately selected. The present Embodiment is capable of being carried out by freely combing Embodiment 1 through Embodiment 5.

EXAMPLES

Example 1

In the present Example, an example in which a semiconductor device having an arithmetic processing circuit (main portion of CPU), a memory circuit or the like formed on the same substrate as a display device using a method of fabricating a semiconductor device of the present invention is shown.

In FIG. 5, a top view of a semiconductor device fabricated using a method of fabricating a semiconductor device of the present invention is shown. In FIG. 5, a semiconductor device has a display device 551 and a CPU section 552 which have been configured using a TFT formed on a substrate 500 having an insulation surface. The display device 551 has a pixel section 501, a scanning line drive circuit 502 and a signal line drive circuit 503. Moreover, the CPU section 552 has a CPU 507 and a SRAM (memory circuit) 504. In the display device 551, the pixel section 501 performs the displaying of an image. Moreover, an input of picture signal into each pixel of the pixel section is controlled by the scanning line drive circuit 502 and the signal line drive circuit 503. The SRAM (memory circuit) 504 is configured with a memory cell (not shown) disposed in a plurality of matrices. Each memory cell has functions such as a function for memorizing a signal which is inputted and outputted in the CPU 507. Moreover, the CPU 507 has functions such as a function for outputting a control signal into the scanning line drive circuit 502 and the signal line drive circuit 503.

Figure 27:
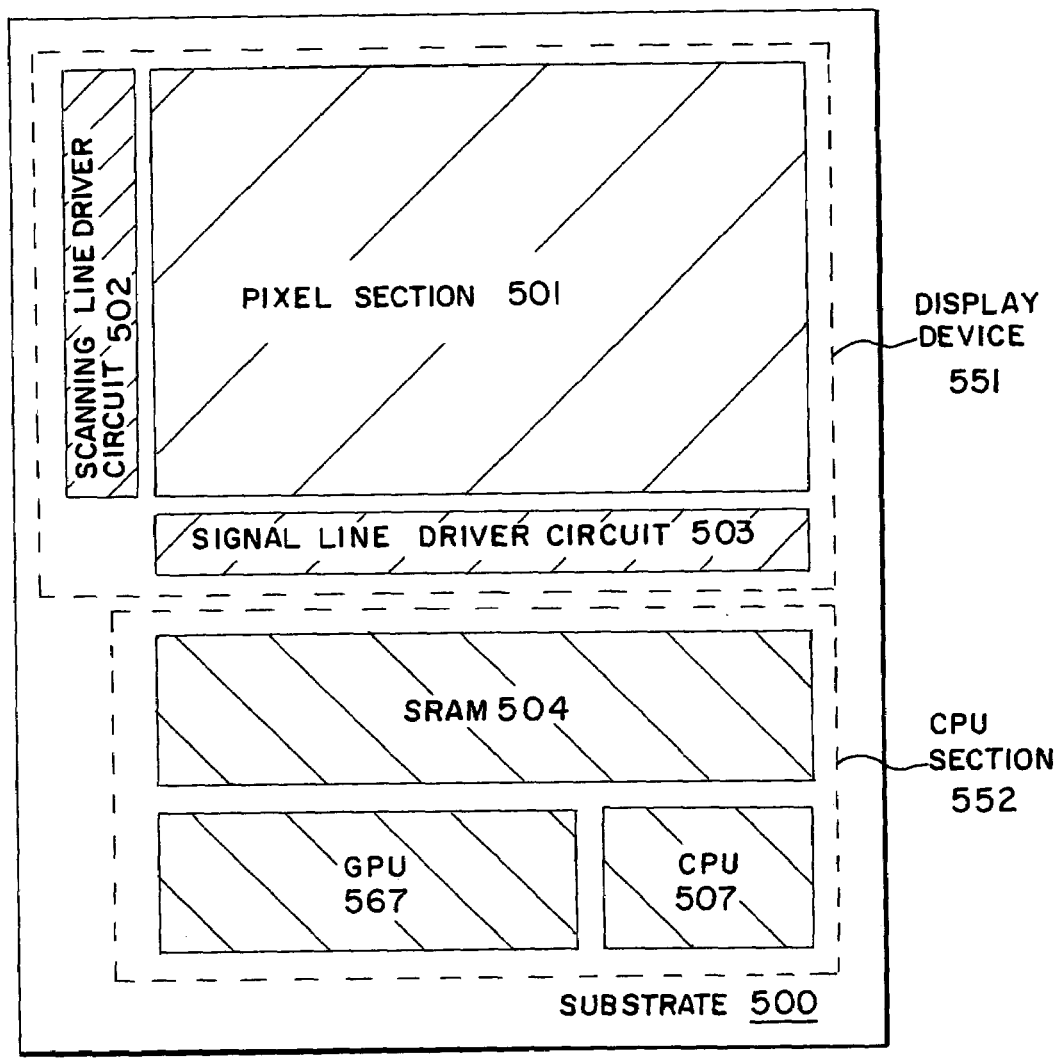
FIG. 27 is a top view of a semiconductor device of the present invention.

It should be noted that the CPU section 552 might have the GPU (picture signal processing circuit) 557. This configuration is shown in FIG. 27. Noted that the same portions with those of FIG. 5 are indicated using the same characters and numerals and the description is omitted. A signal inputted from the external of the substrate 500 is converted into a signal for inputting into the display device 551.

In FIG. 5 and FIG. 27, an example of the case where a liquid crystal display device is used as the display device 551 is shown. The configuration shown in FIG. 12 can be used for the purpose of solving the problem by the invention as for the pixel section 501 of the liquid crystal display device 551.

Figure 12:
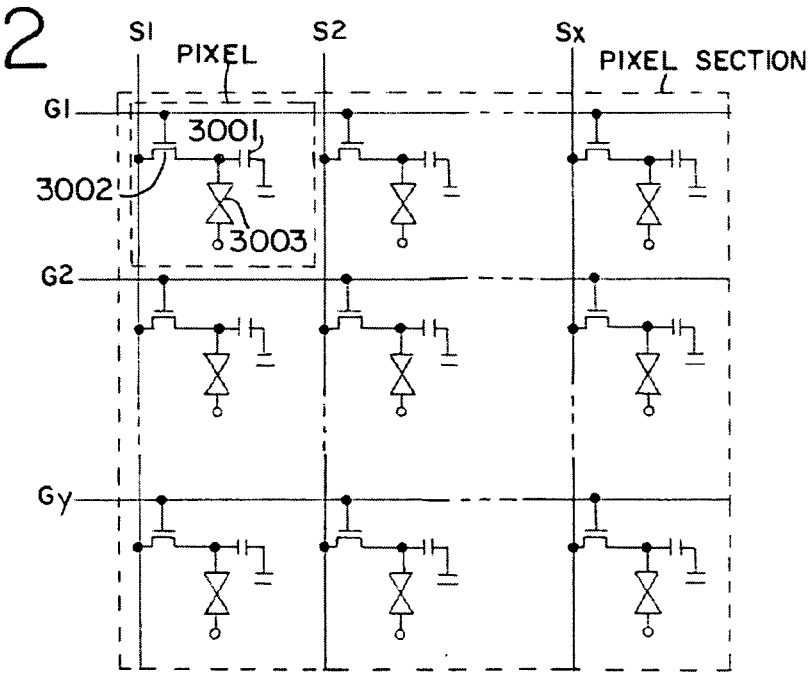
FIG. 12 is a circuit diagram showing a structure of a pixel section of a liquid crystal display device.

A TFT 3002 for constituting a pixel in FIG. 12 is required that the off-state current is slight. This is because it prevents the image from being disturbed by the fact that the voltage applied between the electrodes of the liquid crystal element 3003 disposed at each pixel is changed and the transmittance is changed due to the leakage current. Moreover, in a transmission type liquid crystal display device that visually recognizes an image via the pixel TFT 3002, in order to raise up the aperture opening ratio, it is required to refine the pixel TFT 3002. Furthermore, usually, a voltage of about 16 V is applied between the electrodes of the liquid crystal element 3003. Therefore, the withstanding voltage of about 16V is required for the pixel TFT 3002 or the like. Hence, it is necessary to make a TFT of structure having a Lov region and a Loff region.

On the other hand, a TFT consisting a pixel drive circuit section (scanning line drive circuit 502 and signal line drive circuit 503) (TFT for pixel drive circuit) in FIG. 5 and FIG. 27 is not required that the off-state current is reduced and the refining is performed to the extent that the pixel TFT is required. However, the withstanding voltage for operating by the electric source voltage of about 16V is required.

In the arithmetic processing circuit (CPU section) 552, a high drive frequency is required. Therefore, the enhancement of carrier mobility and the refining are required for a TFT constituting the CPU section 552 (hereinafter, referred to as TFT for arithmetic processing circuit). On the other hand, since the arithmetic processing circuit (CPU section) 552 fabricated by a refined TFT operates by the electric source voltage of about 3-5 V, the withstanding voltage of the TFT is not required to the extent that a pixel TFT and a TFT for pixel drive circuit.

Hence, a method of fabrication shown in FIG. 4 is used in Embodiment 3 for the purpose of differently making TFTs configuring the circuit shown in FIG. 5 and FIG. 27. The N-channel type TFT 361 shown in FIG. 4 is used as a pixel TFT. The structure of the N-channel type TFT 361 is a structure having a Loff region whose effect of suppressing the off-state current is high. Moreover, the N-channel type TFT 362 and the P-channel type TFT 363 shown in FIG. 4 is used as a TFT for pixel drive circuit. Moreover, the N-channel type TFT 362 and the P-channel type TFT 363 are configured with a structure having a withstanding voltage and having a Lov region whose effect of suppressing the deterioration due to a hot carrier is high, respectively. Moreover, the N-channel type TFT 364 and the P-channel type TFT 365 shown in FIG. 4 is used as a TFT for arithmetic processing circuit. The N-channel type TFT 364 and the P-channel type TFT 365 are in a shape capable of being refined. Specifically, the portion of the liquid crystal display device 551 which operates by the electric source voltage of about 16V is fabricated by the steps of a gate electrode fabrication subsequent to the first exposure in FIG. 4, and the CPU section 552 which operates by the electric source voltage of about 3-5 V is fabricated by the step of a gate electrode fabrication subsequent to the second exposure in FIG. 4.

Thus, a semiconductor device having an arithmetic processing circuit (CPU section), a memory circuit and the like formed on the same substrate as the display device being formed using a TFT suitable for each circuit can be fabricated.

It should be noted that the present invention is capable of being carried out by freely combining Embodiment 1 through Embodiment 6.

Example 2

In the present Example, an example in which a semiconductor device having a CPU section (arithmetic processing circuit (main portion of CPU), memory circuit and the like) formed on the same substrate as a display device being formed using a method of fabricating a semiconductor device of the present invention is shown. It should be noted that the configurations of the display device and the CPU section and the TFT used in these circuits could be made the same ones as those of Example 1.

In FIG. 6, a sectional view of a semiconductor device fabricated using the present invention is shown. As a pixel TFT constituting a pixel section, the N-channel type TFT 361 is representatively shown. Moreover, as an element constituting a pixel drive circuit section, the N-channel type TFT 362 and the P-channel type TFT 363 is representatively shown. As an element constituting the CPU section, the N-channel type TFT 364 and the P-channel type TFT 365 are representatively shown. Since a method of fabricating the N-channel type TFT 361, the N-channel type TFT 362, the P-channel type TFT 363, the N-channel type 364 and the P-channel type TFT 365 is similar to the method of fabrication shown in FIG. 4 in Embodiment 3, here, the description is omitted. Noted that the same portions with those of FIG. 4 are described with the same reference characters and numerals.

Figure 6A:
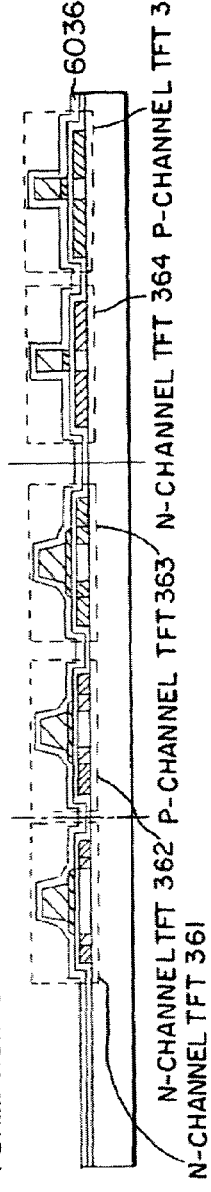
FIGS. 6A to 6C are diagrams showing a method of fabricating a semiconductor device having a liquid crystal display device of the present invention.

As shown in FIG. 6A, a first interlayer insulating film 6036 is formed. The first interlayer insulating film 6036 is formed in a film thickness of 100-200 nm with an insulating film containing silicon using a plasma CVD method or a sputtering method. In the present Example, a silicon oxide/nitride film is formed in a film thickness of 100 nm by a plasma CVD method. Needless to say, the first interlayer insulating film 6036 is not limited to the silicon oxide/nitride film, but an insulating film containing other silicons may be used as a mono-layer structure or a laminate structure.

Subsequently, the recovery of crystallinity of the semiconductor layer and the activation of an impurity element added to the semiconductor layer is performed by carrying out the heating treatment (heat treatment). This heating treatment is performed by a thermal annealing method using a furnace-annealing furnace. The thermal annealing method may be performed at the temperature in the range from 400 to 700° C., under the nitrogen atmosphere containing oxygen of 1 ppm or less preferably, 0.1 ppm or less in an oxygen concentration, and in the present Example, the activation treatment is performed at 410° C. for one hour by a thermal treatment. Noted that except for the thermal annealing method, a laser annealing method, or a rapid thermal annealing method (RTA method) are capable of being applied. Moreover, the heating treatment may be performed before the first interlayer insulating film 6036 is formed. However, in the case where gate electrodes of the N-channel type TFT 361, the N-channel type TFT 362, the P-channel type TFT 363, the N-channel type TFT 364 and the P-channel type 365 are vulnerable to the heat, it is preferable that in order to protect the wirings or the like as in the present Example, after the first interlayer insulating film 6036 (insulating film mainly consisted of silicon, for example, silicon nitride film) has been formed, the heat treatment is performed.

As described above, the hydrogenation of the semiconductor layer can be also performed at the same time when the activation treatment is done by performing the heat treatment after the first interlayer insulating film 6036 (insulating film mainly consisted of silicon, for example, silicon nitride film) has been formed. In the step of hydrogenation, dangling bond of the semiconductor layer is terminated by hydrogen contained in the first interlayer insulating film 6036. It should be noted that the heating treatment might be carried out for hydrogenation separately from the heating treatment for activation treatment. Here, regardless of the existence of the first interlayer insulating film 6036, the semiconductor layer can be also hydrogenated. As the other means for hydrogenation, means for utilizing hydrogen excited by plasma (plasma hydrogenation) and means for performing the heating treatment at a temperature in the range from 300 to 450° C. for 1-12 hours in the atmosphere containing hydrogen of 3-100% may be also used.

Figure 6B:
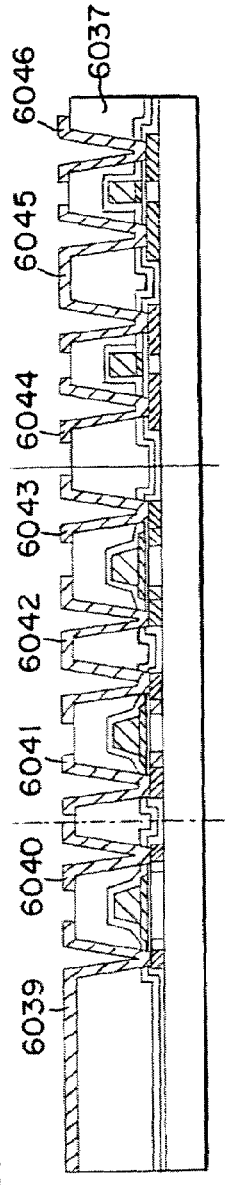

Subsequently, as shown in FIG. 6B, on the first interlayer insulating film 6036, the second interlayer insulating film 6037 is formed. As the second interlayer insulating film 6037, an inorganic insulating film can be used. For example, a silicon oxide film formed by a CVD method and a silicon oxide film coated by a SOG (Spin On Glass) method or the like can be used. Moreover, as the second interlayer insulating film 6037, an organic insulating film can be used. For example, a film such as polyimide, polyamide, BCB (benzocyclobutene), acryl or the like can be used. Moreover, a laminated structure of an acrylic film and a silicon oxide film may be used. Moreover, a laminated structure of an acrylic film and a silicon nitride film or a silicon nitride/oxide film formed by a sputtering method may be used. In the present Example, an acrylic film having a film thickness of 1.6 μm is formed. The convexes and concaves due to TFTs (N-channel type TFT 361, N-channel type TFT 362, P-channel type TFT 363, N-channel type TFT 364 and P-channel type TFT 365) can be relaxed and flattened by forming the second interlayer insulating film 6037. Particularly, since the second interlayer insulating film 6037 is strongly meant to use for the purpose of flattening, it is preferable that it is excellent in evenness.

Subsequently, a contact hole reaching each source region and drain region of the N-channel type TFT 361, the N-channel type TFT 362, the P-channel type TFT 363, the N-channel type TFT 364 and the P-channel type TFT 365 is formed by etching the second interlayer insulating film 6037, the first interlayer insulating film 6036 and the gate insulating film 203 using a dry etching or a wet etching. Subsequently, wirings 6040-6046 and pixel electrode 6039 electrically connected to a source region and a drain region of each TFT, respectively are formed. Noted that in the present Example, the wirings 6040-6046 and the pixel electrode 6039 are formed by continuously forming a laminated film of a titanium (Ti) film having a film thickness of 50 nm and an alloy film having a film thickness of 500 nm made of aluminum (Al) and titanium (Ti) and forming it into a desired shape by performing a pattering. Needless to say, not limiting to a two-layer structure, a mono-layer structure may be employed or a laminated structure having three layers or more may be also employed. As a material for a wiring, not limiting to aluminum (Al) and titanium (Ti), the other electrically conductive films may be employed. For example, an aluminum (Al) film or a copper (Cu) film is formed on tantalum nitride (TaN) film, and further, a wiring may be formed by performing the patterning of a laminated film on which a titanium (Ti) film is formed. However, it is preferable that a material excellent in reflecting property is used.

Figure 6C:
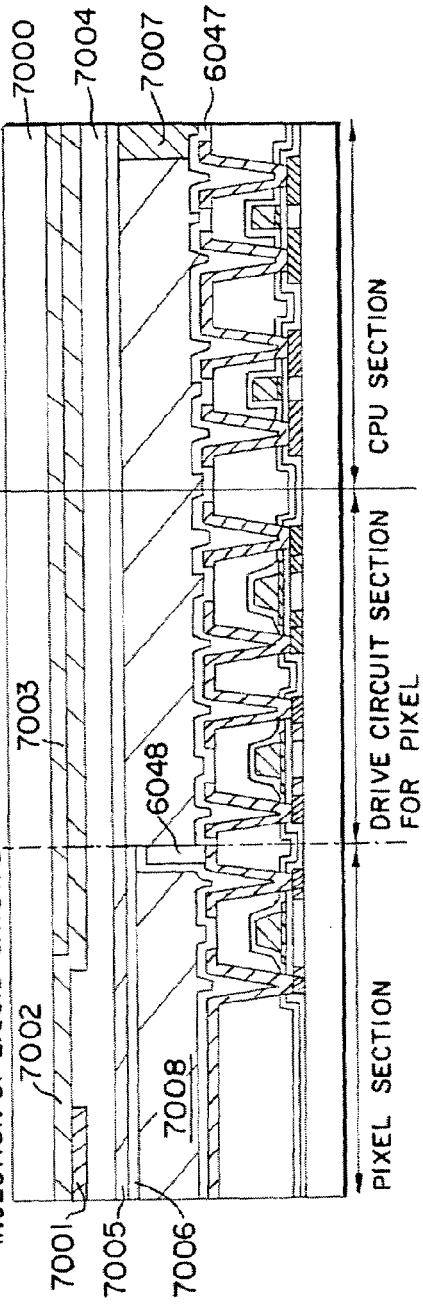
Figure 9A:
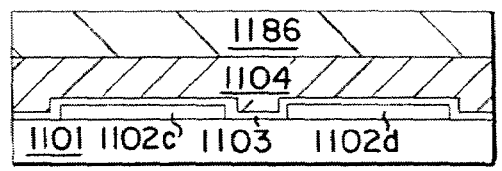
FIGS. 9A to 9D are diagrams showing a conventional method of fabricating a semiconductor device.
Figure 9B:
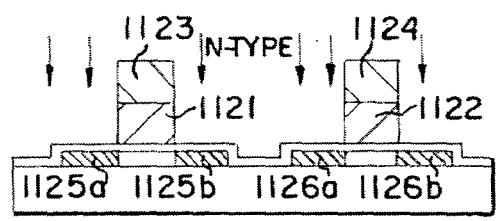
Figure 9C:
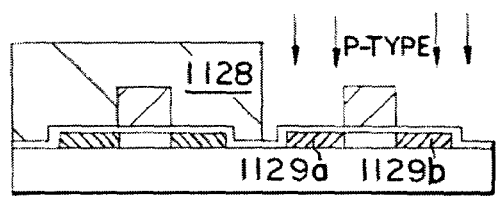
Figure 9D:
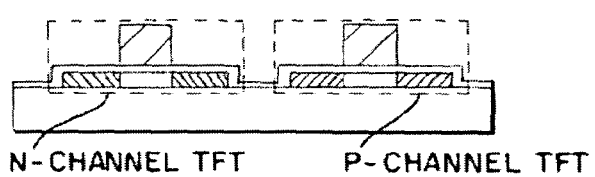

Subsequently, as shown in FIG. 6C, an orientated film 6047 is formed on the portion containing at least the pixel electrode 6039 and a rubbing treatment is carried out. It should be noted that in the present Example, a spacer 6048 in a column shape for maintaining the substrate interval if formed at a desired position by performing the patterning of an organic resin film such as an acrylic resin film or the like before the oriented film 6047 is formed. Moreover, not limiting to a spacer in a column shape, a spherical spacer may be dispersed on the whole surface of the substrate.

Subsequently, a counter substrate 7000 is prepared. Colored layers (color filter) 7001-7003 and a flattened film 7004 are formed on the counter substrate 7000. At this time, a light shield section is formed by superimposing the first colored layer 7001 and the second colored layer 7002, and a light shield section is formed by superimposing the portions of the second colored layer 7002 and the third colored layer 7003. Moreover, a light shield section may be formed by superimposing the portions of the first colored layer 7001 and the third colored layer 7003. In this way, the number of steps is capable of being reduced by shielding the light with the light shield section consisted of a laminated layer made of colored layers between the gaps of the respective pixels without newly forming a light shield layer.

Subsequently, a counter electrode 7005 consisted of a transparent is formed on the flattened film 7004, at least on the portions corresponding to the pixel sections. Subsequently, an oriented film 7006 is formed on the whole surface of the counter substrate 7005, and a rubbing treatment is provided.

Then, the substrate 201 on which the pixel section, the drive circuit section and the CPU section are formed and the counter substrate 7000 are pasted each other with a sealing material 7007. A filler (not shown) has been mixed into the sealing material 7007, and the substrate 201 and the counter substrate 7000 are pasted each other at a uniform interval with a filler and the spacer 6048 in a column shape. Subsequently, a liquid crystal material 7008 is injected between both substrates (201 and 7000), it is completely sealed with a sealing medium (not shown). As for the liquid crystal material 7008, a known material may be employed. In this way, a liquid crystal device is completed.

Then, a polarizing plate and FPC (flexible print circuit) (not shown) are pasted. A terminal routed from an element or circuit formed on the substrate 201 and an external signal terminal are connected. In this way, it is completed as a product.

It should be noted that in the present Example, a reflecting type liquid crystal display device in which the pixel electrode 6039 is formed with a metal film excellent in reflecting property and a counter electrode 7005 is formed with a material having a translucency is exemplified, but it is not limited to this. For example, the present invention can be applied to a transmission type liquid crystal display device in which the pixel electrode 6039 is formed with a material having the translucency and the counter electrode 7005 is formed with a material having the reflecting property. Moreover, the present invention is also capable of being applied to a semi-transmission type liquid crystal display device.

The present Example is capable of being carried out by freely combining it with Embodiment 1 through Embodiment 6 and Example 1.

Example 3

In the present Example, an example in which a semiconductor device having a CPU section (arithmetic processing circuit (main portion of CPU), memory circuit and the like) formed on the same substrate as a display device being formed, using a method of fabricating a semiconductor device of the present invention is shown. It should be noted that TFTs used for configurations of the display device and the CPU section and their circuits could be made similar to those of Example 1.

However, in the present Example, the display device is defined as an OLED display device in which an OLED element is disposed at each pixel. An OLED element has a configuration having an anode, a cathode and an organic compound layer sandwiched between the anode and the cathode. The OLED element emits the light by applying a voltage between the anode and the cathode. The organic compound layer can be made in a laminated structure. Representatively, a laminated structure of hole transportation layer/light emitting layer/electron transportation layer proposed by Tang et al. of Kodak Eastman Company is listed. Moreover, except for that, a structure in which hole injection layer/hole transportation layer/light emission layer/electron transportation layer are in turn laminated on the anode, or hole injection layer/hole transportation layer/light emission layer/electron transportation layer/electron injection layer are in turn laminated on the anode may be employed. A fluorescent pigment or the like may be doped into the light emission layer. All of the layers provided between the cathode and the anode of an OLED element is generally referred to as an organic compound layer. Hence, the hole injection layer, hole transportation layer, light emission layer, electron transportation layer, electron injection layer and the like are all included in the organic compound layer. When the predetermined voltage is applied from a pair of electrodes (anode and cathode) to the organic compound layer consisted of the above-described structure, the light is emitted by recombination of carriers being occurred in the light emission layer. Noted that an OLED element might be of either an element utilizing light emission (fluorescence) from singlet exciton or an element utilizing light emission (phosphorescence) from triplet exciton. Since an OLED display device has advantages such that it is excellent in responsibility, operates at a low voltage, has a wide angular field of view and so forth, attention is being given to this as a flat panel display of the next generation.

In FIG. 7, a sectional view of a semiconductor device prepared by utilizing the present invention is shown. As for a TFT constituting a pixel section, a TFT connected in series to an OLED element is representatively shown as the N-channel type TFT 361. Moreover, as an element consisting a pixel drive circuit section, the N-channel type TFT 362 and the P-channel type TFT 363 are representatively shown. As an element constituting the CPU section, the N-channel type TFT 364 and the P-channel type TFT 365 are representatively shown. Since a method of fabricating the N-channel type TFT 361, the N-channel type TFT 362, the P-channel type TFT 363, the N-channel type TFT 364 and the P-channel type TFT 365 is similar to a method of fabrication shown in FIG. 4 in Embodiment 3, here, the description is omitted. Noted that the same portions with those of FIG. 4 would be described with the same reference characters and numerals.

According to Embodiment 3, the semiconductor device is fabricated up to the state of FIG. 7A. In FIG. 7B, a first interlayer insulating film 5036 is formed. This first interlayer insulating film 5036 is formed in a film thickness of 100-200 nm with an insulating film containing silicon by a plasma CVD method or a sputtering method. In the present Example, a silicon oxide/nitride film having a film thickness of 10 nm by a plasma CVD method. Needless to say, the first interlayer insulating film 5036 is not limited to a silicon oxide/nitride film, an insulating film containing the other silicons may be used as a mono-layer structure or a laminated structure. Subsequently, the recovery of crystallinity of the semiconductor layer and the activation of an impurity element added to the semiconductor layer are performed by carrying out the heating treatment (heat treatment). This heating treatment is performed by a thermal annealing method using a furnace-annealing furnace. The thermal annealing method may be performed at the temperature in the range from 400 to 700° C., under the nitrogen atmosphere containing oxygen of 1 ppm or less, and preferably, 0.1 ppm or less in an oxygen concentration, and in the present Example, the activation treatment is performed at 410° C. for one hour by a thermal treatment. Noted that except for the thermal annealing method, a laser annealing method, or a rapid thermal annealing method (RTA method) are capable of being applied. Moreover, the heating treatment may be performed before the first interlayer insulating film 5036 is formed. However, in the case where gate electrodes of the N-channel type TFT 361, the N-channel type TFT 362, the P-channel type TFT 363, the N-channel type TFT 364 and the P-channel type 365 are vulnerable to the heat, it is preferable that in order to protect the wirings or the like as in the present Example, after the first interlayer insulating film 5036 (insulating film mainly consisted of silicon, for example, silicon nitride film) has been formed, the heat treatment is performed.

As described above, the hydrogenation of the semiconductor layer can be also performed at the same time when the activation treatment is done by performing the heat treatment after the first interlayer insulating film 5036 (insulating film mainly consisted of silicon, for example, silicon nitride film) has been formed. In the step of hydrogenation, the dangling bond of the semiconductor layer is terminated by hydrogen contained in the first interlayer insulating film 5036. It should be noted that the heating treatment might be carried out for hydrogenation separately from the heating treatment for activation treatment. Here, regardless of the existence of the first interlayer insulating film 5036, the semiconductor layer can be also hydrogenated. As the other means for hydrogenation, means for utilizing hydrogen excited by plasma (plasma hydrogenation) and means for performing the heating treatment at a temperature in the range from 300 to 450° C. for 1-12 hours in the atmosphere containing hydrogen of 3-100% may be also used.

Subsequently, on the first interlayer insulating film 5036, the second interlayer insulating film 5037 is formed. As the second interlayer insulating film 5037, an inorganic insulating film can be used. For example, a silicon oxide film formed by a CVD method and a silicon oxide film coated by a SOG (Spin On Glass) method or the like can be used. Moreover, as the second interlayer insulating film 5037, an organic insulating film can be used. For example, a film such as polyimide, polyamide, BCB (benzocyclobutene), acryl or the like can be used. Moreover, a laminated structure of an acrylic film and a silicon oxide film may be used. Moreover, a laminated structure of an acrylic film and a silicon nitride film or a silicon nitride oxide film formed by a sputtering method may be used. In the present Example, an acrylic film having a film thickness of 1.6 μm is formed. The convexes and concaves caused by TFTs formed on the substrate 201 can be relaxed and flattened by forming the second interlayer insulating film 5037. Particularly, since the second interlayer insulating film 5037 is strongly meant to use for the purpose of flattening, it is preferable that it is excellent in evenness.

Subsequently, a contact hole reaching each source region and drain region of the N-channel type TFT 361, the N-channel type TFT 362, the P-channel type TFT 363, the N-channel type TFT 364 and the P-channel type TFT 365 is formed by etching the second interlayer insulating film 5037, the first interlayer insulating film 5036 and the gate insulating film 203 using a dry etching or a wet etching.

Subsequently, a pixel electrode 5038 consisted of a transparent, electrically conductive film is formed. For a transparent, electrically conductive film, a compound of indium oxide and tin oxide (ITO), a compound of indium oxide and zinc oxide, zinc oxide, tin oxide, indium oxide or the like can be used. Moreover, the matter that gallium is added to the foregoing transparent, electrically conductive film may be used. The pixel electrode 5038 corresponds to an anode of an OLED element. In the present Example, ITO is formed in a film thickness of 110 nm, the patterning is carried out and the pixel electrode 5038 is formed.

Subsequently, wirings 5039-5046 electrically connected to each source region and drain region of each TFT (the N-channel type TFT 361, the N-channel type TFT 362, the P-channel type TFT 363, the N-channel type TFT 364 and the P-channel type TFT 365) are formed. Noted that in the present Example, the wirings 5039-5046 are formed by continuously forming a laminated film of a titanium (Ti) film having a film thickness of 100 nm and an alloy film having a film thickness of 350 nm made of aluminum (Al) and a titanium (Ti) film having a film thickness of 100 nm by a sputtering method and forming it into a desired shape by performing a pattering. Needless to say, not limiting to a three-layer structure, a mono-layer structure may be employed or a laminated structure containing four layers or more may be also employed. As a material for a wiring, not limiting to aluminum (Al) and titanium (Ti), the other electrically conductive films may be employed. For example, an aluminum (Al) film or a copper (Cu) film is formed on tantalum nitride (TaN) film, and further, a wiring may be formed by performing the patterning of a laminated film in which a titanium (Ti) film has been formed. In this way, one of the source region or the drain region of the N-channel type TFT 361 of the pixel section is electrically connected to the pixel electrode 5038 via the wiring 5039. Here, the electrical connection is made between the wiring 5039 and the pixel electrode 5038 by forming it while superimposing one portion on the pixel electrode 5038 and one portion of the wiring 5039.

Subsequently, as shown in FIG. 7D, the third interlayer insulating film 5047 is formed. As the third interlayer insulating film 5047, an inorganic and organic insulating film can be used. As an inorganic insulating film, a silicon oxide film formed by a CVD method and a silicon oxide film coated by a SOG (Spin On Glass) method, a silicon nitride film or a silicon nitride/oxide film formed by a sputtering method or the like can be used. Moreover, as an organic insulating film, an acrylic film or the like can be used.

Examples of the combinations of the second interlayer insulating film 5037 and the third interlayer insulating film 5047 are listed as the followings: there is a combination in which as the second interlayer insulating film 5037, an laminated film of an acryl and a silicon nitride film or a silicon nitride/oxide film formed by a sputtering method is used, and as the third interlayer insulating film 5047, a silicon nitride film or a silicon nitride/oxide film formed by a sputtering method is used. There is a combination in which as the second interlayer insulating film 5037, a silicon oxide film formed by a plasma CVD method is used, and as the third interlayer insulating film 5047, too, a silicon oxide film formed by the plasma CVD method is used. Moreover, there is a combination in which as the second interlayer insulating film 5037, a silicon oxide film formed by a SOG method is used, and as the third interlayer insulating film 5047, too, a silicon oxide film formed by the SOG method. Moreover, there is a combination in which as the second interlayer insulating film 5037, a laminated film of a silicon oxide formed by a SOG method and a silicon oxide formed by a plasma CVD method is used, and as the third interlayer insulating film 5047, a silicon oxide film formed by the plasma CVD method is used. Moreover, there is a combination in which as the second interlayer insulating film 5037, an acryl is used, and as the third interlayer insulating film 5047, an acryl is used. Moreover, there is a combination in which as the second interlayer insulating film 5037, a laminated film of an acryl and a silicon oxide film formed by a plasma CVD method is used, and as the third interlayer insulating film 5047, a silicon oxide film formed by the plasma CVD method is used. Moreover, there is a combination in which as the second interlayer insulating film 5037, a silicon oxide film formed by a plasma CVD method is used, and as the third interlayer insulating film 5047, an acryl is used.

An opening portion is formed at the position corresponding to the pixel electrode 5038 of the third interlayer insulating film 5047. The third interlayer insulating film 5047 functions as an embankment. At the time when the opening section is formed, the sidewall is capable of being made in a tapered shape by employing a wet etching method. Since the deterioration of an organic compound layer caused by the difference of steps becomes a significant problem if the sidewall of the opening portion is not sufficiently gentle, it should be taken notice of it. The occurrence of static electricity may be suppressed by adding a carbon particle and a metal particle in the third interlayer insulating film 5047 and by lowering the resistivity. At this time, the addition amount of the carbon particle and the metal particle may be adjusted so that the resistivity becomes in the range from $1\times10^6$ to $1\times10^{12}$ Ωm (preferably, in the range from $1\times10^8$ to $1\times10^{10}$ Ωm).

Subsequently, an organic compound layer 5048 is formed on the pixel electrode 5038 exposed in the opening portion of the third interlayer insulating film 5047. As the organic compound layer 5048, a known organic light emitting material can be used. Noted that both of an organic light emitting material and an inorganic light emitting material might be used, or an organic light emitting material might be used instead of an organic light emitting material.

As an organic light emitting material, a low molecular organic light emitting material, a high polymeric organic light emitting material and a medium molecular organic material can be freely used. It should be noted that it is defined that the medium molecular organic light emitting material is referred to an organic light emitting material not having the sublimation property and whose degree of polymerization is about 20 or less.

In the present Example, the organic compound layer 5048 is formed using a low molecular organic light emitting material by a vapor deposition method. Concretely, it is defined that it is configured with a laminated structure in which after as a hole injection layer, a copper phthalocyanine (CuPc) film having a film thickness of 20 nm has been provided, on which as a light emitting layer, tris-8-quinolinolatoaluminium complex (Alq$_3$) film having a film thickness of 70 nm is provided. The light emitting color can be suppressed by adding the fluorescent pigment such as quinacridone, perylene or DCM1 to Alq$_3$.

Moreover, as an example in which a high molecule based organic light emitting material is used, the organic compound layer 5048 may be configured with a laminated structure in which polythiophene (PEDOT) film having a film thickness of 20 nm is provided as a hole injection layer by a spin coating method, and paraphenylene vinylene (PPV) having a film thickness of about 100 nm as a light emitting layer. It should be noted that if π conjugated system high molecule of PPV is used, the light emitting wavelengths from red color to blue color can be selected. Moreover, an inorganic material such as silicon carbide or the like is also capable of being used as an electron transportation layer and electron injection layer.

It should be noted that the organic compound layer 5048 is not limited to an organic compound layer having the laminated structure in which a hole injection layer, a hole transportation layer, a light emitting layer, an electron transportation layer, an electron injection layer or the like is clearly discriminated. Specifically, the organic compound layer 5048 may be of a structure having a mixed layer in which materials constituting the hole injection layer, the hole transportation layer, the light emitting layer, the electron transportation layer, the electron injection layer and the like are mixed. For example, it may be the organic compound layer 5048 having a structure having a mixed layer consisted of a material constituting the electron transportation layer (hereinafter, referred to as electron transportation material) and a material constituting the light emitting layer (hereinafter, referred to as light emitting material).

Next, a counter electrode 5049 consisted of an electrically conductive film is provided on the organic compound layer 5048. In the case of the present Example, an alloy film of aluminum and lithium is used as an electrically conductive film. Noted that Mg—Ag film (alloy film made of magnesium and silver) may be used. In the present Example, the counter electrode 5049 corresponds to a cathode of an OLED element. As a cathode material, an electrically conductive film consisted of an element belonging to 1 group or 2 group of the periodic table or an electrically conductive film to which these elements are added can be freely used.

An OLED element is completed at the time when the counter electrode 5049 has been formed. Noted that an OLED element is referred to a diode formed with the pixel electrode (anode) 5038, the organic compound layer 5048 and the counter electrode (cathode) 5049.

It is effective to provide a passivation film 5050 so as to completely cover the OLED element. As the passivation film 5050, it can be used as a mono-layer consisted of an insulating film containing a carbon film, a silicon nitride film or a silicon nitride/oxide film or a laminated layer in which the relevant insulating films are combined. It is preferable that a film excellent in coverage is used as the passivation film, and it is effective that a carbon film, particularly DLC (diamond-like carbon) film is used. Since the DLC film is capable of being formed in a film at a temperature in the range from room temperature to 100° C. or less, it can be easily formed in a film even at the upper portion of the organic compound layer 5048 whose heat resistance is low. Moreover, the DLC film is has a high blocking effect for oxygen, and the oxidation of the organic compound layer 5048 is capable of being suppressed.

It should be noted that after the third interlayer insulating film 5047 has been formed, it is effective to continuously treat the steps up to the step of forming the passivation film 5050 without releasing it into the air using a film formation apparatus of a multi-chamber method (or in-line method).

Noted that actually, when the state of FIG. 7D has been completed, it is preferable that it is packaged with a protection film whose sealing property is high and degas is slight (laminated film, ultraviolet curing resin film or the like) or with a sealing member having the translucency. At that time, if an inactive atmosphere is inputted into the internal portion of the sealing member, or a moisture absorption material (for example, barium oxide) is disposed at the internal portion, the reliability of the OLED element is enhanced.

Moreover, as the sealing property has been enhanced by performing the treatment such as packaging or the like, it is completed as a product by mounting a connector (flexible print circuit: FPC) for connecting a terminal routed from an element or circuit formed on the substrate 201 and an external signal terminal.

The present Example is capable of being carried out by freely combining it with Embodiment 1 through Embodiment 6 and Example 1.

Example 4

In the present Example, an example in which a semiconductor device having a CPU section (arithmetic processing circuit (main portion of CPU), memory circuit and the like) formed on the same substrate as a display device being formed, using a method of fabricating a semiconductor device of the present invention is shown. It should be noted that TFTs used for configurations of the display device and the CPU section and their circuits could be made similar to those of Example 1. However, in the present Example, the display device is defined as an OLED display device in which an OLED element is disposed at each pixel.

In FIG. 8, a sectional view of a semiconductor device fabricated by utilizing the present invention is shown. As for a TFT constituting a pixel section, a TFT connected in series to an OLED element is representatively shown as the N-channel type TFT 361. Moreover, as an element consisting a pixel drive circuit section, the N-channel type TFT 362 and the P-channel type TFT 363 are representatively shown. As an element constituting the CPU section, the N-channel type TFT 364 and the P-channel type TFT 365 are representatively shown.

Since a method of fabricating the N-channel type TFT 361, the N-channel type TFT 362, the P-channel type TFT 363, the N-channel type TFT 364 and the P-channel type TFT 365 is similar to a method of fabrication shown in FIG. 4 in Embodiment 3, here, the description is omitted. Noted that the same portions with those of FIG. 4 would be described with the same reference characters and numerals.

According to Embodiment 3, the semiconductor device is fabricated up to the state of FIG. 8A. In FIG. 8B, a first interlayer insulating film 5101 is formed. This first interlayer insulating film 5101 is formed in a film thickness of 100-200 nm with an insulating film containing silicon by a plasma CVD method or a sputtering method. In the present Example, a silicon oxide nitride film having a film thickness of 100 nm by a plasma CVD method. Needless to say, the first interlayer insulating film 5101 is not limited to a silicon oxide/nitride film, an insulating film containing the other silicons may be used as a mono-layer structure or a laminated structure.

Subsequently, the recovery for crystallinity of the semiconductor layer and the activation for an impurity element added to the semiconductor layer are done by performing the heating treatment (heat treatment). This heating treatment is performed by a thermal annealing method using a furnace-annealing furnace. The thermal annealing method may be performed at a temperature in the range from 400 to 700° C., under the nitrogen atmosphere containing oxygen of 1 ppm or less, and preferably, 0.1 ppm or less in an oxygen concentration, and in the present Example, the activation treatment is performed at 410° C. for one hour by a thermal treatment. Noted that except for the thermal annealing method, a laser annealing method, or a rapid thermal annealing method (RTA method) are capable of being applied. Moreover, the heating treatment may be performed before the first interlayer insulating film 5101 is formed. However, in the case where gate electrodes of the N-channel type TFT 361, the N-channel type TFT 362, the P-channel type TFT 363, the N-channel type TFT 364 and the P-channel type 365 are vulnerable to the heat, it is preferable that in order to protect the wirings or the like as in the present Example, after the first interlayer insulating film 5101 (insulating film mainly consisted of silicon, for example, silicon nitride film) has been formed, the heat treatment is performed.

As described above, the hydrogenation of the semiconductor layer can be also performed at the same time when the activation treatment is done by performing the heat treatment after the first interlayer insulating film 5101 (insulating film mainly consisted of silicon, for example, silicon nitride film) has been formed. In the step of hydrogenation, the dangling bond of the semiconductor layer is terminated by hydrogen contained in the first interlayer insulating film 5101. It should be noted that the heating treatment might be carried out for hydrogenation separately from the heating treatment for activation treatment. Here, regardless of the existence of the first interlayer insulating film 5101, the semiconductor layer can be also hydrogenated. As the other means for hydrogenation, means for utilizing hydrogen excited by plasma (plasma hydrogenation) and means for performing the heating treatment at a temperature in the range from 300 to 450° C. for 1-12 hours in the atmosphere containing hydrogen of 3-100% may be also used.

Subsequently, on the first interlayer insulating film 5101, the second interlayer insulating film 5102 is formed. As the second interlayer insulating film 5012, an inorganic insulating film can be used. For example, a silicon oxide film formed by a CVD method and a silicon oxide film coated by a SOG (Spin On Glass) method or the like can be used. Moreover, as the second interlayer insulating film 5102, an organic insulating film can be used. For example, a film such as polylmide, polyamide, BCB (benzocyclobutene), acryl or the like can be used. Moreover, a laminated structure of an acrylic film and a silicon oxide film may be used. Moreover, a laminated structure of an acrylic film and a silicon nitride film or a silicon nitride/oxide film formed by a sputtering method may be used.

Subsequently, a contact hole reaching each source region and drain region of each TFT (N-channel type TFT 361, N-channel type TFT 362, P-channel type TFT 363, N-channel type TFT 364 and P-channel type TFT 365) is formed by etching the first interlayer insulating film 5101, the second interlayer insulating film 5102 and the gate insulating film 203 using a dry etching or a wet etching.

Subsequently, wirings 5103-5110 electrically connected to a source region and a drain region of each TFT (N-channel type TFT 361, N-channel type TFT 362, P-channel type TFT 363, N-channel type TFT 364 and P-channel type TFT 365), respectively are formed. Noted that in the present Example, the wirings 5103-5110 are formed by continuously forming a laminated film of a titanium (Ti) film having a film thickness of 100 nm and an aluminum (Al) film having a film thickness of 350 nm and a titanium (Ti) film having a film thickness of 100 nm and forming it into a desired shape by performing the pattering. Needless to say, not limiting to a three-layer structure, a mono-layer structure may be employed or a laminated structure having two layers may be employed, or a laminated structure having four layers or more may be also employed. Moreover, as a material for a wiring, not limiting to aluminum (Al) and titanium (Ti), the other electrically conductive films may be employed. For example, an aluminum (Al) film or a copper (Cu) film is formed on a tantalum nitride (TaN) film, and further, a wiring may be formed by performing the patterning of a laminated film in which a titanium (Ti) film is formed.

Subsequently, as shown in FIG. 8D, the third interlayer insulating film 5111 is formed. As the third interlayer insulating film 5111, an inorganic insulating film or an organic insulating film can be used. As an inorganic insulating film, a silicon oxide film formed by a CVD method and a silicon oxide film coated by a SOG (Spin On Glass) method or the like can be used. Moreover, as an organic insulating film, an acrylic resin film or the like can be used. Moreover, a laminated structure of an acrylic film and a silicon nitride film or a silicon nitride/oxide film formed by a sputtering method may be used. The convexes and concaves caused by TFTs (N-channel type TFT 361, N-channel type TFT 362, P-channel type TFT 363, N-channel type TFT 364 and P-channel type TFT 365) can be relaxed and flattened by forming the third interlayer insulating film 5111. Particularly, since the third interlayer insulating film 5111 is strongly meant to use for the purpose of flattening, it is preferable that it is excellent in evenness.

Subsequently, a contact hole reaching the wiring 5103 is formed in the third interlayer insulating film 5111 using a dry etching or a wet etching.

Subsequently, a pixel electrode 5112 is formed by performing the patterning of an electrically conductive layer. In the case of the present Example, an alloy film of aluminum and lithium is used as an electrically conductive film. Noted that Mg—Ag film (alloy film made of magnesium and silver) may be used. The pixel electrode 5112 corresponds to a cathode of an OLED element. As a cathode material, an electrically conductive film consisted of an element belonging to 1 group or 2 group of the periodic table or an electrically conductive film to which these elements are added can be freely used.

The electric connections of a pixel electrode 5112 to the wiring 5103 is established via a contact hole formed in the third interlayer insulating film 5111. Thus, the pixel electrode 5112 is electrically connected to one of the source region or drain region of the N-channel type TFT 361.

Subsequently, an embankment 5113 is formed in order to discretely coat an organic compound layer between the respective pixels. As the embankment 5113, an inorganic insulating film or an organic insulating film can be used. As an inorganic insulating film, a silicon nitride film formed by a sputtering method or a silicon oxide film formed by a CVD method and a silicon oxide film coated by a SOG (Spin On Glass) method or the like can be used. Moreover, as an organic insulating film, an acrylic resin film or the like can be used. Here, at the time when the embankment 5113 is formed, the sidewall is capable of being easily made in a tapered shape by employing a wet etching method. Since the deterioration of an organic compound layer caused by the difference between steps becomes a significant problem if the sidewall of the embankment 5113 is not sufficiently gentle, it should be taken notice of. It should be noted that at the time when the pixel electrode 5112 and the wiring 5103 are electrically connected, the embankment 5113 is also formed at the portion of the contact hole formed in the third interlayer insulating film 5111. Thus, the deterioration of an organic compound layer caused by the difference existed between steps is prevented by embedding the convexes and concaves of the pixel electrode, that is, which are caused by the convexes and concaves of the portion of the contact hole, with the embankment 5113.

Examples of the combinations of the third interlayer insulating film 5111 and the embankment 5113 are listed as the followings: there is a combination in which as the third interlayer insulating film 5111, an laminated film of an acryl and a silicon nitride film or a silicon nitride/oxide film formed by a sputtering method is used, and as the embankment 5113, a silicon nitride film or a silicon nitride/oxide film formed by a sputtering method is used. There is a combination in which as the third interlayer insulating film 5111, a silicon oxide film formed by a plasma CVD method is used, and as the embankment 5113, too, a silicon oxide film formed by the plasma CVD method is used. Moreover, there is a combination in which as the third interlayer insulating film 5111, a silicon oxide film formed by a SOG method is used, and as the embankment 5113, too, a silicon oxide film formed by the SOG method. Moreover, there is a combination in which as the third interlayer insulating film 5111, a laminated film of a silicon oxide formed by a SOG method and a silicon oxide formed by a plasma CVD method is used, and as the embankment 5113, a silicon oxide film formed by the plasma CVD method is used. Moreover, there is a combination in which as the third interlayer insulating film 5111, an acryl is used, and as the embankment 5113, an acryl is used. Moreover, there is a combination in which as the third interlayer insulating film 5111, a laminated film of an acryl and a silicon oxide film formed by a plasma CVD method is used, and as the embankment 5113, a silicon oxide film formed by the plasma CVD method is used. Moreover, there is a combination in which as the third interlayer insulating film 5111, a silicon oxide film formed by a plasma CVD method is used, and as the embankment 5113, an acryl is used. It should be noted that the occurrence of static electricity might be suppressed by adding a carbon particle and a metal particle in the embankment 5113 and by lowering the resistivity. At this time, the addition amount of the carbon particle and the metal particle may be adjusted so that the resistivity becomes in the range from $1 \times 10^6$ to $1 \times 10^{12}$ $\Omega$m (preferably, in the range from $1 \times 10^8$ to $1 \times 10^{10}$ $\Omega$m).

Subsequently, an organic compound layer 5114 is formed on the exposed pixel electrode 5112 surrounded by the embankment 5113. As the organic compound layer 5114, a known organic light emitting material can be used. Noted that both of an organic light emitting material and an inorganic light emitting material might be used, or an inorganic light emitting material might be used instead of an organic light emitting material. As for an organic light emitting material, a low molecule based organic light emitting material, a high molecule based organic light emitting material and a medium molecule based organic light emitting material can be freely used. It should be noted that it is defined that the medium molecule based organic light emitting material is referred to an organic light emitting material not having the sublimation property and whose degree of polymerization is about 20 or less.

In the present Example, the organic compound layer 5114 is formed using a low molecule based organic light emitting material by a vapor deposition method. Concretely, it is defined that it is configured with a laminated structure in which after as a light emitting layer, tris-8-quinolinolatoaluminium complex ($Alq_3$) film having a film thickness of 70 nm has been provided, on which, as a hole injection layer, a copper phthalocyanine (Cu—Pc) film having a film thickness of 20 nm is provided. The light emitting color can be suppressed by adding the fluorescent pigment such as quinacridone, perylene or DCM1 to $Alq_3$.

Moreover, as an example in which a high polymeric organic light emitting material is used, the organic compound layer 5114 may be configured in a laminated structure in which polythiophene (PEDOT) film having a film thickness of 20 nm is provided as a hole injection layer by a spin coating method, and paraphenylene vinylene (PPV) having a film thickness of about 100 nm as a light emitting layer is provided on it. It should be noted that if $\pi$ conjugated based high polymer of paraphenylene vinylene (PPV) is used, the light emitting wavelengths in the range from red color to blue color can be selected. Moreover, an inorganic material such as silicon carbide or the like is also capable of being used as an electron transportation layer and electron injection layer.

It should be noted that the organic compound layer 5114 is not limited to an organic compound layer having the laminated structure in which a hole injection layer, a hole transportation layer, a light emitting layer, an electron transportation layer, an electron injection layer or the like is clearly discriminated. Specifically, the organic compound layer 5114 may be of a structure having a mixed layer in which materials constituting the hole injection layer, the hole transportation layer, the light emitting layer, the electron transportation layer, the electron injection layer and the like are mixed. For example, it may be the organic compound layer 5114 having a structure having a mixed layer consisted of a material constituting the electron transportation layer (hereinafter, referred to as electron transportation material) and a material constituting the light emitting layer (hereinafter, referred to as light emitting material) located between the electron transportation layer and the light emitting layer.

Next, a counter electrode 5115 consisted of a transparent, electrically conductive film is formed on the organic compound layer 5114. For a transparent, electrically conductive film, a compound of indium oxide and tin oxide (ITO), a compound of indium oxide and zinc oxide, zinc oxide, tin oxide, indium oxide or the like can be used. Moreover, the matter that gallium is added to the foregoing transparent, electrically conductive film may be used. The counter electrode 5115 corresponds to an anode of an OLED element.

An OLED element is completed at the time when the counter electrode 5115 has been formed. Noted that an OLED element is referred to a diode formed with the pixel electrode (cathode) 5112, the organic compound layer 5114 and the counter electrode (anode) 5115.

In the present Example, since the counter electrode 5115 is formed with a transparent, electrically conductive film, the light emitted by the OLED element is irradiated towards the reverse side of the substrate 201. Moreover, a pixel electrode 5112 is formed in a layer different from the layer where the wirings 5103-5110 are formed with the third interlayer insulating film 5111. Therefore, the aperture opening ratio can be enhanced comparing to the configuration shown in Example 3.

It is effective to provide a passivation film 5116 so as to completely cover the OLED element. As for the passivation film 5116, it can be used as a mono-layer consisted of an insulating film containing a carbon film, a silicon nitride film or a silicon nitride/oxide film or a laminated layer in which the relevant insulating films are combined. Noted that in the case where the light emitted by the OLED element is irradiated from the counter electrode 5116 side as in the present Example, it is necessary to use the light transmitting film for the protection film 5116.

It should be noted that after the embankment 5113 has been formed, it is effective to continuously treat the steps up to the step of forming the protection film 5116 using a film formation apparatus of a multi-chamber method (or in-line method) without releasing it into the air.

Noted that actually, when the state of FIG. 8D has been completed, it is preferable that it is packaged with a protection film whose sealing property is high and degas is slight (laminated film, ultraviolet curing resin film or the like) or with a sealing member having the translucency so that it is not exposed to the ambient air. At that time, if the internal portion of the sealing member is made a inactive atmosphere, a moisture absorption material (for example, barium oxide) is disposed at the internal portion, the reliability of the OLED element is enhanced.

Moreover, as the sealing property has been enhanced by performing the treatment such as packaging or the like, it is completed as a product by mounting a connector (flexible print circuit: FPC) for connecting a terminal routed from an element or circuit formed on the substrate 201 and an external signal terminal.

The present Example is capable of being carried out by freely combining it with Embodiment 1 through Embodiment 6 and Example 1.

Example 5

This example shows an example of a method for crystallizing a semiconductor film for producing a semiconductor active layer of a TFT included in a semiconductor apparatus according to the present invention.

As a base film, silicon oxynitride film (composition ratio: Si=32%, O=59%, N=7%, and H=2%) in 400 nm thick is formed on a glass substrate by plasma CVD method. Then, as a semiconductor film, 150 nm of amorphous silicon film is formed on the base film by plasma CVD method. Then, thermal processing at 500° C. is performed thereon for three hours so that hydrogen contained in the semiconductor film is discharged. After that, the semiconductor film is crystallized by laser annealing method.

As the laser used for laser annealing method, continuous oscillating $YVO_4$ laser is used. For the laser annealing method, the second harmonic (wavelength 532 nm) of the $YVO_4$ laser is used as laser light. As the beam in a predetermined form, laser light is irradiated to the semiconductor film on the substrate surface by using an optical system.

The form of the beam irradiated to the substrate can be varied depending on the type of laser or optical system. In this way, the aspect ratio and/or distribution of energy density of the beam irradiated onto the substrate can be changed. For example, various forms of the beam irradiated onto the substrate are possible such as linear, rectangular and elliptical forms. In this example, the second harmonic of the $YVO_4$ laser in an elliptical form of 200 μm×50 μm is irradiated to the semiconductor film by using an optical system.

Figure 14:
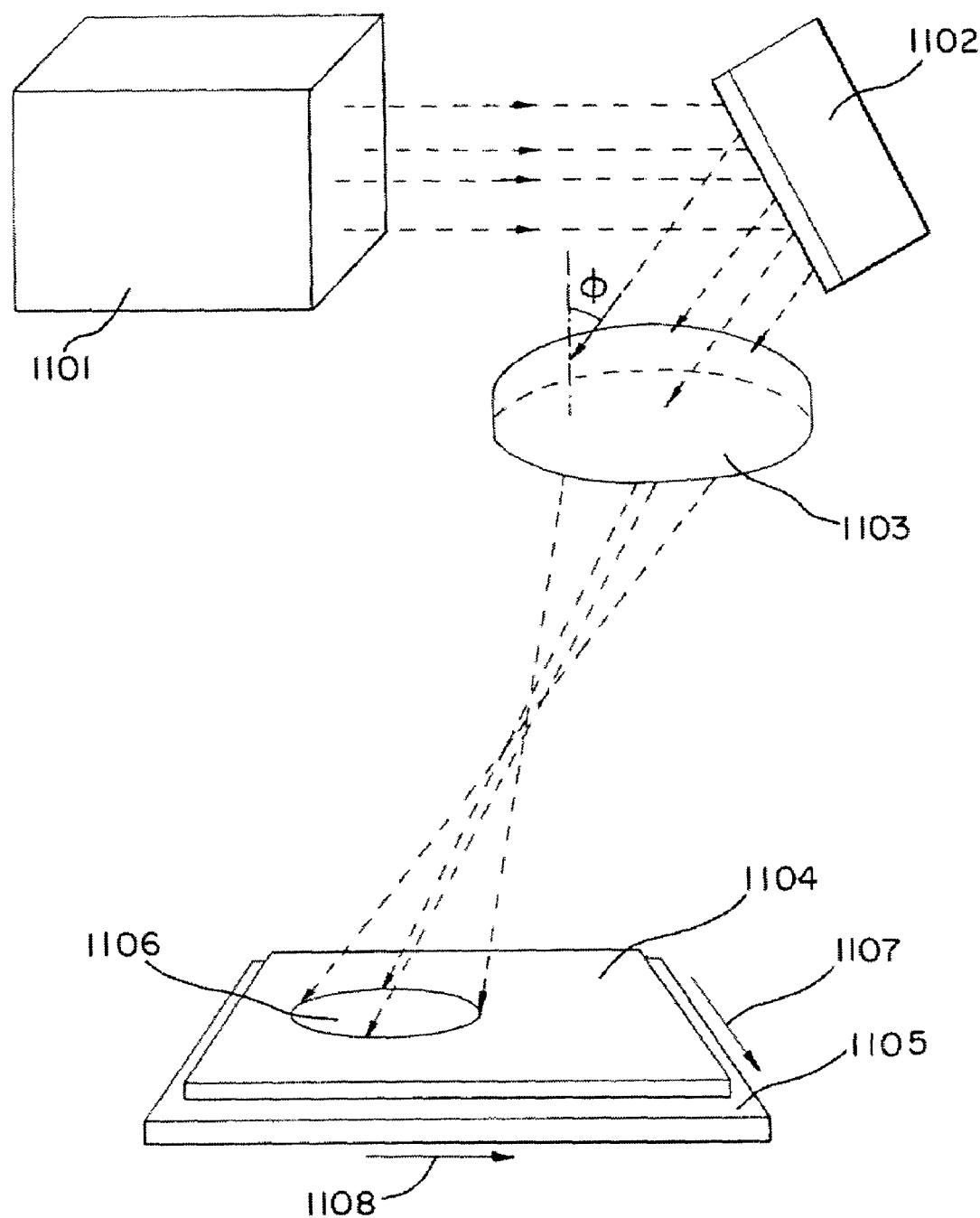
FIG. 14 is a schematic diagram showing an optical system used for laser annealing.

FIG. 14 shows a model diagram of an optical system, which is used when laser light is irradiated to a semiconductor film on a substrate surface. Laser light (the second harmonic of YVO$_4$ laser) emitted from laser 1101 enters a convex lens 1103 through a mirror 1102. The laser light enters to the convex lens 1103 diagonally. As a result, a focus position is shifted due to the aberration such as astigmatism. Thus, elliptical beam 1106 can be formed in an irradiated surface or near there. Then, the elliptical beam 1106 formed in this way is irradiated, and a glass substrate 1105 is moved in a direction indicated by a reference numeral 1107 or 1108. Then, in the semiconductor film 1104 formed on the glass substrate 1105, the elliptical beam 1106 is irradiated by relatively being moved. The relative scanning direction of the elliptical beam 1106 is perpendicular to the major axis of the elliptical beam 1106. In this example, the elliptical beam of 200 μm×50 μm is formed having incident angle φ of about 20° of laser light with respect to the convex lens 1103. The elliptical beam is irradiated on the glass substrate 1105 by being moved at the speed of 50 cm/s. Thus, the semiconductor film is crystallized.

Figure 15:
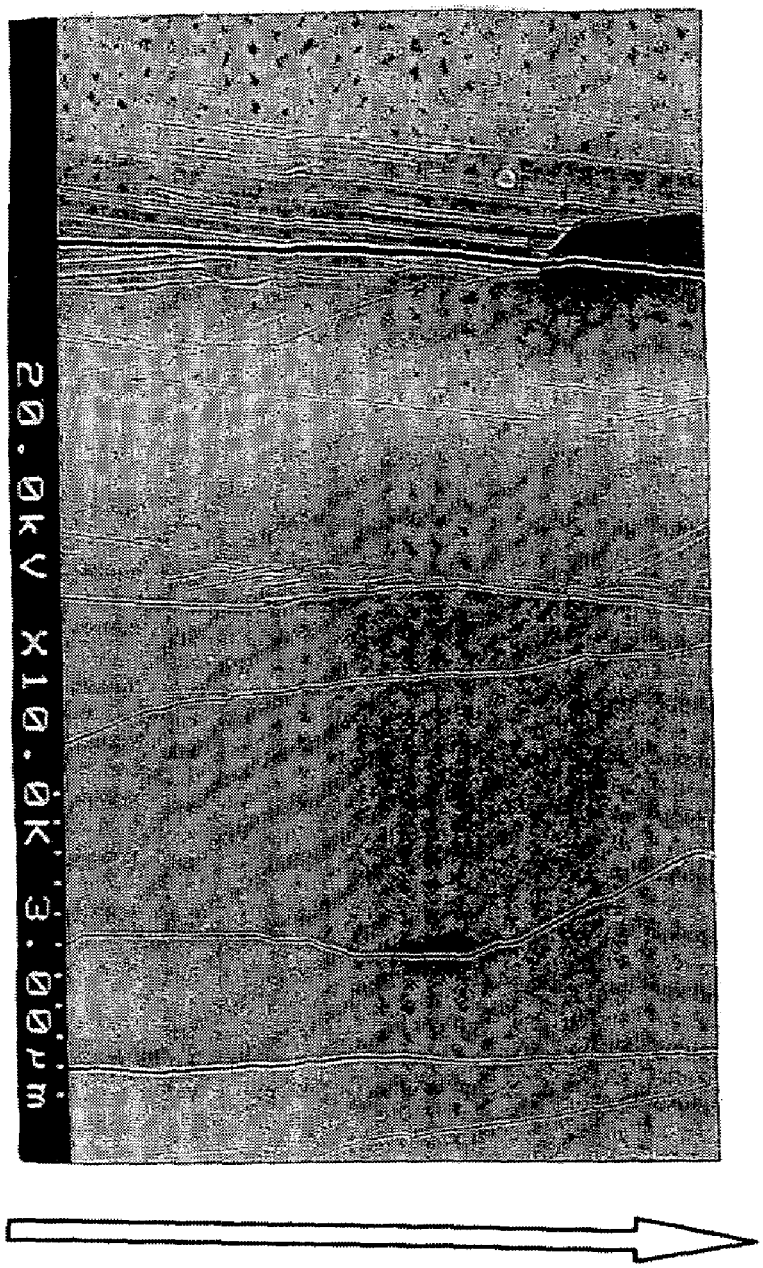
FIG. 15 is an image observed by a scanning electron microscopy (SEM) showing a semiconductor thin film of TFT formed by a method of fabricating a semiconductor device of the present invention.

The secco etching is performed on the crystalline semiconductor film obtained in this way. FIG. 15 shows the result of the observation of the surface by using an SEM with 10,000 magnifications. The secco solution used for the secco etching is manufactured by adding K$_2$Cr$_2$O$_7$ as additive to HF:H$_2$O=2:1. One shown in FIG. 15 is obtained by relatively scanning laser light in a direction indicated by an arrow shown in FIG. 15. Large crystal grains are formed in parallel with the scanning direction of the laser light. In other words, the crystal is raised so as to extend in the scanning direction of the laser light.

In this way, large crystal grains are formed on the crystallized semiconductor film by using the method according to this example. Therefore, when the semiconductor film is used as a semiconductor active layer to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, when the TFT is positioned such that the direction that the carrier moves can be the same as the direction that the formed crystal grains extend, the number of times that the carriers cross the crystal grain boundary can be extremely reduced. Therefore, a variation in ON current value (value of drain current flowing when the TFT is ON), an OFF current value (value of drain current flowing when the TFT is OFF), a threshold voltage, an S-value and field effect mobility can be reduced. As a result, the electric characteristic can be improved significantly.

In order to irradiate the elliptical beam 1106 in a wide range of the semiconductor film, the elliptical beam 1106 is scanned in a direction perpendicular to the major axis to irradiate to the semiconductor film multiple times (this operation may be expressed by scan). Here, the position of the elliptical beam 1106 is shifted in the direction parallel to the major axis for every single scan. The scanning direction becomes opposite between serial scans. In the serial two scans, one will be called outward scan and the other will be called inward scan hereinafter.

The amount of shifting the position of the elliptical beam 1106 to the direction parallel to the major axis for every single scan is expressed by pitch d. A reference numeral D1 indicates, in the outward scan, the length of the elliptical beam 1106 in the direction perpendicular to the scanning direction of the elliptical beam 1106 in an area having large crystal grains as shown in FIG. 15. A reference numeral D2 indicates, in the inward scan, the length of the elliptical beam 1106 in the direction perpendicular to the scanning direction of the elliptical beam 1106 in an area having large crystal grains as shown in FIG. 15. In this case, an average value of D1 and D2 is D.

Here, an overlap ratio R$_{OL}$ [%] is defined by Equation 1.

$$R_{OL}=(1-d/D)\times 100 \quad [EQ1]$$

In this example, the overlap ratio R$_{OL}$ is 0%.

The present invention can be implemented by freely combining with Embodiments 1 to 6, and Examples 1 to 4.

Example 6

This example is different from Example 5 in the method for crystallizing a semiconductor film when a semiconductor active layer of a TFT included in the semiconductor device of the present invention is manufactured.

The steps up to forming an amorphous silicon film as a semiconductor film are the same as those of Example 5. After that, the method disclosed in Japanese Patent Application Laid-Open NO. Hei 7-183540 is used. Nickel acetate solution (5 ppm in weight conversion concentration and 10 ml in volume) is coated on the semiconductor film by spin coating method. Then, thermal processing is performed thereon in a nitrogen atmosphere at 500° C. for one hour and in a nitrogen atmosphere at 550° C. for twelve hours. Then, the crystallinity of the semiconductor film is improved by laser annealing method.

As the laser used for laser annealing method, continuous oscillating YVO$_4$ laser is used. For the laser annealing method, the second harmonic (wavelength 532 nm) of the YVO$_4$ laser is used as laser light. The elliptical beam of 200 μm×50 μm is formed having incident angle φ of about 20° of laser light with respect to the convex lens 1103 in the optical system shown in FIG. 14. The elliptical beam is moved and irradiated to the glass substrate 1105 at the speed of 50 cm/s. Thus, the crystallinity of the semiconductor film is improved. Note that, the relative scanning direction of the elliptical beam 1106 is perpendicular to the major axis of the elliptical beam 1106.

The secco etching is performed on the crystalline semiconductor film obtained in this way. FIG. 16 shows the result of the observation of the surface by using an SEM with 10,000 magnifications. One shown in FIG. 16 is obtained by relatively scanning laser light in a direction indicated by an arrow shown in FIG. 16. Large crystal grains extend in the scanning direction.

In this way, large crystal grains are formed on the crystallized semiconductor film according to the present invention. Therefore, when the semiconductor film is used to manufacture a TFT, the number of the crystal grain boundaries included in the channel forming area of the TFT can be reduced. In addition, each crystal grain substantially has crystallinity, which is essentially single crystal. Therefore, the mobility (field effect mobility) as high as that of a transistor using a single crystal semiconductor can be obtained.

Furthermore, the formed crystal grains are aligned in one direction. Thus, when the TFT is positioned such that the direction that the carriers move can be the same as the direction that the formed crystal grains extend, the number of times that the carriers cross the crystal grain boundary can be extremely reduced. Therefore, a variation in ON current value, an OFF current value, a threshold voltage, an S-value and field effect mobility can be reduced. As a result, the electric characteristic can be improved significantly.

In order to irradiate the elliptical beam 1106 in a wide range of the semiconductor film, the elliptical beam 1106 is scanned in a direction perpendicular to the major axis to irradiate to the semiconductor film multiple times (this operation may be called scan). Here, the position of the elliptical beam 1106 is shifted in the direction parallel to the major axis for every single scan. The scanning direction becomes opposite between serial scans. In the serial two scans, one will be called outward scan and the other will be called inward scan hereinafter.

The amount of shifting the position of the elliptical beam 1106 to the direction parallel to the major axis for every single scan is expressed by pitch d. A reference numeral D1 indicates, in the outward scan, the length of the elliptical beam 1106 in the direction perpendicular to the scanning direction of the elliptical beam 1106 in an area having large crystal grains as shown in FIG. 16. A reference numeral D2 indicates, in the inward scan, the length of the elliptical beam 1106 in the direction perpendicular to the scanning direction of the elliptical beam 1106 in an area having large crystal grains as shown in FIG. 16. In this case, an average value of D1 and D2 is D.

Here, an overlap ratio $R_{OL}$ [%] is defined like Equation 1. In this example, the overlap ratio $R_{OL}$ is 0%.

Figure 17:
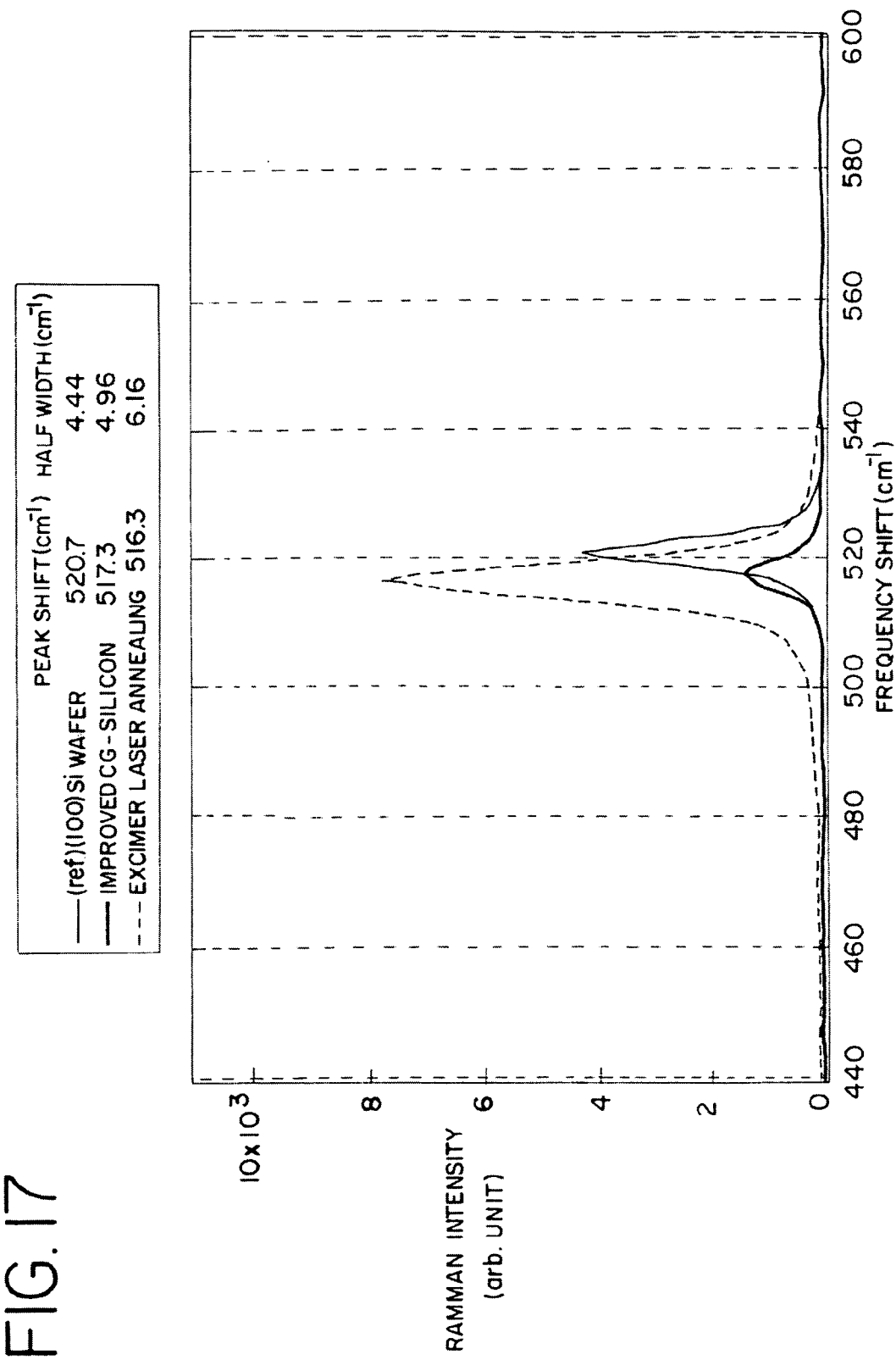
FIG. 17 is a graphical representation showing a property of a semiconductor active layer of TFT formed by a method of fabricating a semiconductor device of the present invention.

In FIG. 17, a thick line indicates a result of Raman spectroscopy performed on the crystalline semiconductor film (represented by Improved CG-Silicon in FIG. 17) obtained by using the above-described crystallization method. Here, for comparison, a thin line indicates a result of Raman spectroscopy performed on the single crystal silicon (represented by ref. (100) Si Wafer in FIG. 17). In FIG. 17, a dotted line indicates a result of Raman spectroscopy performed on a semiconductor film (represented by excimer laser annealing in FIG. 17). In order to obtain the semiconductor film, an amorphous silicon film is formed and hydrogen contained in the semiconductor film is discharged through thermal processing. Then, the semiconductor film is crystallized by using excimer laser with pulse oscillation. The Raman shift of the semiconductor film obtained by using the method of this example has the peak at 517.3 cm$^{-1}$. The half value breadth is 4.96 cm$^{-1}$. On the other hand, the Raman shift of the single crystal silicon has the peak at 520.7 cm$^{-1}$. The half value breadth is 4.44 cm$^{-1}$. The Raman shift of the semiconductor film crystallized by using the excimer laser with the pulse oscillation has the peak at 516.3 cm$^{-1}$. The half value breadth is 6.16 cm$^{-1}$. From the results in FIG. 17, the crystallinity of the semiconductor film obtained by using the crystallization method described in this example is closer to that of the single crystal silicon than the crystallinity of the semiconductor film crystallized by using the excimer laser with pulse oscillation.

Present example can be freely combining with Embodiments 1 to 6 and Examples 1 to 4.

Example 7

In this example, a case where a semiconductor film crystallized by using the method described in Example 5 is used to manufacture a TFT will be described with reference to FIGS. 14, 18A to 18H and 19A and 19B.

Note that, TFTs, which have the gate electrodes manufactured by the same etching processing, will be paid to attention, and a method of manufacturing thereof will be explained in this example. In this case, the description of differently making the gate electrodes according to the TFTs and performing doping processing as shown in Embodiments 1 to 5 will be omitted here. Actually, the present example will be implemented by combining the methods described in Embodiments 1 to 5 or the like.

A glass substrate is used as a substrate 20 in this example. As a base film 21, 50 nm of silicon oxynitride film (composition ratio Si=32%, O=27%, N=24%, and H=17%) and 100 nm of silicon oxynitride film (composition ratio Si=32%, O=59%, N=7%, and H=2%) are stacked on the glass substrate. Next, as a semiconductor film 22, 150 nm of amorphous silicon film is formed on the base film 21 by plasma CVD method. Then, thermal processing is performed thereon at 500° C. for three hours to discharge hydrogen contained in the semiconductor film (FIG. 18A).

After that, the second harmonic (wavelength 532 nm, 5.5 W) of the continuous oscillating YVO$_4$ laser is used as the laser light to form an elliptical beam 1106 of 200 μm×50 μm having incident angle φ of about 20° of laser light with respect to the convex lens 1103 in the optical system shown in FIG. 14. The elliptical beam 1106 is irradiated on the semiconductor film 22 by relatively being scanned at the speed of 50 cm/s. Thus, the semiconductor film 23 is manufactured (FIG. 18B).

Then, first doping processing is performed thereon. This is channel doping for controlling the threshold value. B$_2$H$_6$ is used as material gas having a gas flow amount of 30 sccm, a current density of 0.05 μA, an accelerating voltage of 60 keV, and a dosage of 1×10$^{14}$ atoms/cm$^2$. Thus, a semiconductor film 23 is obtained (FIG. 18C).

Next, after etching the semiconductor film 24 into a desired form by patterning, a silicon oxynitride film in 115 nm thick is formed by plasma CVD method as a gate insulating film 27 covering the etched semiconductor films 25 and 26. Then, a TaN film 28 in 30 nm thick and a W film 29 in 370 nm thick are stacked on the gate insulating film 27 as a conductive film (FIG. 18D).

A mask (not shown) made of resist is formed thereon by using photolithography method, and the W film, the TaN film and the gate insulating film are etched. Thus, conductive layers 30 (30a and 30b), conductive layers 31 (31a and 31b) and gate insulating films 32 (32a and 32b) are formed.

Then, the mask made of resist is removed, and a new mask 33 is formed. The second doping processing is performed thereon and an impurity element imparting the n-type to the semiconductor film is introduced. In this case, the conductive layers 30a and 31a are masks for the impurity element imparting the n-type, and an impurity region 34 is formed in a self-aligned manner. In this example, the second doping processing is performed under two conditions because the semiconductor film is thick as much as 150 nm. In this example, phosphine (PH$_3$) is used as material gas. The dosage of 2×10$^{13}$ atoms/cm$^2$ and the accelerating voltage of 90 keV are used, and then the dosage of 5×10$^{14}$ atoms/cm$^2$ and the accelerating voltage of 10 keV are used for the processing (FIG. 18E).

Next, the mask 33 made of resist is removed, and a new mask 35 made of resist is formed additionally for performing the third doping processing. Through the third doping processing, an impurity region 36 is formed containing an impurity element for imparting p-type to a semiconductor film, which becomes an active layer of a p-channel type TFT. By using the conductive layers 30b and 31b as a mask for the impurity element, the impurity region 36 is formed in the self-aligned manner by addition of the impurity element for imparting the p-type. Also the third doping processing in this example is performed under two conditions because the semiconductor film is thick as much as 150 nm. In this example, diborane ($B_2H_6$) is used as material gas. The dosage of $2\times10^{13}$ atoms/cm$^2$ and the accelerating voltage of 90 keV are used, and then the dosage of $1\times10^{15}$ atoms/cm$^2$ and the accelerating voltage of 10 keV are used for the processing (FIG. 18F).

Through these steps, the impurity regions 34 and 36 are formed on the semiconductor layer.

Next, the mask 35 made of resist is removed, and silicon oxynitride film (composition ratio Si=32.8%, O=63.7%, and N=3.5%) in 50 nm thick is formed as a first interlayer insulating film 37 by plasma CVD method.

Next, thermal processing is performed thereon to recover crystallinity of the semiconductor layers and to activate the impurity elements added to the semiconductor layers, respectively. Then, thermal processing by thermal annealing method using an anneal furnace is performed at 550° C. for four hours in a nitrogen atmosphere (FIG. 18G).

Next, a second interlayer insulating film 38 of an inorganic or organic insulating material is formed on the first interlayer insulating film 37. In this example, after forming a silicon nitride film in 50 nm thick by CVD method, a silicon oxide film in 400 nm thick is formed. After the thermal processing, hydrogenation processing can be performed. In this embodiment, the thermal processing is performed at 410° C. for one hour in a nitrogen atmosphere by using an anneal furnace.

Next, a wiring 39 is formed for connecting to the impurity regions electrically. In this example, the wiring 39 is formed by patterning a laminate film of a Ti film in 50 nm thick, an Al—Si film in 500 nm thick and a Ti film in 50 nm thick. Naturally, the construction is not limited to the two-layer construction, but may be a single layer construction or a laminate construction having three or more layers. The material of the wiring is not limited to Al and Ti. For example, Al and/or Cu may be formed on a TaN film. Then, a laminate film having a Ti film may be patterned to form a wiring (FIG. 18H).

In this way, the n-channel type TFT 51 and the p-channel type TFT 52 are formed, both having the channel length of 6 μm and the channel width of 4 μm.

Figure 19A:
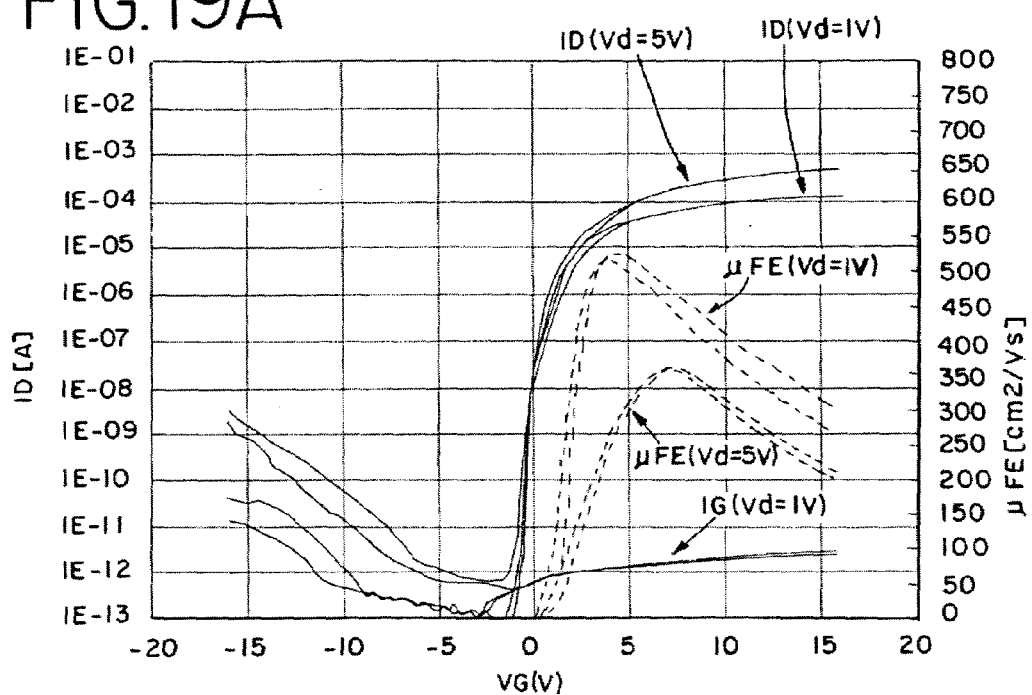
FIGS. 19A and 19B are graphical representations showing electrical properties of TFT formed by a method of fabricating a semiconductor device of the present invention.
Figure 19B:
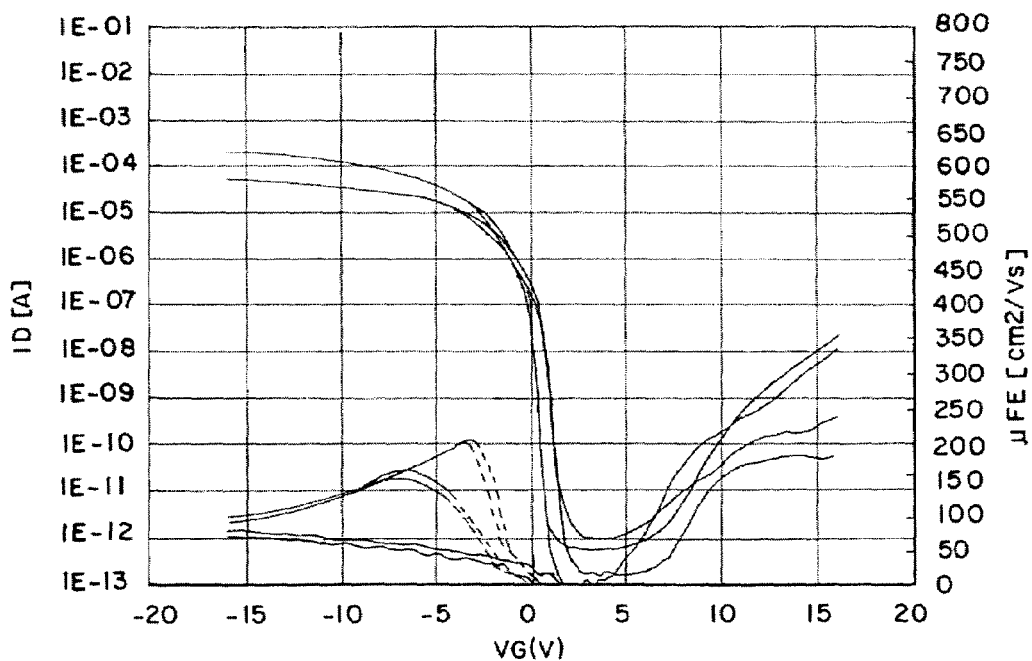

FIGS. 19A and 19B show results of measuring these electrical characteristics. FIG. 19A shows an electric characteristic of the n-channel type TFT 51. FIG. 19B shows an electric characteristic of the p-channel type TFT 52. The electric characteristics are measured at two measurement points in a range of gate voltage Vg=−16 to 16 V and in the range of drain voltage Vd=1 V and 5 V. In FIGS. 19A and 19B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries containing the channel forming region can be reduced when a TFT is manufactured by using the semiconductor film. Furthermore, because the formed crystal grains direct to the same direction, the number of times of crossing the crystal grain boundaries by carriers can be extremely reduced. Therefore, a TFT having the good electric characteristic can be obtained as shown in FIGS. 19A and 19B. Especially, the mobility is 524 cm$^2$/Vs in the n-channel type TFT and 205 cm$^2$/Vs in the p-channel type TFT. When a semiconductor apparatus is manufactured by using this type of TFT, the operational characteristic and the reliability can be improved also.

The present example can be implemented by freely combining Embodiments 1 to 6 and Examples 1 to 4.

Example 8

In this example, a case where a TFT is manufactured by using a semiconductor film crystallized by using the method described in Example 6 will be described with reference to FIG. 14 and FIGS. 20A to 23B. Note that, TFTs, which have the gate electrodes manufactured by the same etching processing, will be paid to attention, and a method of manufacturing thereof will be explained in this example. In this case, the description of differently making the gate electrodes according to the TFTs and performing doping processing as shown in Embodiments 1 to 5 will be omitted here. Actually, the present example will be implemented by combining the methods described in Embodiments 1 to 5 or the like.

Figure 20A:
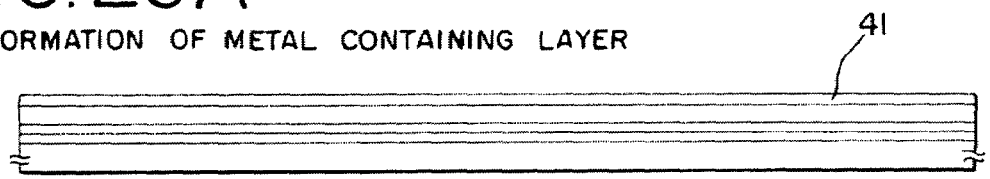
FIGS. 20A to 20C are diagrams showing a method of fabricating a semiconductor device of the present invention.

The steps up to forming the amorphous silicon film as the semiconductor film are the same as Example 7. The amorphous silicon film is formed in 150 nm thick (FIG. 20A).

Figure 20B:
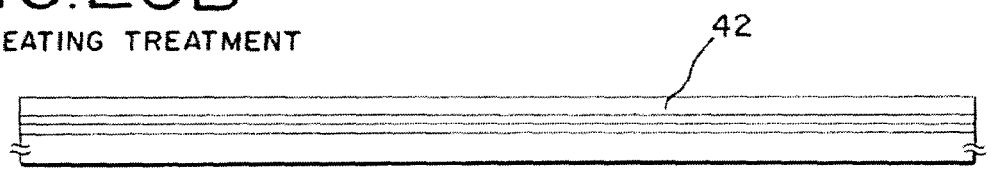

After that, the method disclosed in the Japanese Patent Application Laid-Open No. Hei 7-183540 is used. Nickel acetate solution (5 ppm in weight conversion concentration and 10 ml in volume) is coated on the semiconductor film by spin coating method to form a metal containing layer 41. Then, thermal processing is performed thereon in a nitrogen atmosphere at 500° C. for one hour and in a nitrogen atmosphere at 550° C. for twelve hours. Then, a semiconductor film 42 is obtained (FIG. 20B).

Then, the crystallinity of the semiconductor film 42 is improved by laser annealing method. For the condition for the laser annealing method, the second harmonic (wavelength 532 nm, 5.5 W) of a continuous oscillating YVO$_4$ laser is used as laser light. The elliptical beam 1106 of 200 μm×50 μm is formed having incident angle φ of about 20° of laser light with respect to the convex lens 1103 in the optical system shown in FIG. 14. The elliptical beam 1106 is moved and irradiated to the substrate at the speed of 20 cm/s or 50 cm/s. Thus, the crystallinity of the semiconductor film 42 is improved. As a result, a semiconductor film 43 is obtained (FIG. 20C).

Figure 20C:
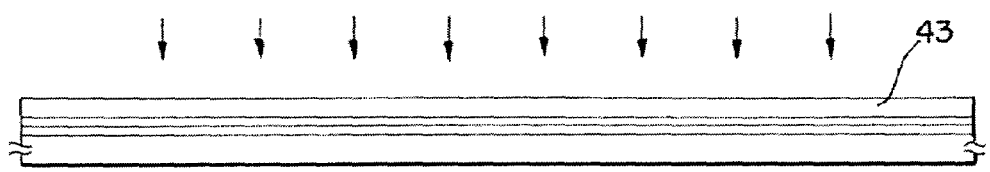

The steps after the crystallizing the semiconductor film in FIG. 20C are the same as the steps shown in FIGS. 18C to 18H shown in the Example 7. In this way, the n-channel type TFT 51 and the p-channel type TFT 52 are formed, both having the channel length of 6 μm and the channel width of 4 μm. These electrical characteristics are measured.

Figure 21A:
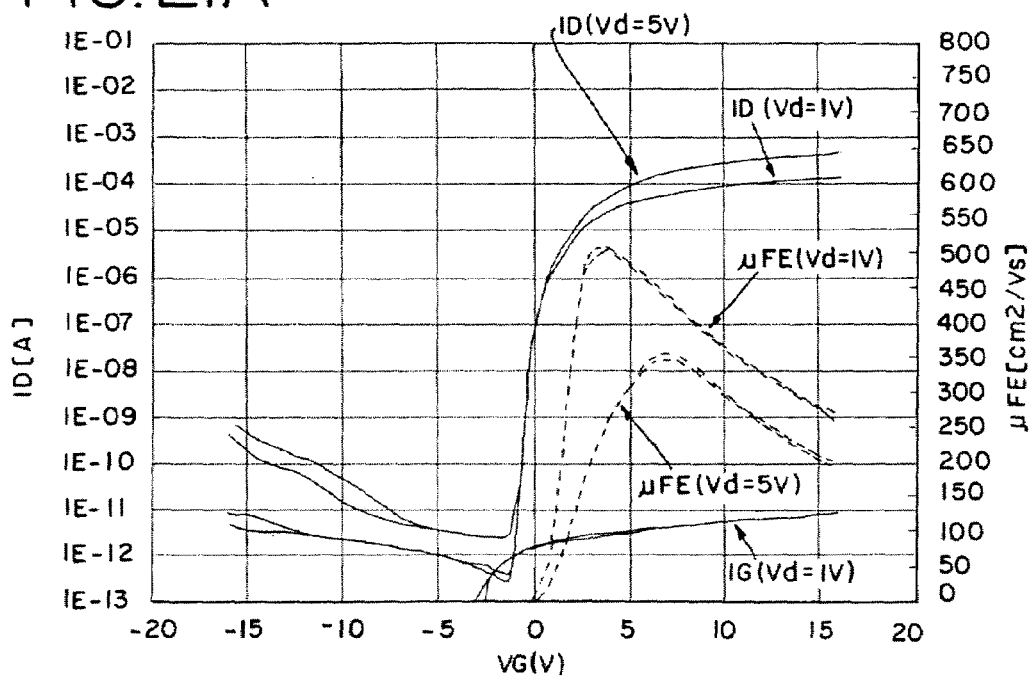
FIGS. 21A and 21B are graphical representations showing electrical properties of TFT formed by a method of fabricating a semiconductor device of the present invention.
Figure 21B:
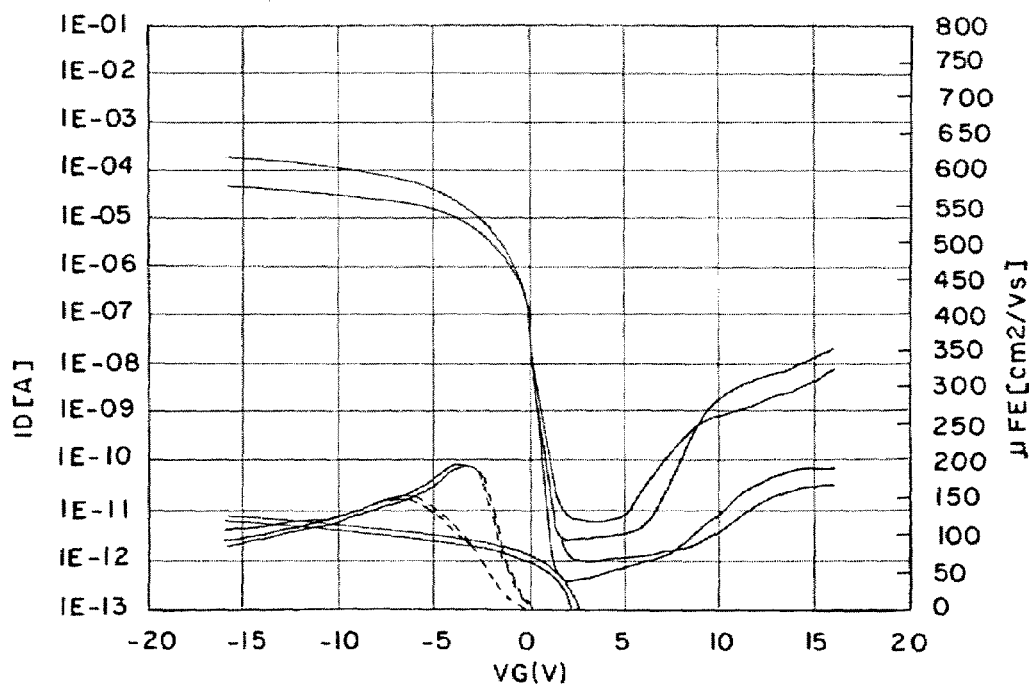
Figure 22A:
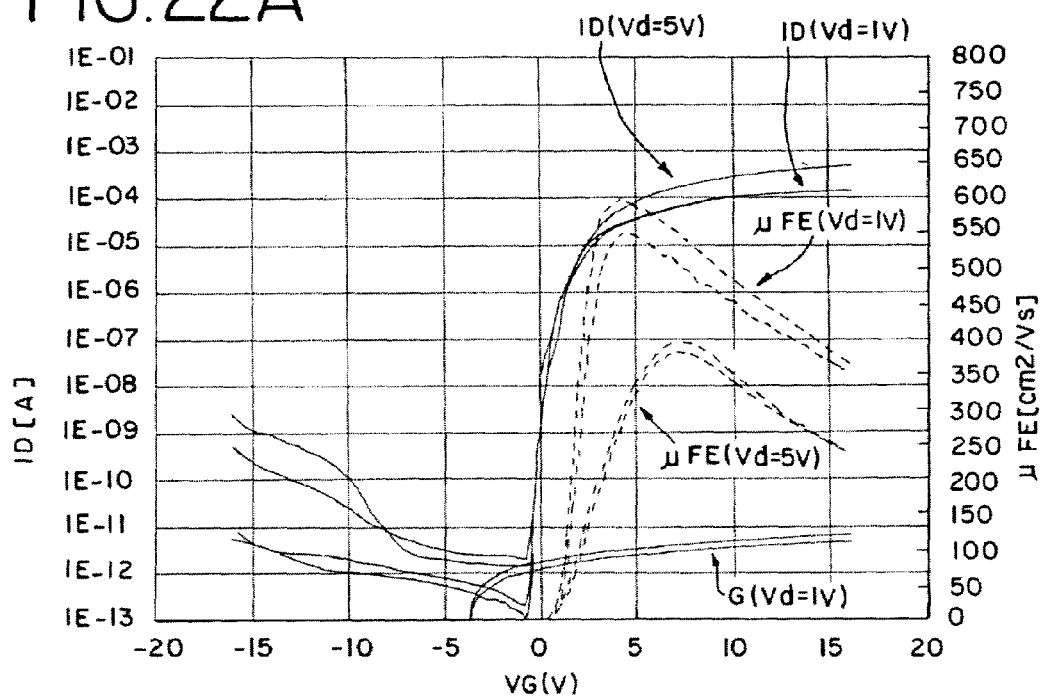
FIGS. 22A and 22B are graphical representations showing electrical properties of TFT formed by a method of fabricating a semiconductor device of the present invention.
Figure 22B:
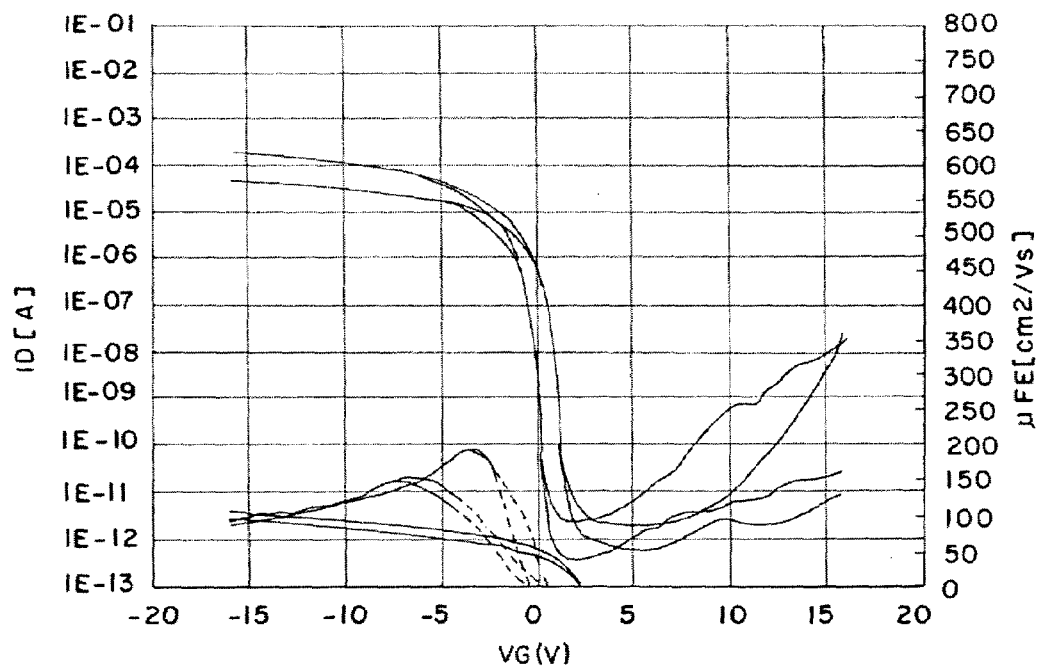

FIGS. 21A to 23B show electric characteristics of the TFT manufactured through these steps. FIGS. 21A and 21B show these electrical characteristics of a TFT manufactured by moving the substrate at the speed of 20 cm/s in the laser annealing step in FIG. 20C. FIG. 21A shows an electric characteristic of the n-channel type TFT 51. FIG. 21B shows an electric characteristic of the p-channel type TFT 52. FIGS. 22A and 22B show these electrical characteristics of a TFT manufactured by moving the substrate at the speed of 50 cm/s in the laser annealing step in FIG. 20C. FIG. 22A shows an electric characteristic of the n-channel type TFT 51. FIG. 22B shows an electric characteristic of the p-channel type TFT 52. The electric characteristics are measured in a range of gate voltage Vg=−16 to 16 V and in the range of drain voltage Vd=1 V and 5 V. In FIGS. 21A to 22B, the drain current (ID) and the gate current (IG) are indicated by solid lines. The mobility (μFE) is indicated by a dotted line.

Because large crystal grains are formed on the semiconductor film crystallized according to the present invention, the number of crystal grain boundaries containing the channel forming region can be reduced when a TFT is manufactured by using the semiconductor film. Furthermore, the formed crystal grains direct to the same direction. In addition, the small number of grain boundaries is laid in a direction crossing the relative scanning direction of laser light. Therefore, the number of times of crossing the crystal grain boundaries by carriers can be extremely reduced.

Accordingly, a TFT having the good electric characteristic can be obtained as shown in FIGS. 21A to 22B. Especially, the mobility is 510 cm$^2$/Vs in the n-channel type TFT and 200 cm$^2$/Vs in the p-channel type TFT in FIGS. 21A and 21B. The mobility is 595 cm$^2$/Vs in the n-channel type TFT and 199 cm$^2$/Vs in the p-channel type TFT in FIGS. 22A and 22B. When a semiconductor apparatus is manufactured by using this type of TFT, the operational characteristic and the reliability can be improved also.

Figure 23A:
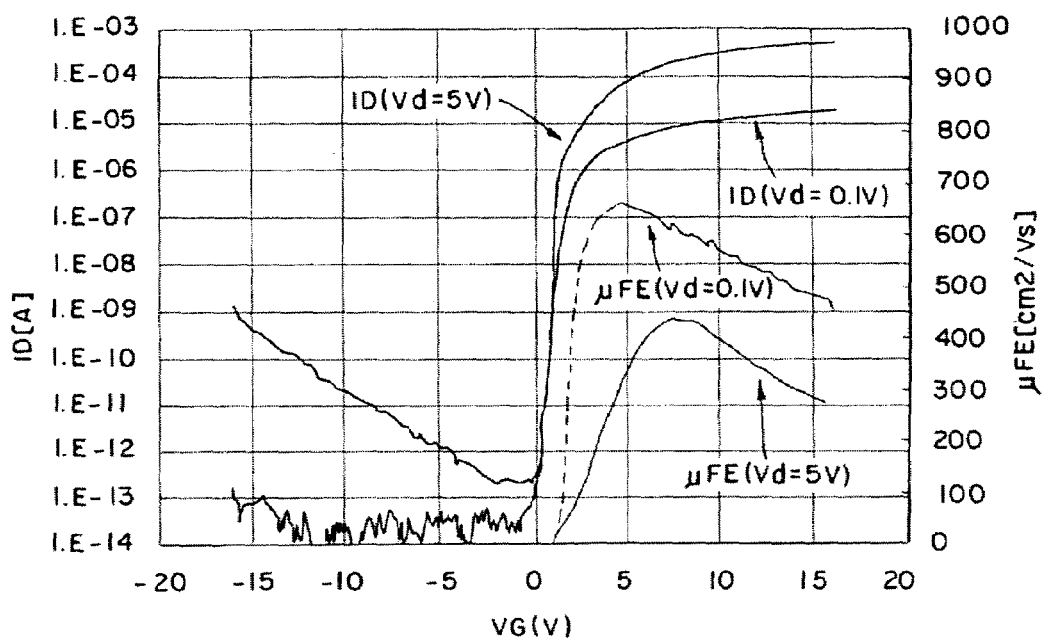
FIGS. 23A and 23B are graphical representations showing electrical properties of TFT formed by a method of fabricating a semiconductor device of the present invention.
Figure 23B:
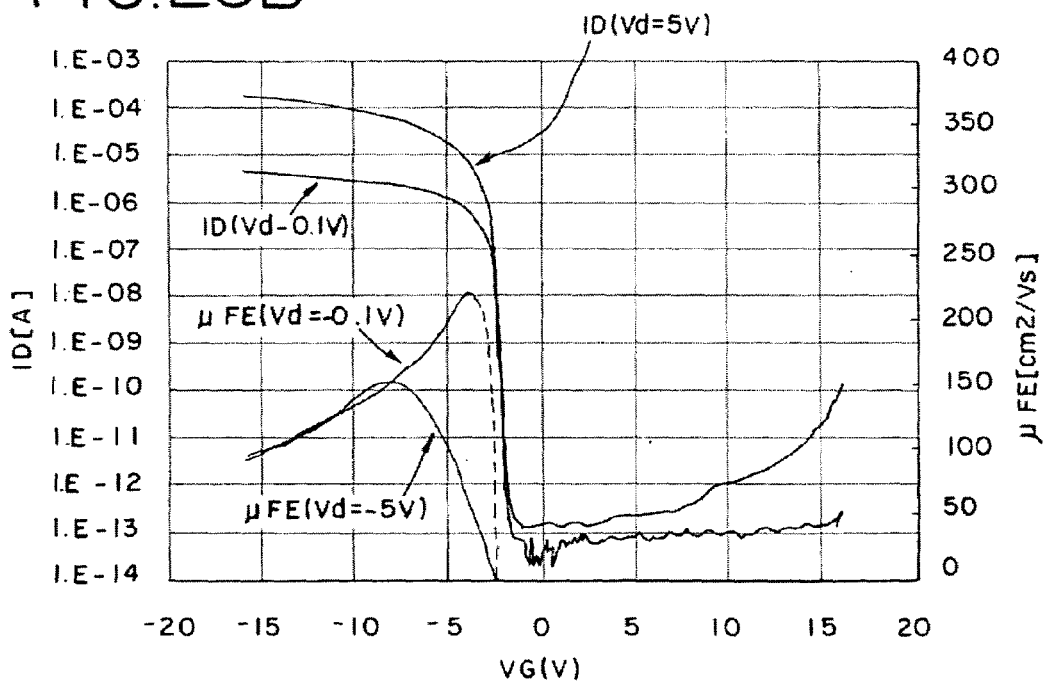

FIGS. 23A and 23B show these electrical characteristics of a TFT manufactured by moving the substrate at the speed of 50 cm/s in the laser annealing step in FIG. 20C. FIG. 23A shows an electric characteristic of the n-channel type TFT 51. FIG. 23B shows an electric characteristic of the p-channel type TFT 52.

The electric characteristics are measured in a range of gate voltage Vg=−16 to 16 V and in the range of drain voltage Vd=0.1 V and 5 V.

As shown in FIGS. 23A and 23B, a TFT having the good electric characteristic can be obtained. Especially, the mobility is 657 cm$^2$/Vs in the n-channel type TFT in FIG. 23A and 219 cm$^2$/Vs in the p-channel type TFT in FIG. 23B. When a semiconductor apparatus is manufactured by using this type of TFT, the operational characteristic and the reliability can be improved also.

The present example can be implemented by freely combining with Embodiments 1 to 6, and Examples 1 to 4.

Example 9

Figure 28:
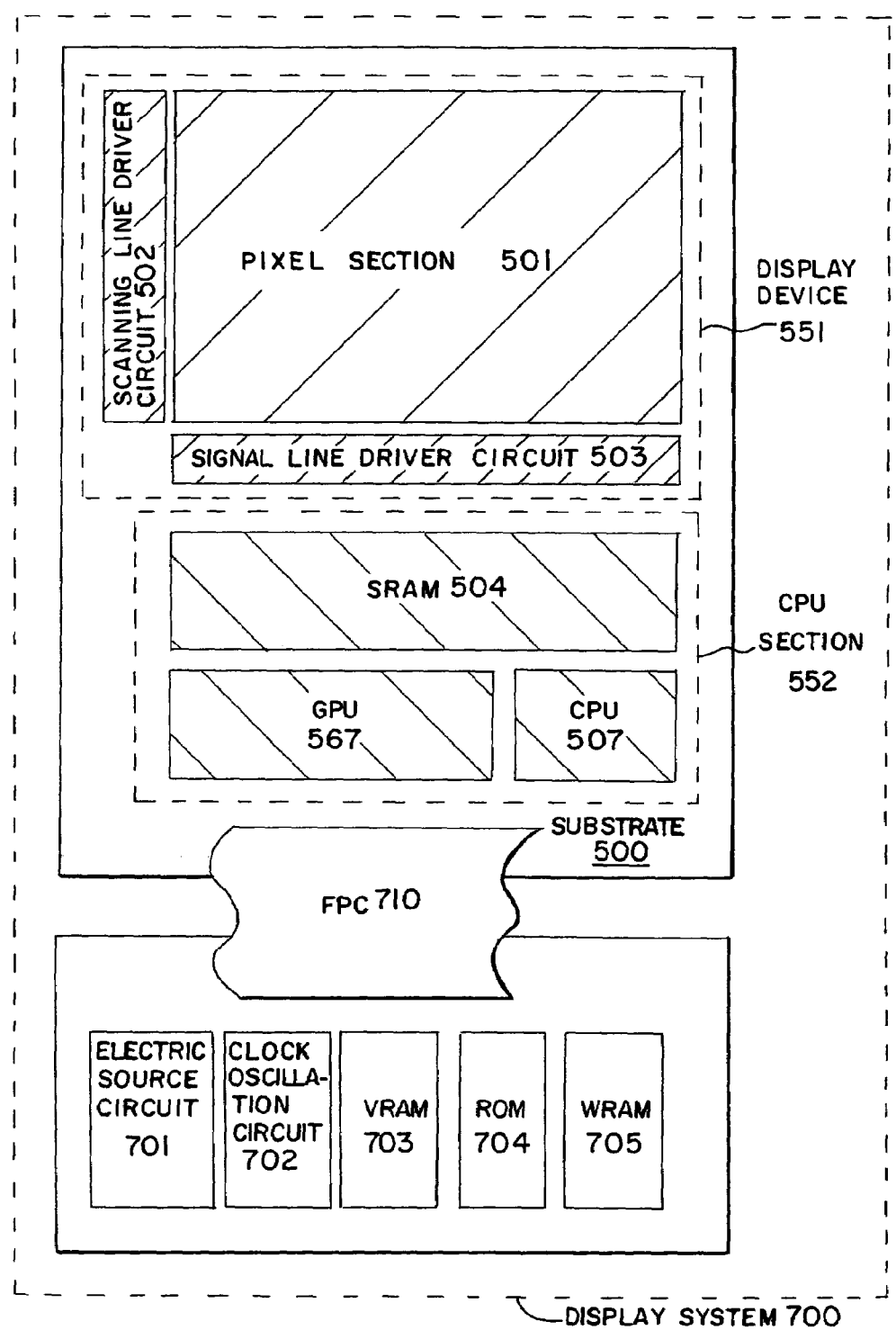
FIG. 28 is a diagram showing a display system using a semiconductor device of the present invention.

In the present Example, an example of a display system fabricated using the present invention will be described below with reference to FIG. 28.

Here, it is defined that a display system is referred to a system of a substrate on which a display device and a CPU section are formed, including a circuit externally added by FPC or the like. As a method of fabricating a display device and a CPU, those of Embodiment 1 through Embodiment 6, and Example 1 through Example 8 are used. The configuration example of a display system is shown in FIG. 28.

A circuit having a configuration as shown in FIG. 5 and FIG. 27 is formed on a substrate 500. Here, an example using a circuit having a configuration shown in FIG. 27 is shown. In a display system 700, the substrate 500 is electrically connected to an electric source circuit 701, a clock oscillation circuit 702, a VRAM 703, a ROM 704 and a WRAM 705 by the FPC 710. Here, the electric source circuit 701 is a circuit in which the electric source provided into the display system 700 is converted into an electric source for the circuit formed on the substrate 500. The clock oscillation circuit 702 is a circuit in which a control signal such as a clock signal or the like is inputted into a circuit formed on the substrate 500. The VRAM 703 is a circuit for memorizing a picture signal in a form of being inputted into a GPU 507. The ROM 704 is a circuit in which information for controlling the CPU 507 and picture signal inputted into the display system are memorized. The WRAM 705 is referred to a work region in which the CPU 507 performs a processing.

It should be noted that since both of the SRAM 504 provided on the substrate 500 and the WRAM 705 connected by the FPC 710 function as the work region of the CPU 507, either one of them is capable of being omitted. For example, in the case where accesses from the CPU 507 are many, but a relatively slight memory capacity may be available, it is preferable to use the SRAM 504, and in reverse, in the case where a large memory capacity is required but the accesses from the CPU 507 is relatively slight, it is preferable to use the WRAM 705.

Example 10

In this example, examples of the electric appliance manufactured by using the present invention will be described with reference to FIGS. 13A to 13G.

Examples of the electric appliance employing the present invention include a video camera, a digital camera, a goggle type display (head mounted display), a navigation system, an audio reproducing device (such as car audio system and audio component system), a notebook computer, a game machine, a portable information terminal (such as mobile computer, mobile telephone, portable game machine, and electronic book) and an image reproducing device provided with a recording medium (specifically, a device adapted to reproduce a recording medium such as a digital versatile disc (DVD) and provided with a display device capable of displaying an image thereof). FIGS. 13A to 13G show specific examples thereof.

Figure 13A:
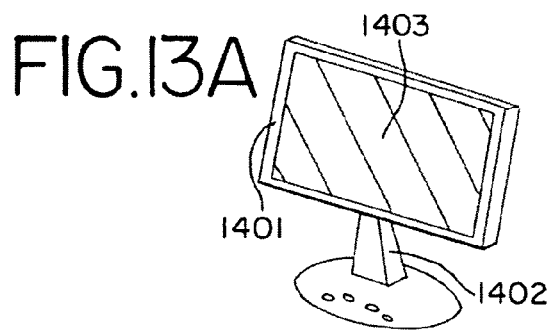
FIGS. 13A to 13G is a drawing showing electron devices of the present invention.

FIG. 13A show a display device including a casing 1401, a supporting base 1402, and a display portion 1403. The present invention can be applied to the display device, which constitutes the display portion 1403. A small and lightweight display device can be realized by utilizing the present invention.

Figure 13B:
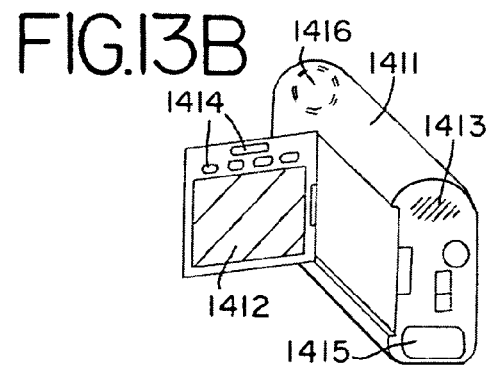

FIG. 13B show a video camera which is constituted by a main body 1411, a display portion 1412, an audio input portion 1413, an operation switch 1414, a battery 1415, a image receiving portion 1416 and the like. The present invention can be applied to the display device, which constitutes the display portion 1412. A small and lightweight video camera can be realized by utilizing the present invention.

Figure 13C:
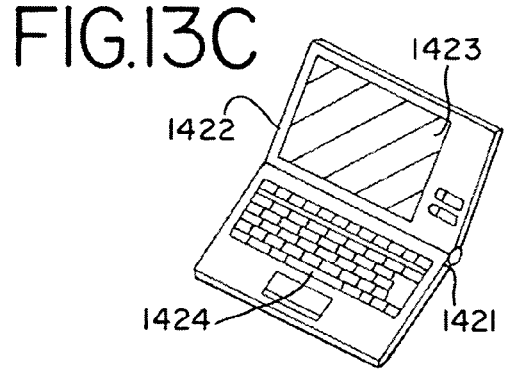

FIG. 13C shows a notebook personal computer which is constituted by a main body 1421, a casing 1422, a display portion 1423, a keyboard 1424 and the like. The present invention can be applied to the display device, which constitutes the display portion 1423. A small and lightweight personal computer can be realized by utilizing the present invention.

Figure 13D:
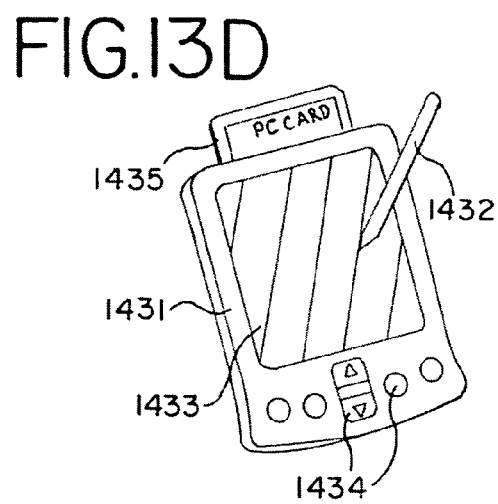

FIG. 13D shows a portable information terminal which is constituted by a main body 1431, a stylus 1432, a display portion 1433, operation buttons 1434, an external interface 1435 and the like. The present invention can be applied to the display device, which constitutes the display portion 1433. A small and lightweight portable information terminal can be realized by utilizing the present invention.

Figure 13E:
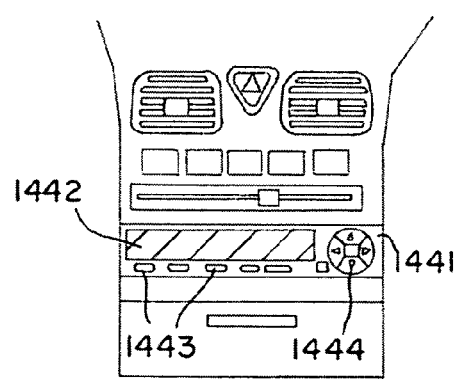

FIG. 13E shows an sound reproducing system, specifically an on-vehicle audio apparatus, which is constituted by a main body 1441, a display portion 1442, an operation switches 1443, 1444 and the like. The present invention can be applied to the display device, which constituted the display portion 1442. Further, although the on-vehicle car audio apparatus is illustrated in this example, the invention may also used for a potable or household audio apparatus. A small and lightweight sound reproducing system can be realized by utilizing the present invention.

Figure 13F:
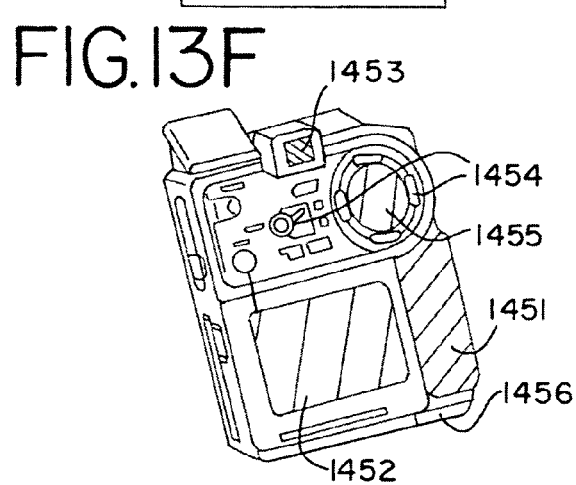

FIG. 13F shows a digital camera, which is constituted by a main body 1451, a display portion (A) 1452, an eyepiece portion 1453, an operation switch 1454, display portion (B)

1455, a battery 1456 and the like. The present invention can be applied to the display device, which constitutes the display portion (A) 1452 and the display portion (B) 1455. A small and lightweight digital camera can be realized by utilizing the present invention.

Figure 13G:
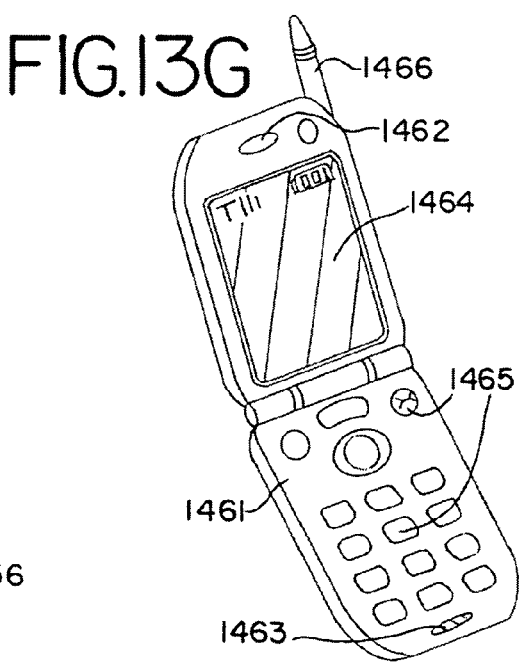

FIG. 13G shows a portable telephone, which constituted by a main body 1461, an audio output portion 1462, an audio input portion 1463, a display portion 1464, an operation switch 1465, an antenna 1466 and the like. The present invention can be applied to the display device, which constitutes the display portion 1464. A small and lightweight portable telephone can be realized by utilizing the present invention.

Not only a glass substrate but also a heat-resistance plastic substrate can be used for the display device used in each of the above electronic appliances. Thus, reduction in weight of the electronic appliance can be realized.

The present invention is not limited to the afore-mentioned electric appliances and the present invention can also includes various electronic appliances using the semiconductor device, which is manufactured by the manufacturing method described in Embodiments 1 to 6 and Examples 1 to 8.

A gate metal is partially etched per each TFT having a different property which is required, and a gate electrode is fabricated. Specifically, a resist mask is fabricated by exposing a resist per each TFT having a different property which is required, and the gate metal is etched. At this time, the steps of fabricating a gate electrode of each TFT is performed under the conditions optimized in conformity with the properties which are required. Thus, a method of fabricating a semiconductor device capable of differently making a plurality of TFTs having a different property, respectively, or being different in design rule on the same substrate can be provided.

Therefore, a circuit having a variety of functions is capable of being fabricated on the same substrate. Thus, a circuit which has been conventionally externally added by means of IC chip or the like is also fabricated on the same substrate, and the size of the device can be miniaturized and the weight of the device can be reduced. Moreover, since it is possible to differently make a plurality of TFTs having different properties using the fewer number of mask pieces, the increase of the steps in number and the cost can be suppressed in a lower level.

It will also be appreciated that, although a limited number embodiments of the invention have been described in detail for purposes of illustration, various modifications may be made without departing from the spirit and scope of the invention. Accordingly, the invention should not be limited except as by the appended claims.

What is claimed is:

1. A method for manufacturing a semiconductor device, comprising:
    forming a conductive film over a substrate;
    forming a first resist mask over the conductive film by a first aligner;
    forming a first wiring by etching the conductive film in a first region by using the first resist mask;
    forming a second resist mask over the conductive film by a second aligner after forming the first wiring;
    forming a second wiring by etching the conductive film in a second region by using the second resist mask;
    wherein a resolution of the first aligner is different from a resolution of the second aligner.

2. A method according to claim 1, wherein one of the first aligner and the second aligner is a reduction projection exposure system and the other of the first aligner and the second aligner is an equal magnification projection aligner.

3. A method according to claim 2, wherein the reduction projection exposure system is a stepper and the equal magnification projection aligner is an MPA.

4. A method according to claim 1, wherein a wavelength of a light used for forming the first resist mask is different from a wavelength of a light used for forming the second resist mask.

5. A method according to claim 1, wherein at least a part of the first wiring is a first gate electrode of a first transistor and at least a part of the second wiring is a second gate electrode of a second transistor.

6. A method for manufacturing a semiconductor device, comprising:
    forming a conductive film over a substrate;
    forming a first resist mask over the conductive film by a first aligner;
    forming a first wiring by etching the conductive film in a first region by using the first resist mask;
    forming a second resist mask over the conductive film by a second aligner after forming the first wiring;
    forming a second wiring by etching the conductive film in a second region by using the second resist mask;
    wherein an angle formed by a bottom face and a side face of the first wiring is different from an angle formed by a bottom face and a side face of the second wiring.

7. A method according to claim 6, wherein a resolution of the first aligner is different from a resolution of the second aligner.

8. A method according to claim 7, wherein one of the first aligner and the second aligner is a reduction projection exposure system and the other of the first aligner and the second aligner is an equal magnification projection aligner.

9. A method according to claim 8, wherein the reduction projection exposure system is a stepper and the equal magnification projection aligner is an MPA.

10. A method according to claim 6, wherein a wavelength of a light used for forming the first resist mask is different from a wavelength of a light used for forming the second resist mask.

11. A method according to claim 6, wherein at least apart of the first wiring is a first gate electrode of a first transistor and at least a part of the second wiring is a second gate electrode of a second transistor.

12. A method for manufacturing a semiconductor device, comprising:
    forming a conductive film over a substrate;
    forming a first resist mask over the conductive film by a first aligner;
    forming a first wiring by etching the conductive film in a first region by using the first resist mask;
    forming a second resist mask over the conductive film by a second aligner after forming the first wiring;
    forming a second wiring by etching the conductive film in a second region by using the second resist mask;
    wherein a shape of a cross-section of the first wiring is different from a shape of a cross-section of the second wiring.

13. A method according to claim 12, wherein a resolution of the first aligner is different from a resolution of the second aligner.

14. A method according to claim 13, wherein one of the first aligner and the second aligner is a reduction projection exposure system and the other of the first aligner and the second aligner is an equal magnification projection aligner.

15. A method according to claim 14, wherein the reduction projection exposure system is a stepper and the equal magnification projection aligner is an MPA.

16. A method according to claim 12, wherein a wavelength of a light used for forming the first resist mask is different from a wavelength of a light used for forming the second resist mask.

17. A method according to claim 12, wherein at least apart of the first wiring is a first gate electrode of a first transistor and at least a part of the second wiring is a second gate electrode of a second transistor.

* * * * *